(12) United States Patent
Harari et al.

(10) Patent No.: US 10,608,011 B2
(45) Date of Patent: Mar. 31, 2020

(54) 3-DIMENSIONAL NOR MEMORY ARRAY ARCHITECTURE AND METHODS FOR FABRICATION THEREOF

(71) Applicant: Sunrise Memory Corporation, Los Gatos, CA (US)

(72) Inventors: Eli Harari, Saratoga, CA (US); Scott Brad Herner, Lafayette, CO (US); Wu-Yi Chien, San Jose, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 10 days.

(21) Appl. No.: 16/012,731

(22) Filed: Jun. 19, 2018

(65) Prior Publication Data
US 2018/0366489 A1 Dec. 20, 2018

Related U.S. Application Data

(60) Provisional application No. 62/522,666, filed on Jun. 20, 2017, provisional application No. 62/522,661, (Continued)

(51) Int. Cl.
*H01L 21/00* (2006.01)
*H01L 27/11582* (2017.01)
(Continued)

(52) U.S. Cl.
CPC .... *H01L 27/11582* (2013.01); *H01L 21/7682* (2013.01); *H01L 21/76802* (2013.01); *H01L 23/562* (2013.01); *H01L 27/11578* (2013.01); *G11C 16/0466* (2013.01); *H01L 21/31111* (2013.01)

(58) Field of Classification Search
CPC ......... H01L 27/11582; H01L 27/11578; H01L 23/562
See application file for complete search history.

(56) References Cited

U.S. PATENT DOCUMENTS 6,946,703 B2    9/2005  Ryu et al.
7,005,350 B2 *  2/2006  Walker .................. H01L 27/115
                                                    257/344
(Continued)

FOREIGN PATENT DOCUMENTS

WO    WO-2018236937 A1 * 12/2018  ....... H01L 21/76802

OTHER PUBLICATIONS

International Search Report and Written Opinion, PCT/US2018/038373, dated Sep. 11, 2018.

*Primary Examiner* — Laura M Menz
(74) *Attorney, Agent, or Firm* — Edward C. Kwok; VLP Law Group, LLP

(57) ABSTRACT

A method addresses low cost, low resistance metal interconnects and mechanical stability in a high aspect ratio structure. According to the various implementations disclosed herein, a replacement metal process, which defers the need for a metal etching step in the fabrication process until after all patterned photoresist is no longer present. Under this process, the conductive sublayers may be both thick and numerous. The present invention also provides for a strut structure which facilitates etching steps on high aspect ratio structures, which enhances mechanical stability in a high aspect ratio memory stack.

21 Claims, 60 Drawing Sheets

Related U.S. Application Data filed on Jun. 20, 2017, provisional application No. 62/522,665, filed on Jun. 20, 2017, provisional application No. 62/550,553, filed on Aug. 25, 2017.

(51) Int. Cl.

| | | |
|---|---|---|
| *H01L 21/768* | (2006.01) | |
| *H01L 23/00* | (2006.01) | |
| *H01L 27/11578* | (2017.01) | |
| *H01L 21/311* | (2006.01) | |
| *G11C 16/04* | (2006.01) | |

(56) References Cited

U.S. PATENT DOCUMENTS

| | | | | |
|---|---|---|---|---|
| 8,630,114 B2* | 1/2014 | Lue | ................... | G11C 11/4097 |
| | | | | 257/324 |
| 8,878,278 B2* | 11/2014 | Alsmeier | ............... | G11C 16/04 |
| | | | | 257/314 |
| 9,842,651 B2* | 12/2017 | Harari | ............... | H01L 27/11565 |
| 9,911,497 B1* | 3/2018 | Harari | ............... | H01L 27/11565 |
| 10,096,364 B2* | 10/2018 | Harari | ................. | G11C 16/0466 |
| 10,249,370 B2* | 4/2019 | Harari | ................. | H01L 29/6675 |
| 10,381,378 B1* | 8/2019 | Harari | ................. | H01L 29/1037 |
| 10,395,737 B2* | 8/2019 | Harari | ..................... | H01L 29/16 |
| 10,431,596 B2* | 10/2019 | Herner | ................ | H01L 29/0847 |
| 10,475,812 B2* | 11/2019 | Harari | ............... | H01L 29/78642 |
| 2002/0193484 A1* | 12/2002 | Albee | .................... | A01N 25/10 |
| | | | | 524/354 |
| 2009/0279360 A1* | 11/2009 | Lee | ..................... | G11C 11/5628 |
| | | | | 365/185.17 |
| 2010/0124116 A1* | 5/2010 | Maeda | ..................... | G11C 5/02 |
| | | | | 365/185.11 |
| 2011/0298013 A1* | 12/2011 | Hwang | ............. | H01L 27/11551 |
| | | | | 257/208 |
| 2012/0243314 A1* | 9/2012 | Maeda | ............... | H01L 27/11565 |
| | | | | 365/185.05 |
| 2016/0086970 A1* | 3/2016 | Peng | ................. | H01L 27/11565 |
| | | | | 257/324 |
| 2017/0092370 A1 | 3/2017 | Harari | | |
| 2018/0108416 A1* | 4/2018 | Harari | ............... | H01L 21/32133 |
| 2018/0366489 A1* | 12/2018 | Harari | ............... | H01L 27/11582 |
| 2019/0006009 A1* | 1/2019 | Harari | ............... | G11C 11/5635 |
| 2019/0180821 A1* | 6/2019 | Harari | ............... | H01L 21/02595 |
| 2019/0244971 A1* | 8/2019 | Harari | ................ | G11C 16/0483 |
| 2019/0319044 A1* | 10/2019 | Harari | ............... | H01L 27/1157 |
| 2019/0325964 A1* | 10/2019 | Harari | ............... | G11C 16/0491 |

* cited by examiner

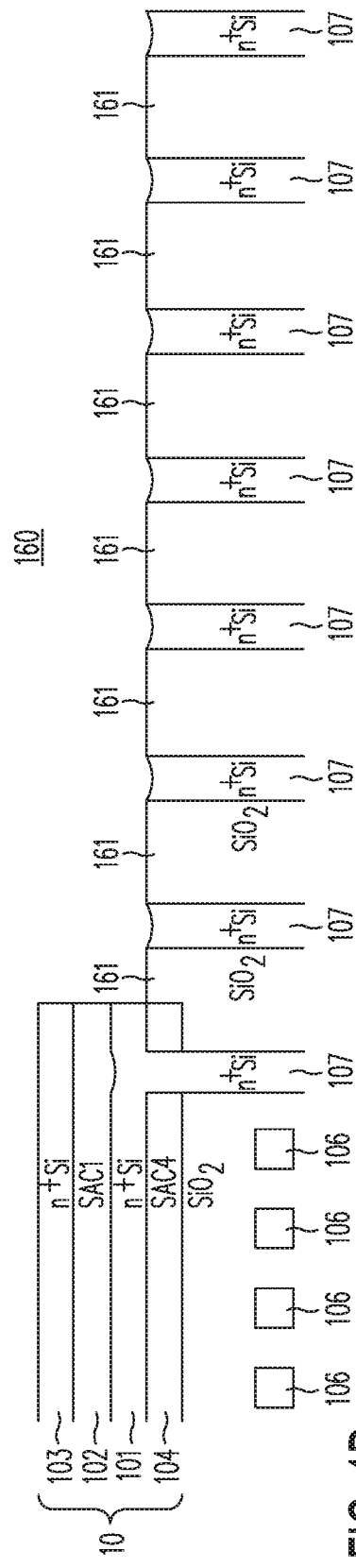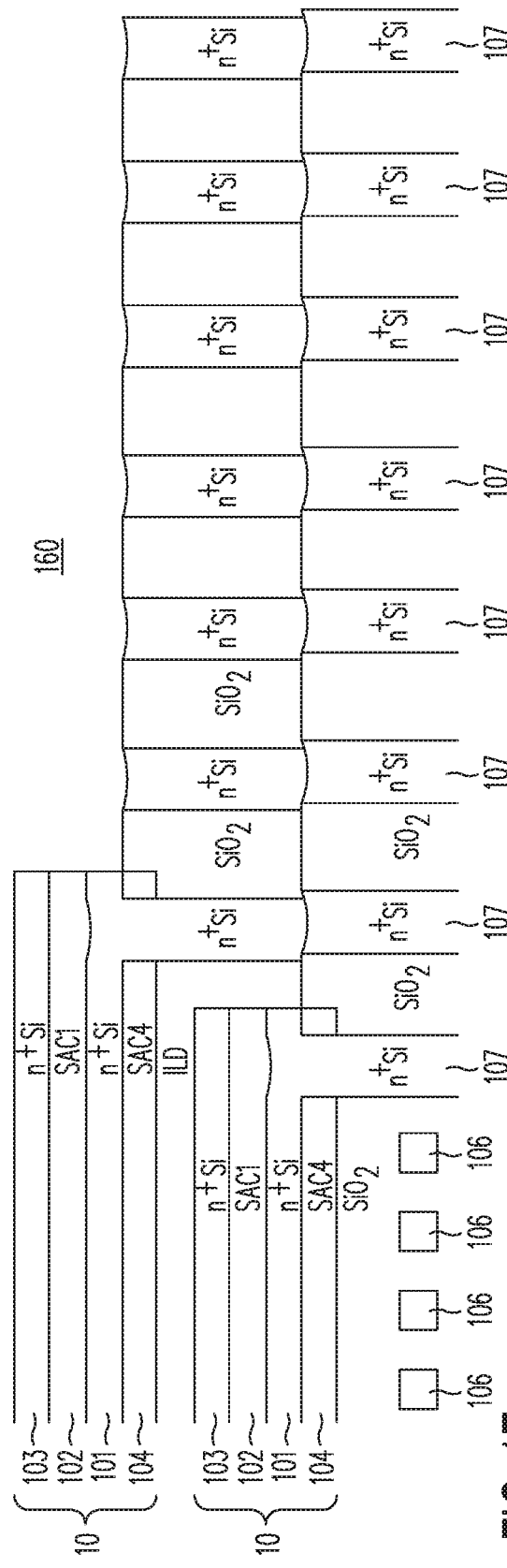

500

502-7 { N+ —521-7
SAC 1 (522)
N+ —523-7
SAC 4 (524-7)

ISL (503-7)

502-6 { N+ —521-6
SAC 1 (522)
N+ —523-6
SAC 4 (524-6)

●
●
●

502-1 { N+ —521-1
SAC 1 (522)
N+ —523-1

ISL (503-1)

502-0 { N+ —521-0
SAC 1 (522)
N+ —523-0
SAC 4 (524-0)

ISL (503-0)

201

Embodiment 1 Figures

Embodiment 1 Figures

Embodiment 1 Figures

Embodiment 1 Figures

Embodiment 2 Figures

Embodiment 2 Figures

Embodiment 4 Figures

Embodiment 5 Figures

Embodiment 5 Figures

Embodiment 6 Figures

Embodiment 7 Figures

Embodiment 7 Figures

3-DIMENSIONAL NOR MEMORY ARRAY ARCHITECTURE AND METHODS FOR FABRICATION THEREOF

CROSS REFERENCES TO RELATED APPLICATIONS

This application is related to copending U.S. patent application ("Copending Application"), Ser. No. 15/248,420, entitled "Capacitive-Coupled Non-Volatile Thin-film Transistor Strings in Three-Dimensional Arrays," filed Aug. 26, 2016. The Copending Application is hereby incorporated by reference in its entirety. The Copending Application has been published as U.S. 2017/0092371. References to the Copending Application herein are made by paragraph numbers of the publication. The present application is also related to and claims priority of: (i) U.S. provisional application ("Provisional Application I"), Ser. No. 62/522,666, entitled "Replacement Metal and Strut for 3D memory Array," filed on Jun. 20, 2017: U.S. provisional application ("Provisional Application II"), Ser. No. 62/522,661, entitled "3-Dimensional NOR String Arrays in Segmented Stacks," filed on Jun. 20, 2017; (iii) U.S. provisional application ("Provisional Application III"), Ser. No. 62/522,665, entitled "3-Dimensional NOR String Arrays in Segmented Shared Store Regions," filed on Jun. 20, 2017; and (iv) U.S. provisional patent application ("Provisional Application IV"), Ser. No. 62/550,553 entitled "3-Dimensional NOR Memory Array Architecture and Methods for Fabrication Thereof," filed on Aug. 25, 2017. The disclosures of the Provisional Applications I-IV are hereby incorporated by reference in their entireties.

BACKGROUND OF THE INVENTION

1. Field of the Invention

The present invention relates to non-volatile NOR-type memory strings. In particular, the present invention relates manufacturing processes for the 3-dimensional structure of such a non-volatile NOR-type memory string.

2. Discussion of the Related Art

In high density 3-dimensional memory structures, such as those disclosed in the Copending Application, it is desirable to include a metal sublayer shunt which is electrically connected to either a source sublayer or a drain sublayer. Both sources and drains may be contacted by a conductive sublayer shunt (i.e., as separate conductive sublayers). For example, in the process illustrated in FIG. 5a of the Copending Application, conductive sublayers may be deposited in addition to source sublayer 521, drain sublayer 523, sacrificial sublayer 522 (which would subsequently be replaced by a channel sublayer). These sublayers are deposited one sublayer at a time and then patterned using photoresist and etched. In this detailed description, the drain, source and channel or sacrificial sublayers, including any associated conductive sublayers, are collectively referred to as the "active layer" and a number of active layers provided one on top of another, separated from one another by a dielectric layer, are referred to as a "NIN stack."

The metal sublayers are provided to achieve significantly reduced resistance in each of the source and drain sublayers. A lower resistance corresponds to a lower resistance-capacitance (RC) time constant, which results in a higher speed device. For this purpose, it is desirable to achieve low resistance using thick metal-comprising conductive sublayers.

Conductive sublayers having a metal (e.g., tungsten) that can withstand the subsequent elevated temperature processing (>500° C.) are difficult to etch in 3-D memory structures because of etch selectivity. That is, the etch rate of the conductive layer may not be significantly greater than the etch rate of the photoresist and/or hard mask that are used to protect other features that are not to be etched. (In general, to protect the material not intended to be etched, the target material should etch at a significantly faster rate than the masking layer or layers. It would be undesirable that the masking layer or layers are completely removed before etching of the target material is complete.) Etch selectivity becomes an even greater problem as each metal sublayer becomes thicker, as a greater number of metal sublayers are present in the stack (e.g. metal shunt sublayers are provided in both source and drain sublayers), and as more memory layers (e.g., 8 or 16 layers of active strips) are provided. However, to achieve higher density at lower cost, it is desirable to provide 8 or more memory layers.

Another problem encountered in fabrication of these memory structures is their mechanical stability, due to their high aspect ratios. (In this regard, the aspect ratio is the ratio between the structure's height to its width). It has been shown that a semiconductor structure with a high aspect ratio can be mechanically unstable, so that the structure leand or even topples completely during the fabrication process.

SUMMARY

The present invention addresses obtaining low cost, low resistance metal interconnects and mechanical stability in a high aspect ratio structure. According to the various embodiments disclosed herein, the present invention provides a replacement metal process, which defers the need for a metal etching step in the fabrication process until after all patterned photoresist is no longer present. Under this process, the conductive sublayers may be both thick and numerous. The present invention also provides for a strut structure which facilitates etching steps on high aspect ratio structures, which enhances mechanical stability in a high aspect ratio memory stack.

The present invention is better understood upon consideration of the detailed description below, in conjunction with the accompanying drawings.

BRIEF DESCRIPTION OF THE DRAWINGS

in FIG. 1A, active layer 110 in memory structure 100, includes first semiconductor layer 101 and second semiconductor layer 103, first sacrificial layer 102 and second sacrificial layer 104, is fabricated above layer 106 of conductors ("global word lines") and separated by one or more dielectric layers from semiconductor substrate 108, wherein devices to be formed in active layer 110 may connect to circuitry in semiconductor substrate 108 through vias 107 formed in the dielectric layers.

FIG. 1D shows a cross section illustrating the fabrication of the first active layer in memory structure 160, together with its via connections between $N^+$-doped semiconductor sublayer 101 and semiconductor substrate 108 and parts of the via connections for the active layers to be formed.

FIG. 1E shows memory structure 160 of FIG. 1D, after the second active layer is formed in like manner as the first active layer.

as shown in FIG. 21, excess conductive material from the deposition on the sidewalls of the trenches and the tops of the NIN stacks have been removed.

FIG. 23 further shows global word lines 106a formed above the NIN stacks to connect to local word lines formed out of word line layer 336 to address selected memory cells in memory structure 500.

In this detailed description, like elements in the figures are provided like reference numerals to facilitate reference to features in the figures.

DETAILED DESCRIPTION OF THE PREFERRED EMBODIMENTS

Figure 1A:
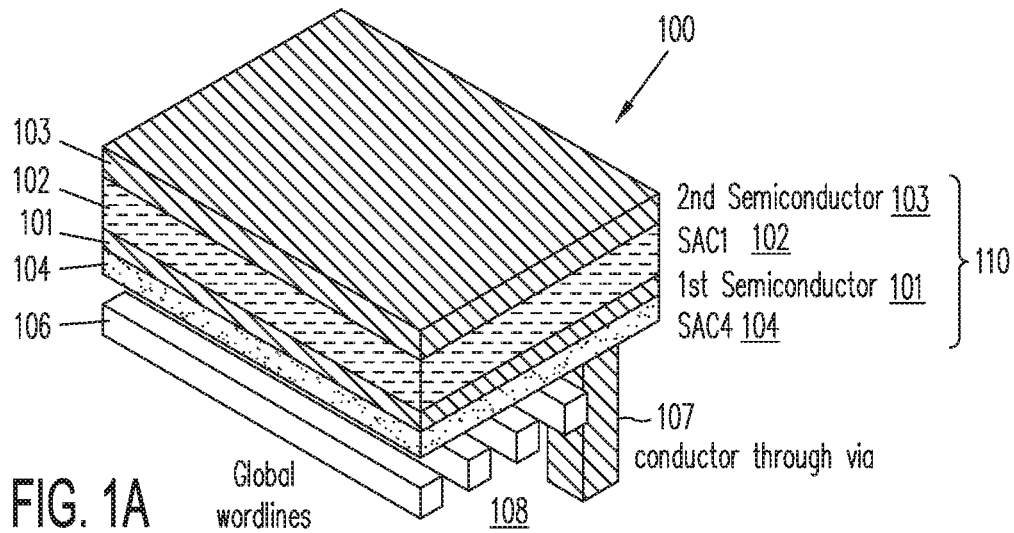
FIG. 1A illustrates memory structure 100 with active layer 110 to be formed that is provided with means to connect a semiconductor device to be formed in active layer 110 to devices formed in semiconductor substrate 108.

Various embodiments of the present invention are described generally herein. After the various embodiments are described, some specific examples of materials and fabrication steps are described that can be applied to forming the various embodiments.

In this detailed description, the term "patterning" (as applied to a target layer) refers to (i) providing a masking layer (e.g., photoresist layer or hard mask layer) over the target layer, (ii) creating a pattern in the masking layer using suitable photolithography techniques and (iii) transferring the pattern in the masking layer to the target layer using an etching step.

In one example, the masking layer is a "hard mask" layer that is known to those of ordinary skill in the art. To create a masking layer out of a hard mask material, the hard mask material is first provided (e.g., by deposition) on a target layer, over which is then provided a photoresist material. The photoresist pattern is then patterned. The pattern in the photoresist selectively exposes a portion of the hard mask material to an etching agent and protects the remainder of the hard mask material from the etching agent. The pattern of the photoresist is then transferred to the hard mask material by the etching agent, which removes the exposed portion of the hard mask material, so that the protected portion of the hard mask material remains. The hard mask material may then be fixed (e.g., by baking) to become the masking layer for patterning the target layer. After the target layer is patterned, typically by another etching step, the masking layer may be removed in a subsequently step. In examples where a hard mask is not required, the pattern in the photoresist layer may be directly transferred to the target layer. In this detailed description, unless otherwise expressly stated herein, masking materials are removed in due course after completion of the etching step or steps of the target layer.

In this detailed description, methods of fabricating a memory structure over a semiconductor substrate are described. Prior to forming the memory structure, various devices and circuitry are formed on or in the semiconductor substrate using conventional techniques. Examples of methods for connecting bit lines to devices or circuitry on or in the semiconductor substrate are first generally described. Such methods are usually carried out before formation of the memory structures.

Following the description of bit line connections, various embodiments of the present invention relating to the memory structure are described. These embodiments generally relate to various aspects of fabricating a memory structure to form an array of individual memory cells. In these embodiments, the memory structures incorporate the bit lines that have been formed and are connected to the devices and circuitry already formed on or in the semiconductor substrate.

Formation of Connections Between Bit Lines to be Formed in the Memory Structure and Devices in the Semiconductor Substrate—Example 1

FIG. 1A illustrates a memory structure 100 with active layer 110 to be formed that is provided with means to connect a semiconductor device to be formed in active layer 110 to devices formed in semiconductor substrate 108. To form memory structure 100 of FIG. 1A, a layer 106 of conductors ("global word lines") is first fabricated above semiconductor substrate 108 over a first dielectric layer. Thereafter, a second dielectric layer is deposited over and around global word lines 106. The second dielectric layer is then planarized using a chemical mechanical polishing (CMP) process. A sacrificial material SAC4 is then provided as sacrificial layer 104 over the second dielectric layer. Sacrificial layer 104 is then patterned and one or more etching steps etch through sacrificial layer 104 (i.e., material SAC4), the second dielectric layer and the first and second dielectric layers to form vias 107 that reach from the top surface of sacrificial layer 104 to circuitry in semiconductor substrate 108. Vias 107 may then be filled with a conductor material in a subsequent step.

Alternatively, vias 107 may be etched in the first and second dielectric layers before deposition of sacrificial material SAC 4. In that alternative approach, the SAC4 material also fills vias 107 formed by etching through the first and second dielectric layers.

As mentioned below, sacrificial material SAC4 in sacrificial layer 104 and vias 107 are later replaced simultaneously by a low-resistivity conductor material, such as a metal. Allowing SAC4-filled vias 107 to be later replaced with a low-resistivity metal provides the advantage of significant reduction the resistance in the vertical connectors. Filling vias with $N^+$ doped poly may add resistance to the common drain or bit line, especially for tall NIN stacks. Thus, for tall NIN stacks, filling vias 107 with the SAC4 material for later metal replacement is preferred.

Referring back to FIG. 1A, over sacrificial layer 104 is deposited conductive semiconductor layer 101 (e.g., $n^+$-doped silicon), which is designated to eventually provide a drain or bit line for a memory cell to be formed out of active layer 110. The conductive semiconductor material of semiconductor layer 101 may also fill vias 107. Second sacrificial layer 102 (provided by sacrificial material "SAC1") and second conductive semiconductor layer 103 (e.g., also $n^+$-doped silicon) are then deposited over first semiconductor layer 101. At a later step, second sacrificial layer 102 may be replaced, in whole or in part, by a material suitable to provide a channel region of a thin-film storage transistor. Memory structure 100 may be patterned and etched to become a block of suitable size to form a memory array. Sacrificial layer 106 (i.e., sacrificial material SAC4), first and second semiconductor layers 101 and 103, respectively, and second sacrificial layer 102 (together with channel region material to be provided) are referred in this detailed description as an "active layer". Each of the component layer of active layer 110 is sometimes referred to in this detailed description as a "sublayer." Sacrificial layers 102 and 104 (i.e., the SAC1 and SAC4 material layers) are each subsequently processed to be replaced, in whole or in part, by a semiconductor material and a conductive material, respectively. An interlayer dielectric (ILD) layer is then deposited on top of the patterned active layer and planarized by CMP. The process is then repeated, as needed, to provide as many active layers as desired. For example, FIG. 1B illustrate providing two additional active layers to memory structure 100 of FIG. 1A.

Figure 1B:
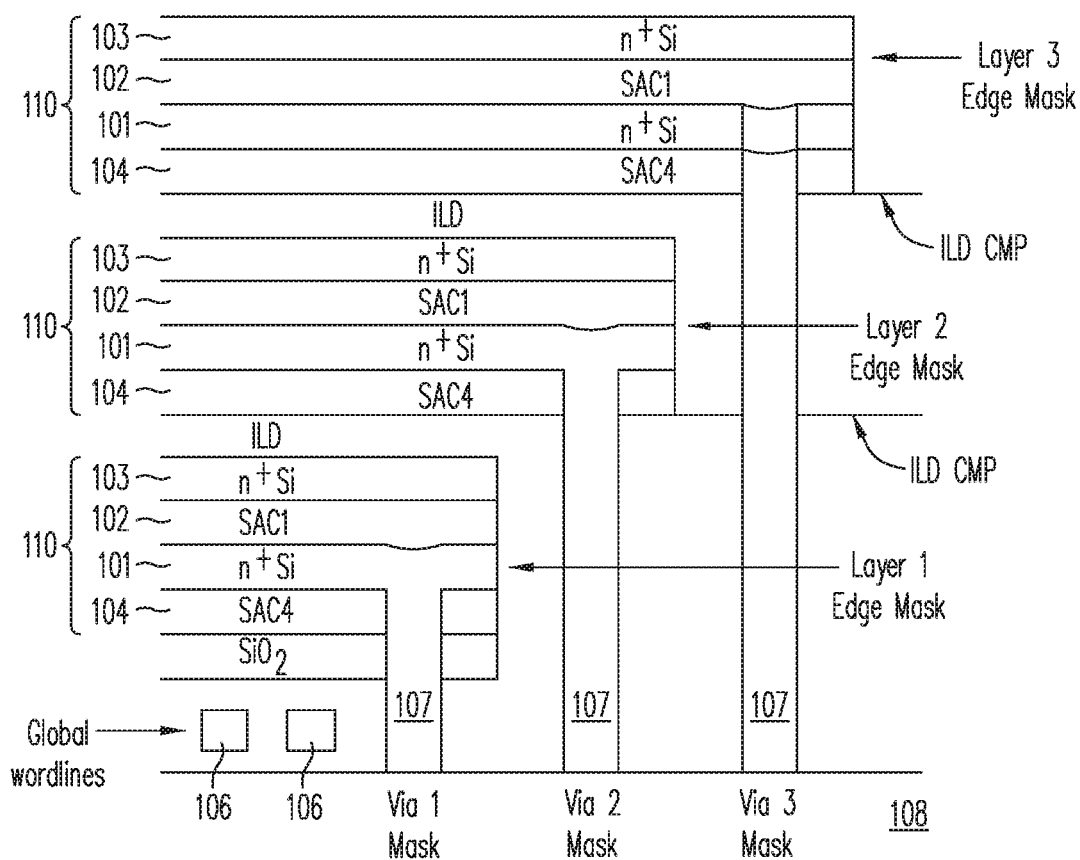
FIG. 1B shows three active layers of a memory structure that is built up from memory structure 100 of FIG. 1A and connections through vias 107 between $n^+$-doped semiconductor layer 101 and semiconductor substrate 108.
Figure 1C:
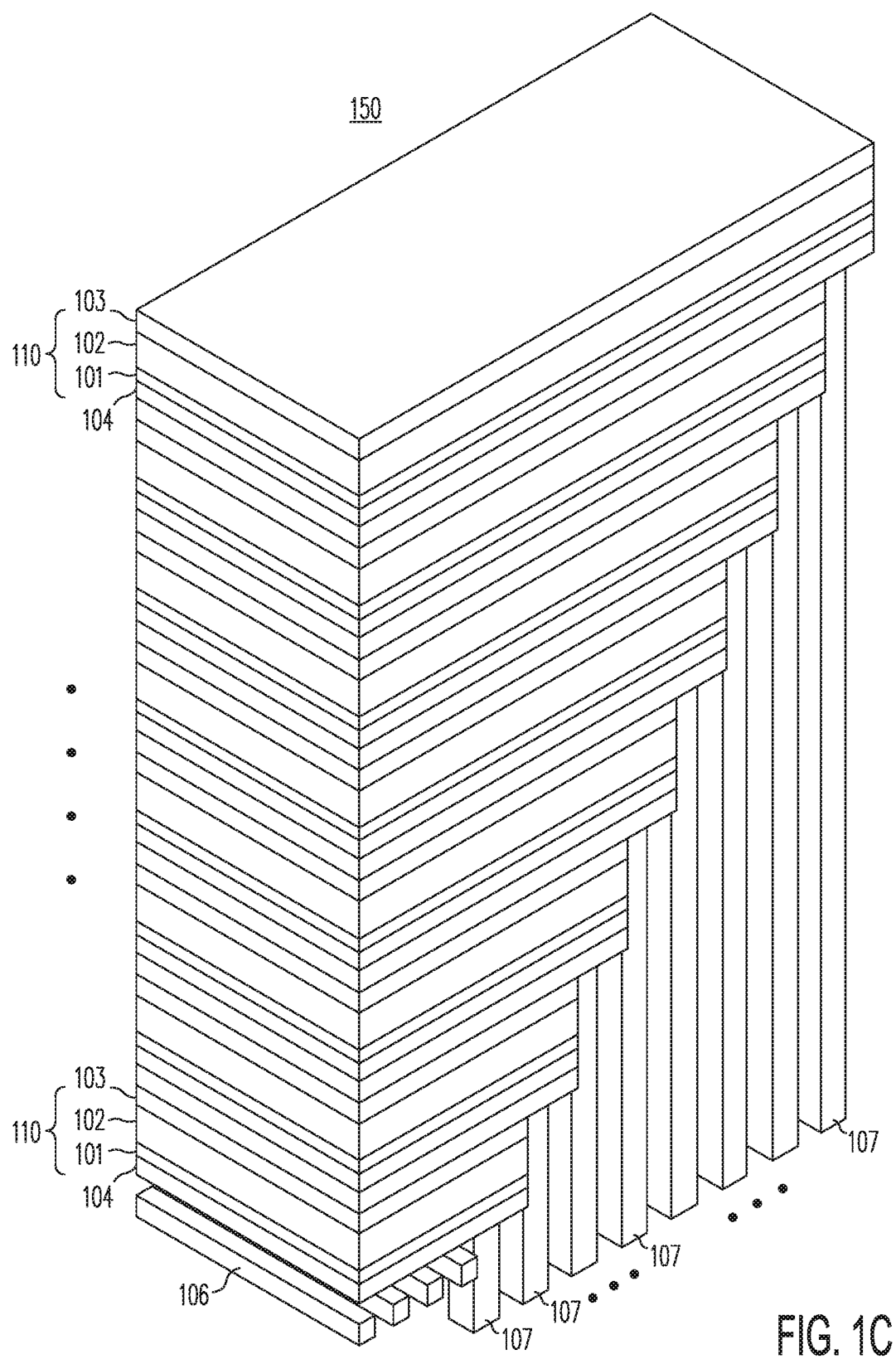
FIG. 1C shows memory structure 150 with eight active layers, each active layer including a bit line to be formed being connected to the semiconductor substrate by a via filled with a doped silicon.

As shown in FIG. 1B, three active layers of a memory structure are provided according to the process described above in conjunction with FIG. 1A, with connections through vias 107 between n$^+$-doped semiconductor layer 101 and semiconductor substrate 108. Continuing on adding additional active layers, FIG. 1C shows memory structure 150 with eight active layers, with each active layer including a bit line to be formed, which would be connected to semiconductor substrate 108 by one of vias 107 filled with a conductor material (e.g., doped silicon of bit line 101). (Of course, if the alternative approach of providing SAC4-filled vias is used, the eventual bit line would be connected to semiconductor substrate 108 via a low-resistivity metal.)

Formation of Connections Between Bit Lines to be Formed in the Memory Structure and Devices in the Semiconductor Substrate—Example 2

In this example, the connections through vias 107 to the 2$^{nd}$ and higher active layers of the memory structure are partially fabricated for each of such active layers during the fabrication of each preceding active layer. Under this scheme, each via is constructed in one or more parts, with each part having a relatively low aspect ratio (relative to the completed via), making fabricating such a via a less challenging effort relative the process described above in conjunction with FIGS. 1A-1C. FIG. 1D shows a cross section illustrating the fabrication of the first active layer in the memory structure 160, together with its via connection (107) to semiconductor substrate 108 and parts of the via connections for the active layers to be formed. As shown in FIG. 1D, the parts of the via connections for the active layers to be formed are already filled with a conductive material (e.g., doped silicon), which is deposited and patterned to form first semiconductor layer 101 in the first active layer. (As mentioned above, an alternative approach fills the vias with SAC4 material that is to be subsequently replaced by a low-resistivity metal, which may be more advantageous in high density applications). In memory structure 160, doped silicon layer 101 is etched away to expose dielectric layer 161 in which the parts of vias 107 for the other active layers are formed. FIG. 1E shows memory structure 160 of FIG. 1D, after the second active layer is formed in like manner as the first active layer. In FIG. 1E, first semiconductor layer 101 of the second active layer is connected by a completed 2-part via to semiconductor substrate 108.

Memory Cell Fabrication

Embodiment 1

In this embodiment, tall memory structures with large aspect ratios are achieved using reinforcing struts. The high aspect ratio structures are created after the precursor structures are stabilized by a system of strut structures, and one or more sacrificial layers ("SAC4 sublayers") are removed by one or more etching steps into the exposed sidewalls of trenches through the NIN stack.

Figure 2A:
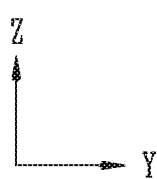
FIG. 2A shows a cross-sectional schematic of memory structure 500 including various material layers in a NIN stack, according to one embodiment of the present invention.
Figure 2B:
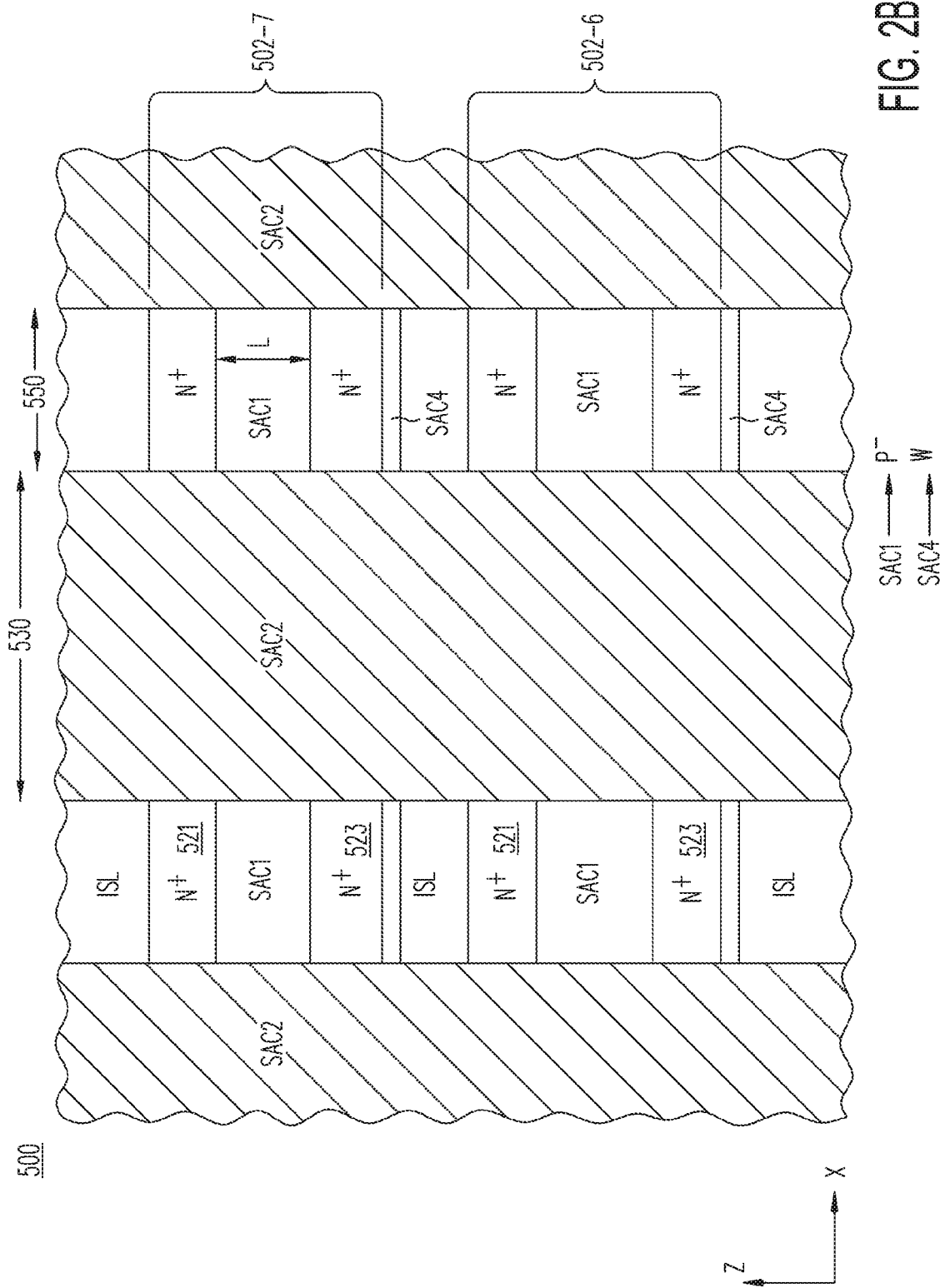
FIG. 2B shows a cross-section of the memory structure of FIG. 2A from a different view that is substantially 90 degrees from the cross section of FIG. 2A; the cross section of FIG. 2A, for example, may be a cross section through a vertical plane transverse to the region indicated by reference numeral 550 in FIG. 2B.

FIG. 2A shows a cross-sectional schematic of various material layers in memory structure 500, according to one embodiment of the present invention. In FIG. 2A, active layers 502-0 to 502-7 each include drain sublayer 523, source sublayer 521 and sacrificial material 1 ("SAC1") sublayer 522 (to be subsequently wholly or partially replaced by a channel material sublayer). In addition, sacrificial material 4 (SAC4) sublayer 524 is provided, to be subsequently replaced by a conductive sublayer which electrically contacts drain sublayer 523 substantially throughout its entire length. FIG. 2B shows a cross-section of memory structure 500 of FIG. 2A from a view that is achieved by rotating substantially 90 degrees about the vertical axis ("Z") from the cross section of FIG. 2A. The cross section of FIG. 2A, for example, may be a cross section through a vertical plane transverse to the region indicated by reference numeral 550 in FIG. 2B.

Figure 3:
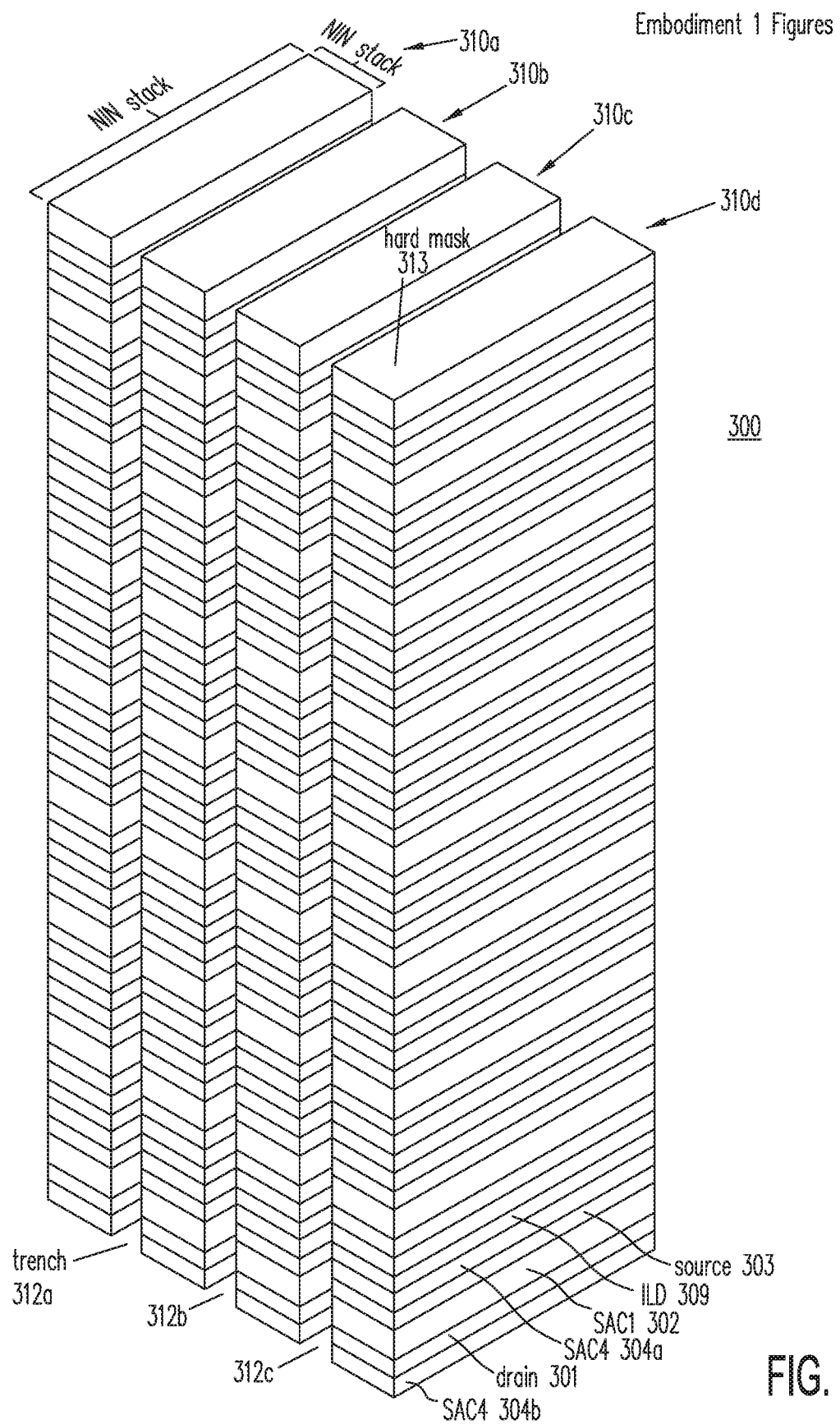
FIG. 3 shows, in three dimensions, four NIN stacks 310a, 310b, 310c and 310d each including 8 active layers, in which each active layer includes source sublayer 303, drain sublayer 301, interlayer dielectric (ILD) layer 309, SAC1 material-containing sublayer 302, SAC4 material-containing second sacrificial sublayer 304a contacting source sublayer 303 and SAC4 material-containing second sacrificial sublayer 304b contacting to drain sublayer 301.

FIG. 3 shows, in three dimensions, four NIN stacks 310a, 310b, 310c and 310d each including 8 active layers, in which each active layer includes source sublayer 303, drain sublayer 301, interlayer dielectric (ILD) layer 309, first sacrificial sublayer 302 ("SAC1" material), second sacrificial sublayer 304a ("SAC4 material") contacting the source sublayer 303 and another second sacrificial sublayer 304b (also containing "SAC4 material") contacting to drain sublayer 301. In this detailed description, each memory structure shown in each of the various figures (e.g., memory structure 300 of FIG. 3) represents only a portion of a memory array. For example, the 8 active layers in the memory structure of FIG. 3 is merely illustrative and exemplary. 2, 4, 16, 32, 64, 128, or even greater number of active layers may be used. As shown in FIG. 3, at the top of each NIN stack is hard mask layer 313. Hard mask layer 313 may represent one or more layers each formed using one or more materials. Hard mask layer 313 provides protection the layers underneath it from anisotropic etching, as well as providing electrical insulation. Hard mask layer 313 may be formed out of any suitable material (e.g., silicon oxide, silicon nitride, carbon, or any combination of these or other materials).

In FIG. 3, two SAC4-containing second sacrificial layers 304a and 304b are provided with each active layer, i.e., drain sublayer 301 and source sublayer 303 are in contact with second sacrificial sublayers 304b and 304a, respectively. In another embodiment, one may provide only one SAC4 layer in each active layer, contacting either source sublayer 303 or drain sublayer 303, as in the case of the memory structure in FIGS. 2A and 2B. In some embodiments it is preferable to have the SAC4-containing second sacrificial sublayer of one active layer face the SAC4 sublayer of an adjacent active layer, repeating that pattern for every two active layers in the NIN stack.

Figure 4:
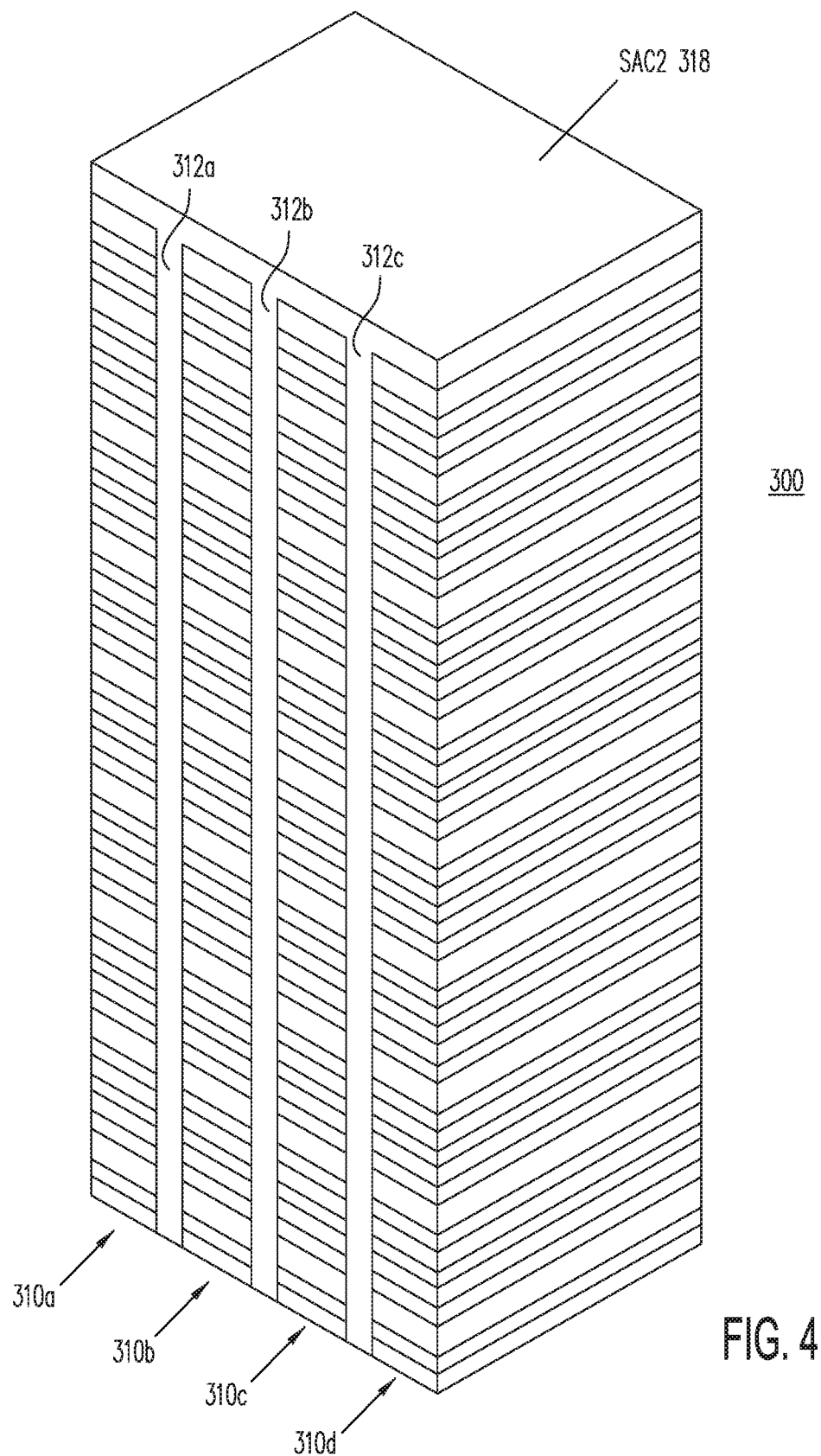
FIG. 4 shows third sacrificial material layer 318 ("SAC2 material") being deposited to fill trenches 310a, 310b and 310c of FIG. 3 and to cover the top of the NIN stacks.

FIG. 3 shows four 8-layer NIN stacks 310a, 310b, 310c and 310d, with three trenches 312a, 312b and 312c in-between, at an intermediate step in fabricating a memory array. A subsequent etch, illustrated in FIGS. 4-6, may be performed to create a set of 8 NIN stacks 310a-1, 310a-2, 310b-1, 310b-2, 310c-1, 310c-2, 310d-1 and 310d-2 with seven trenches in between. In this manner, three of the eventual seven trenches are etched in an initial step, while the remainder (i.e., four) of the trenches are etched at a subsequent step. Such 2-step etching is merely exemplary. Any suitable fraction of the trenches may be etched in an initial step, e.g., one quarter, one third, or any suitable fraction. Note that there are provided no metal layer yet in the NIN stacks up to the subsequent trench etch step, so that any problem related to metal etching is so far avoided. As each NIN stack in FIG. 3 is at least twice as wide as an eventual NIN stack (see, FIG. 6), the NIN stacks of FIG. 3 are more mechanically stable than narrower NIN stacks of FIG. 6. After the initial etching step that creates the four NIN stacks 310a, 310b, 310c and 310d, third sacrificial layer 318 (containing "SAC2 material") is deposited over the NIN stacks, filling the exposed trenches 312a, 312b, and 312d. FIG. 4 shows memory structure 300 of FIG. 3, after deposition of the SAC2 material of third sacrificial layer 318 in trenches 312a, 312b and 312c.

Figure 5:
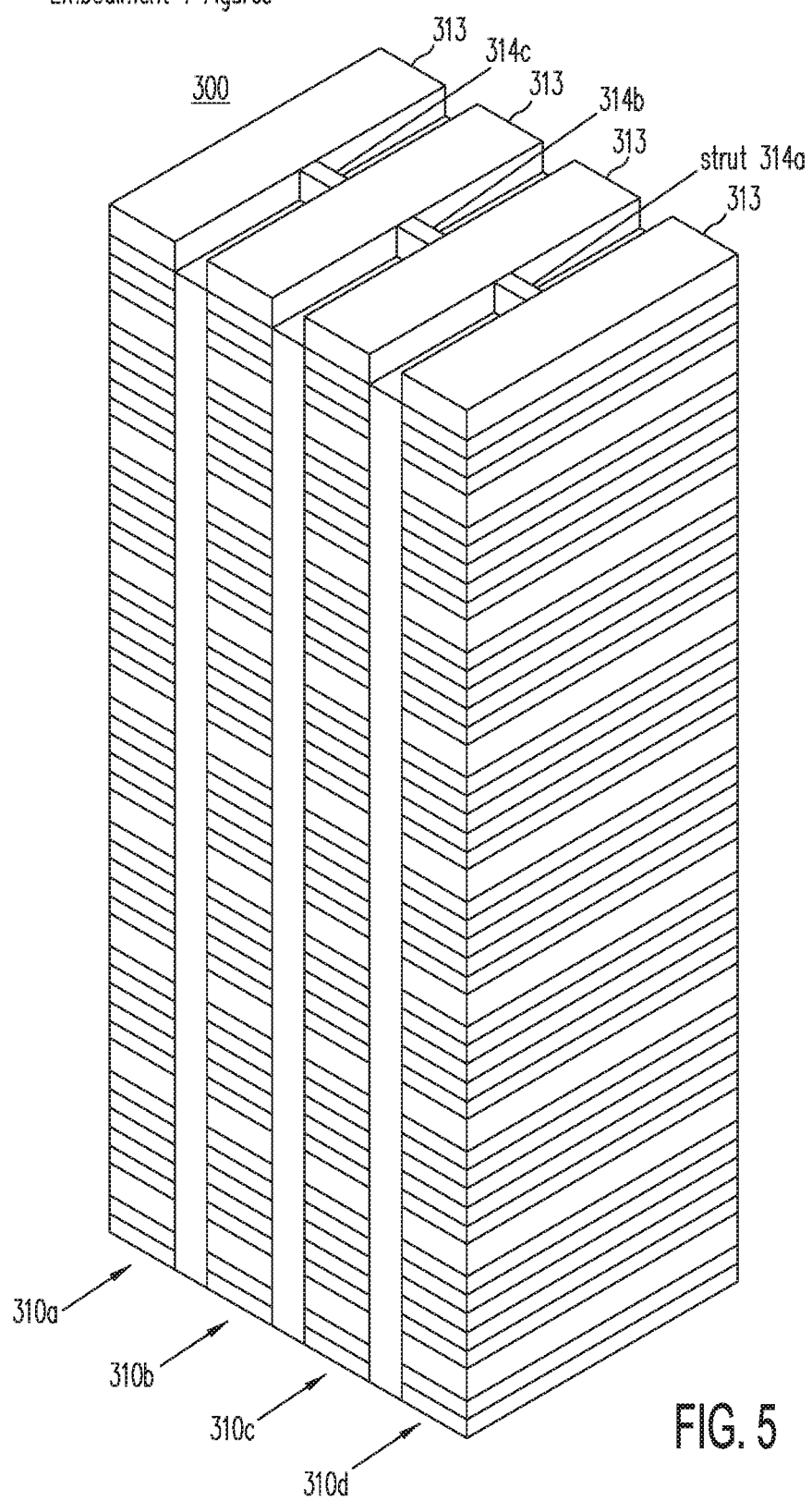
FIG. 5 shows resulting memory structure 300 after patterning struct layer 314 deposited on memory structure 300 of FIG. 4.

After deposition of the SAC2 material, the SAC2 material of third sacrificial layer 318 may be removed from the top of each NIN stack, exposing hard mask layer 313. Some SAC2 material may also be removed from the top of the filled trenches, so that the SAC2 material recesses below hard mask layer 313. This partial removal of the SAC2 material may be accomplished using any suitable technique, such as wet or dry etching, CMP, or a combination of such techniques. Strut layer 314 is then deposited. Strut layer 314 may be any suitable material, such as silicon nitride. In some embodiments, strut layer 314 may be provided by the same material or materials as hard mask layer 313. Strut layer 314 is then patterned form struts 314a, 314b and 314c connected the hard mask structures over the NIN stacks. FIG. 5 shows the resulting memory structure 300 after patterning struct layer 314 deposited on memory structure 300 of FIG. 4. Strut structures 314a, 314b and 314c physically immobilize and reinforce adjacent NIN stacks.

As shown in FIG. 5, strut structures 314a, 314b and 314c cover a smaller area relative to the area covered by hard mask layer 313 on each NIN stack. Preferably, the areas covered by strut structures 314a. 314b and 314c are made small, so that, without compromising mechanical stability, free access to the trenches in subsequent fabrication steps is still possible. Although only one strut structure is shown provided in memory structure 300 of FIG. 5 between each pair of adjacent NIN stacks, any number of struts may be provided between adjacent NIN stacks, as needed, to provide the desired mechanical stability. Also, each strut structure may be provided in any beneficial size or shape.

Figure 6:
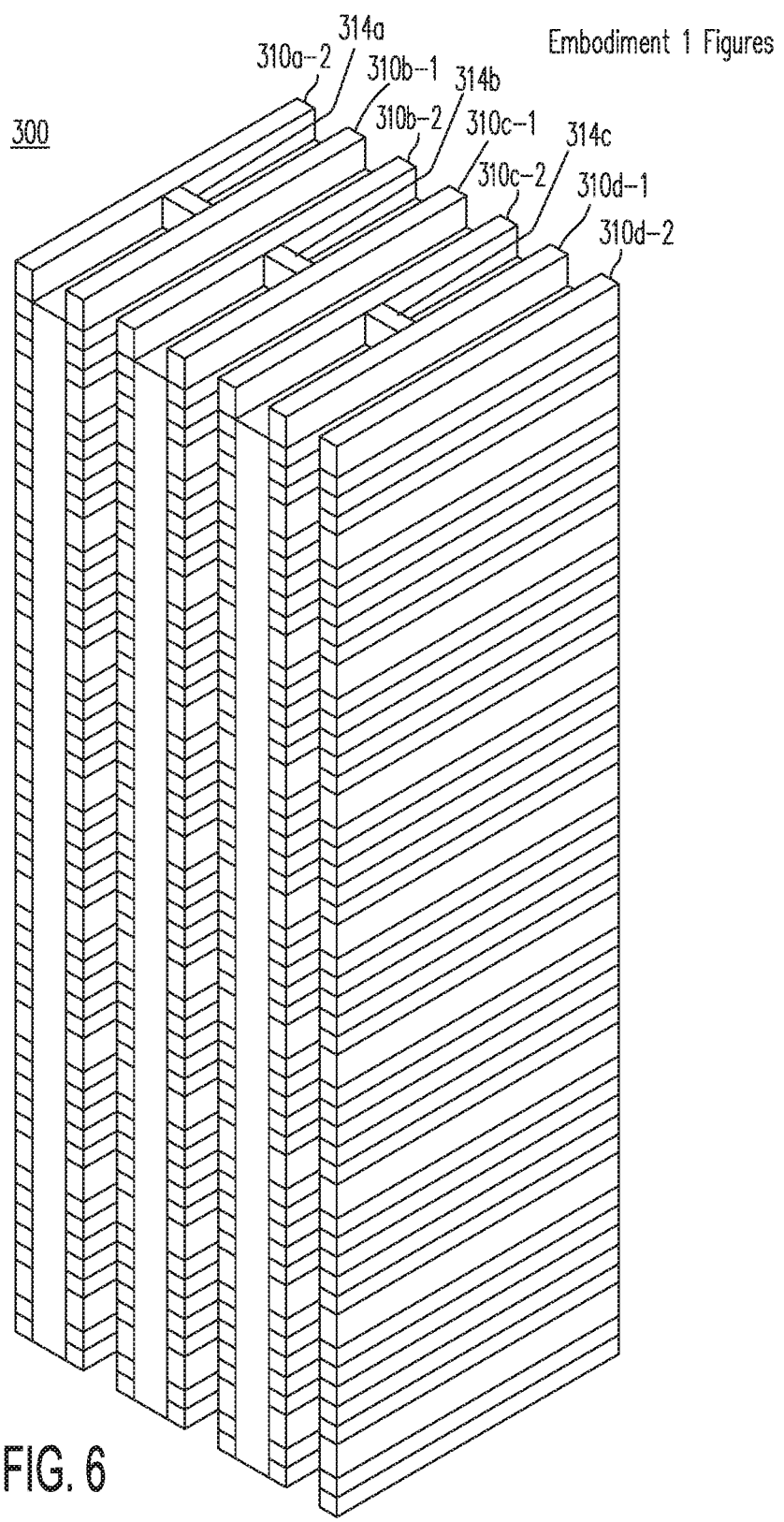
FIG. 6 shows resulting memory structure 300 after further patterning the NIN stacks of FIG. 5 to provide the remaining trenches.

Thereafter, memory structure 300 of FIG. 5 is further patterned to provide the remainder four trenches that cut through and divide NIN stacks 310a, 310b, 310c and 310d each into two NIN stacks (labeled respectively 310a-1, 310a-2, 310b-1, 310b-2, 310c-1, 310c-2, 310d-1 and 310d-2). FIG. 6 shows memory structure 300 resulting from etching the remainder trenches (NIN stack 310a-1 not shown). In some embodiments, the photoresist layers used to provide the pattern for the final trenches may be left on the NIN stacks to protect the SAC2 materials in trenches 312a, 312b and 312c during the next fabrication steps. At this point, as shown in FIG. 6, each NIN stack is exposed in a newly cut trench along its length, with the opposite side sealed by the SAC2 material of the first set of trenches 312a, 312b and 312c.

Figure 7:
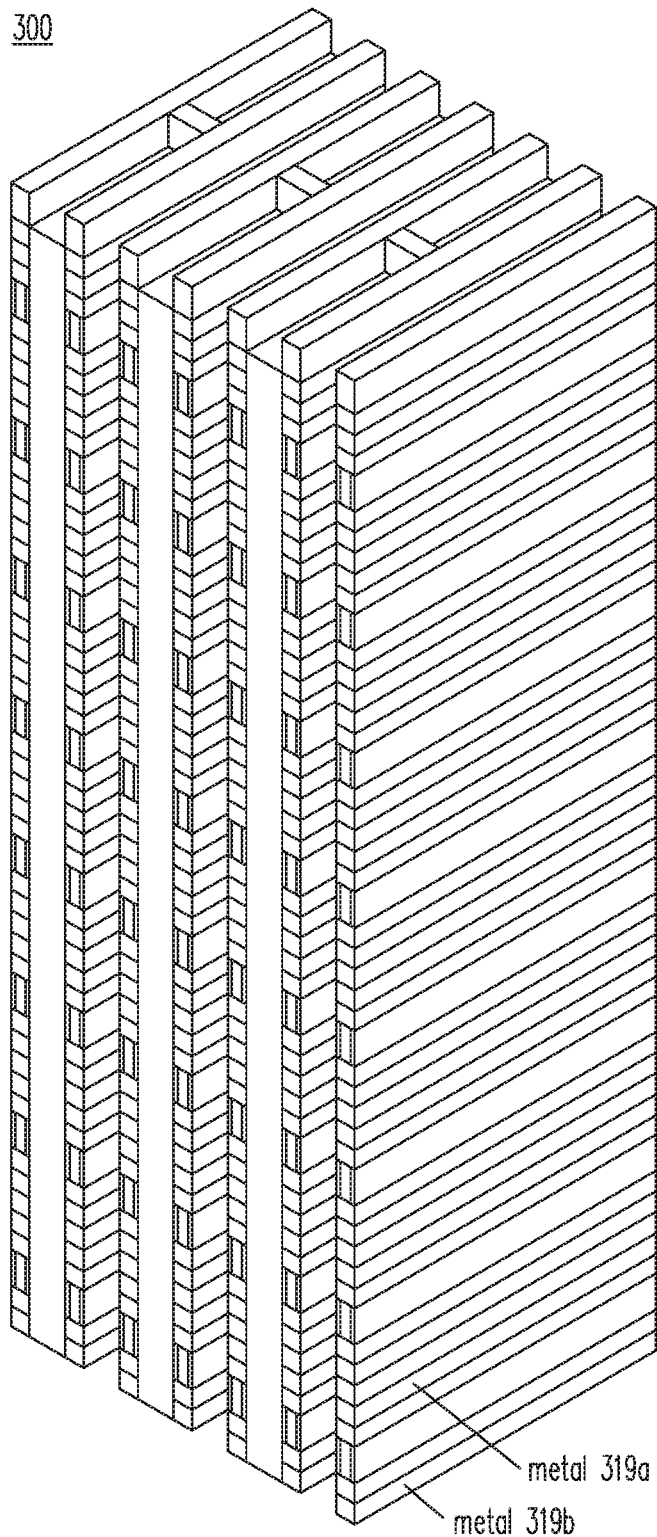
FIG. 7 shows the result of removing SAC4-containing second sacrificial sublayers 304a and 304b from each NIN stack of FIG. 6, followed by depositing a conductive material in the resulting cavities, forming conductive sublayers 319a and 319b, and removing the conductive sublayer from the sidewalls of the trenches and from the exposed areas on top of the NIN stacks.

SAC4-containing second sacrificial sublayers 304a and 304b in each active layer of each NIN stack are then removed in whole or in part by etching. This etching may be achieved using a selective chemical etching which does not etch, or etches very little, of the other sublayers in the active layers. After the SAC4 material in second sacrificial sublayers 304a and 304b of each active layer is removed, a conductive material is then deposited to fill in the voids left open by removal of the SAC4 material, thus forming conductive sublayers 319a and 319b. The conductive material also coats the sidewalls of the second set of trenches and the top of the NIN stacks, both of which are then removed by an isotropic or anisotropic etching. Resulting memory structure 300 is shown in FIG. 7. Preferably, any photoresist layers remaining are removed prior to depositing the conductive material. The conductive material may form a metal film that includes several sublayers, one of which may have a relatively high resistivity and a good adhesion to dielectric films (e.g., ILD layer 309), while another of which may have a lower resistivity and a good adhesion to other metal films and not dielectric films. Another sublayer of that metal film may act as diffusion barrier that reduces or prevents an undesirable chemical reaction between two other sublayers of the metal film. Furthermore, in some embodiments, only a single elemental metal film is provided, without a liner or barrier sublayer. Other examples of material suitable for providing the conductive sublayer are discussed below.

Figure 8:
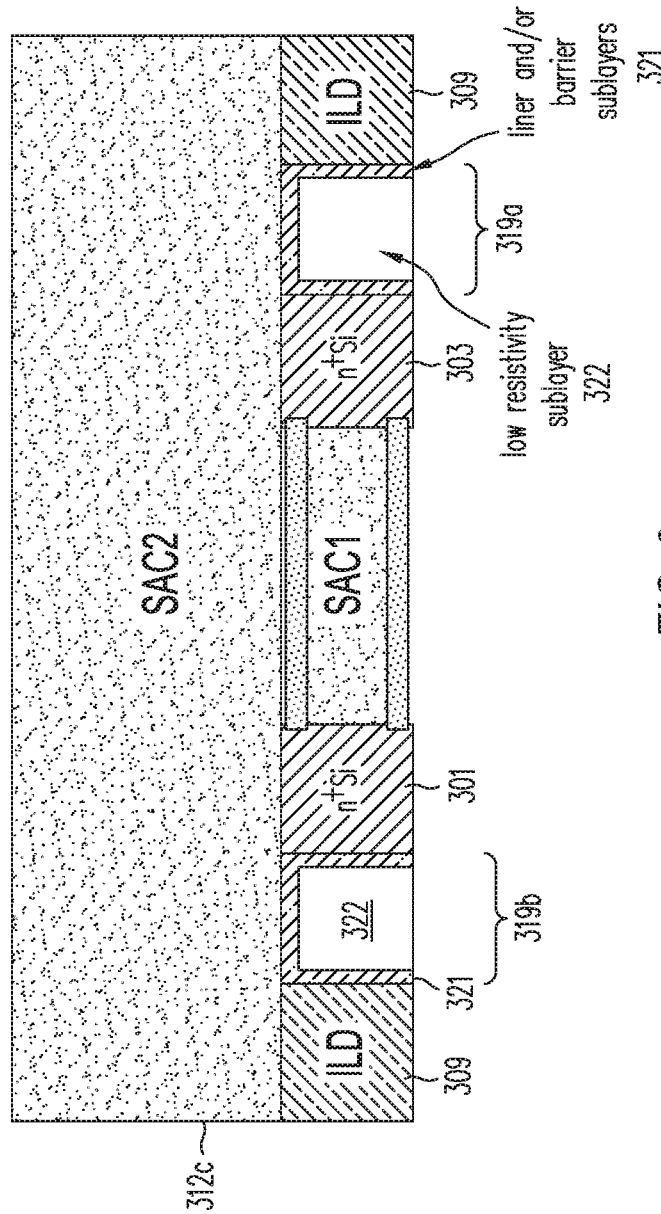
FIG. 8 shows in further detail the sublayers of an active layer in the memory structure of FIG. 7, in which the conductive sublayer includes a metal film formed by two or more metal sublayers.

FIG. 8 shows in further detail sublayers 301, 302 and 303 of an active layer in memory structure 300 of FIG. 7, in which conductive sublayers 319a and 319b each include a metal film formed by two or more sublayers. As shown in FIG. 8, after removal of the SAC4-containing second sacrificial sublayers 304a and 304b, an initial sublayer or sublayers 321 coats exposed walls of the void created by the removal of the SAC4 material. Thereafter, a low-resistivity sublayer 322 is deposited which substantially fills the void. Some porosity may exist in low-resistivity sublayer 322. Initial sublayer or sublayers 321 may be a liner film, a barrier film or both, forming C-shaped layers when viewed in cross section, such as shown in FIG. 8.

Figure 9:
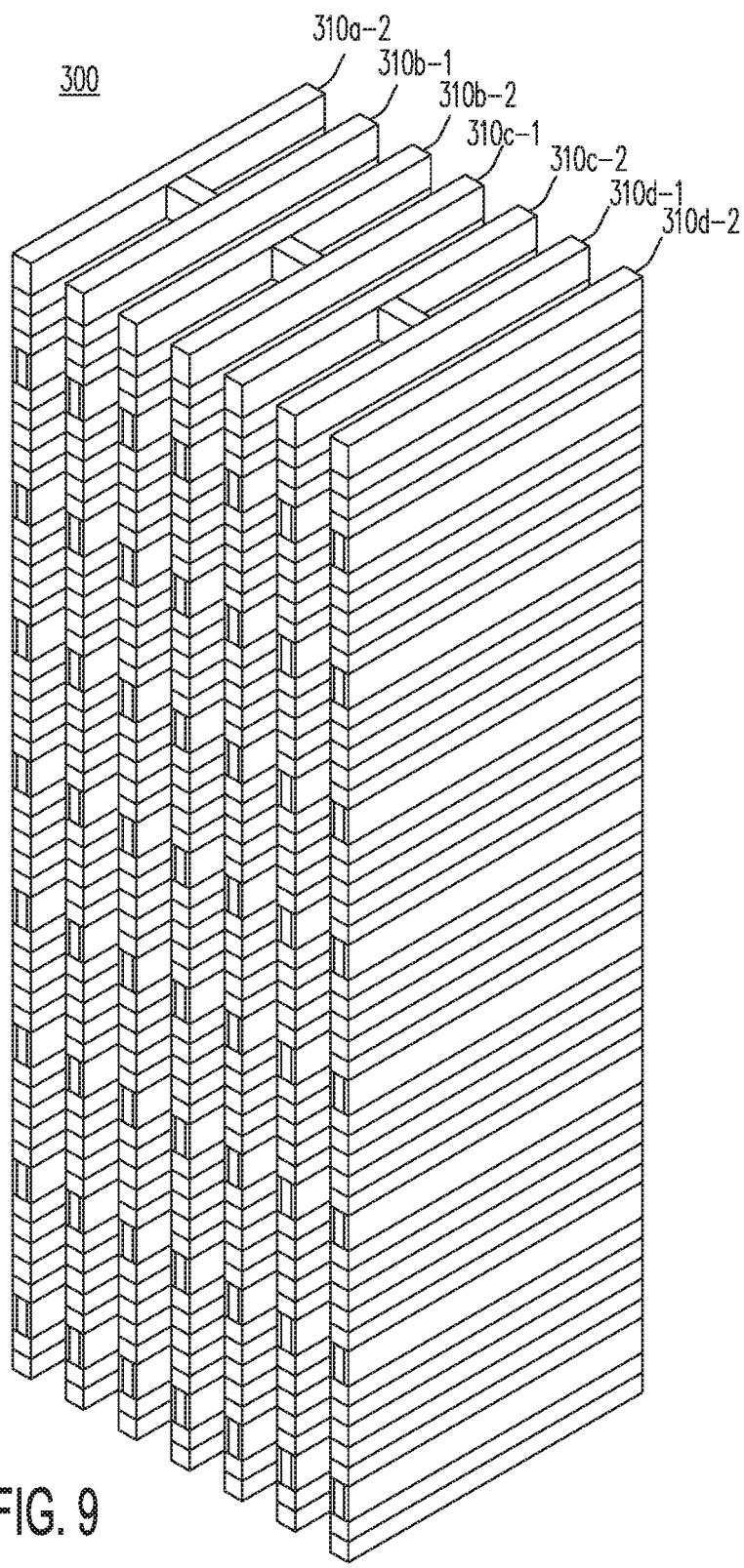
FIG. 9 shows memory structure 300 of FIG. 7, after removal of the SAC2 material from trenches 312a, 312b and 312c.

Next, the SAC2 material from trenches 312a, 312b and 312c is removed by selective etching. FIG. 9 shows memory structure 300 of FIG. 7, after removal of the SAC2 material. The memory structure may be patterned prior to the selective etching to protect the open trenches (i.e., those trenches that are not filled by SAC2 material) from damage during the selective etching. The resulting NIN stacks each now have a high aspect ratio, enabled in part by the mechanical, structural support from the struts between adjacent NIN stacks. The struts prevent the NIN stacks from leaning or toppling.

Conductive sublayers 319a and 319b may also be sealed to prevent damage from subsequent process steps, such as described below in conjunction with Embodiment 5 described below. Sealing may be achieved after both sides of conductive sublayers 319a and 319b are exposed (i.e., after removal of the SAC2 material from trenches 312a, 312b and 312c), and before channel sublayer 332 and storage layers 335 are formed, as described below.

Figure 10:
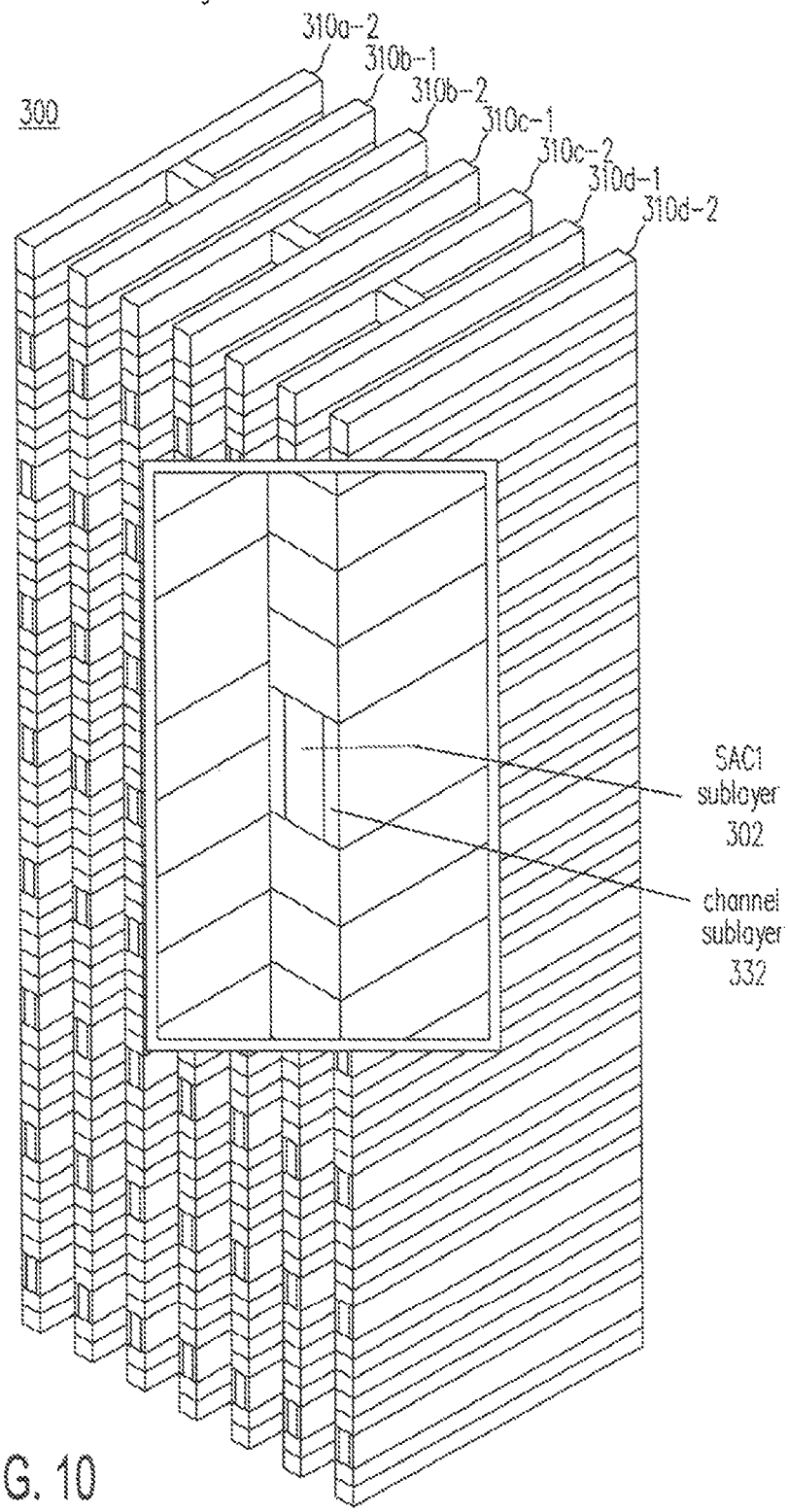
FIG. 10 shows memory structure 300 of FIG. 9 after a selective etch partially removes SAC1-containing first sacrificial sublayers 302, followed by deposition and etch of channel sublayers 332.

From memory structure 300 of FIG. 9, the remaining fabrication steps may follow those disclosed in the Copending Application. For example, FIG. 10 shows memory structure 300 of FIG. 9, after a selective etch partially removes SAC1-containing first sacrificial sublayers 302, followed by deposition and etching of channel sublayers 332. As shown in FIG. 10, the partial removal of the SAC1 material provides a wall of the SAC1 material to remain between two recesses or voids on either side of the wall. The deposition of the channel material fills the voids. The subsequent etching of the channel material removes the channel material from the trenches between the NIN stacks. An inset is provided in FIG. 10 to show the details the channel sublayers 332 and the remaining first sacrificial sublayers 302 ("spines").

Figure 11:
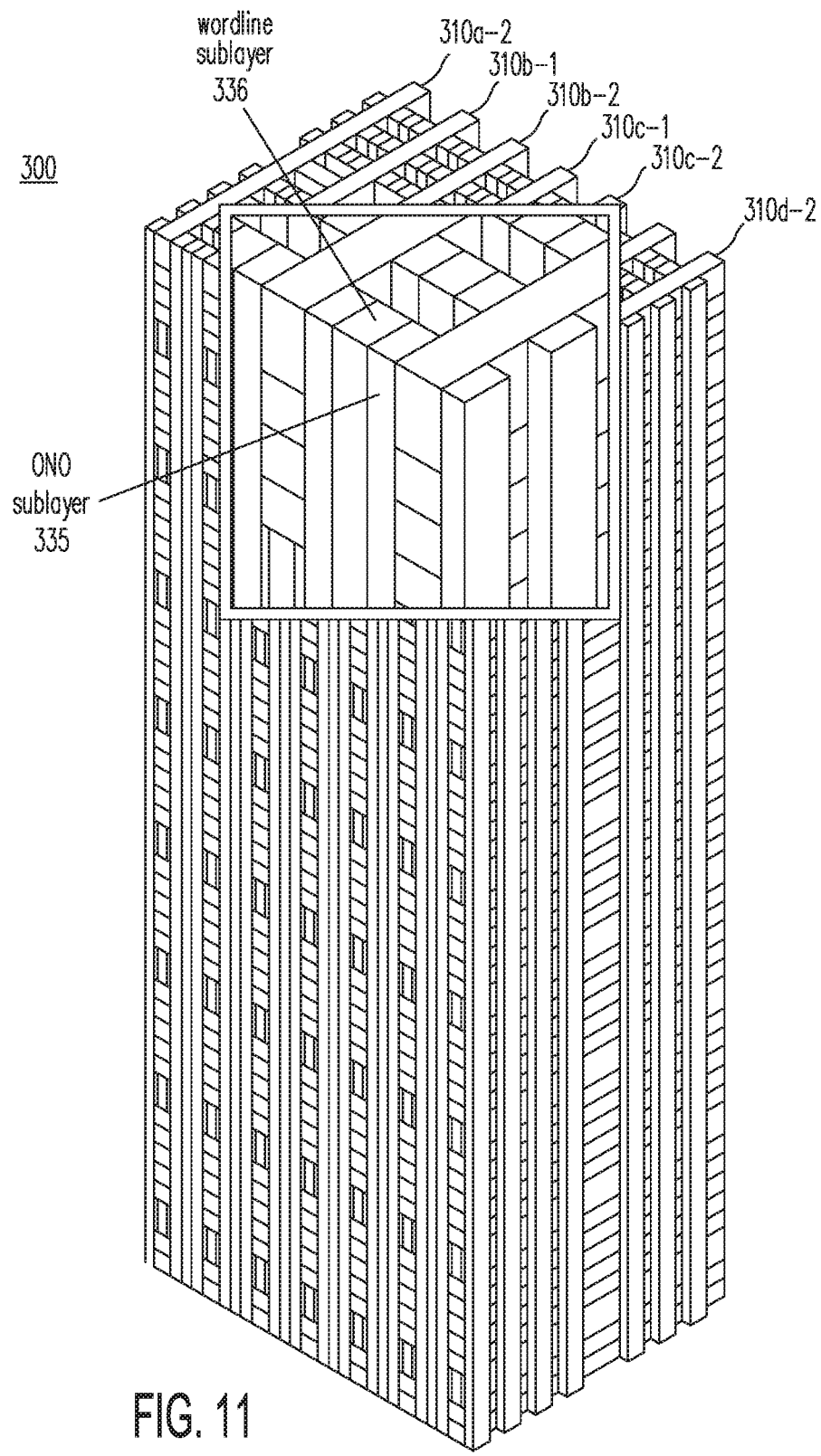
FIG. 11 shows memory structure 300 of FIG. 10, after storage layer 335 (e.g., an oxide-nitride-oxide (ONO) layer and word line layer 336 are deposited and patterned.

Storage layer 335 (e.g., an oxide-nitride-oxide (ONO) layer) is then deposited on memory structure 300 of FIG. 10. Storage layer 335 may be removed from the floor of the trenches between the NIN stacks by an etching step. Word line layer 336 is then deposited over the resulting structure and patterned, such as shown in FIG. 11. Storage layer 335 may remain on top of the NIN stacks or may be removed from the top of the NIN stacks during the etch to remove it from the floor of the trenches. FIG. 11 shows substantial completion of memory cell fabrication.

Figure 12A:
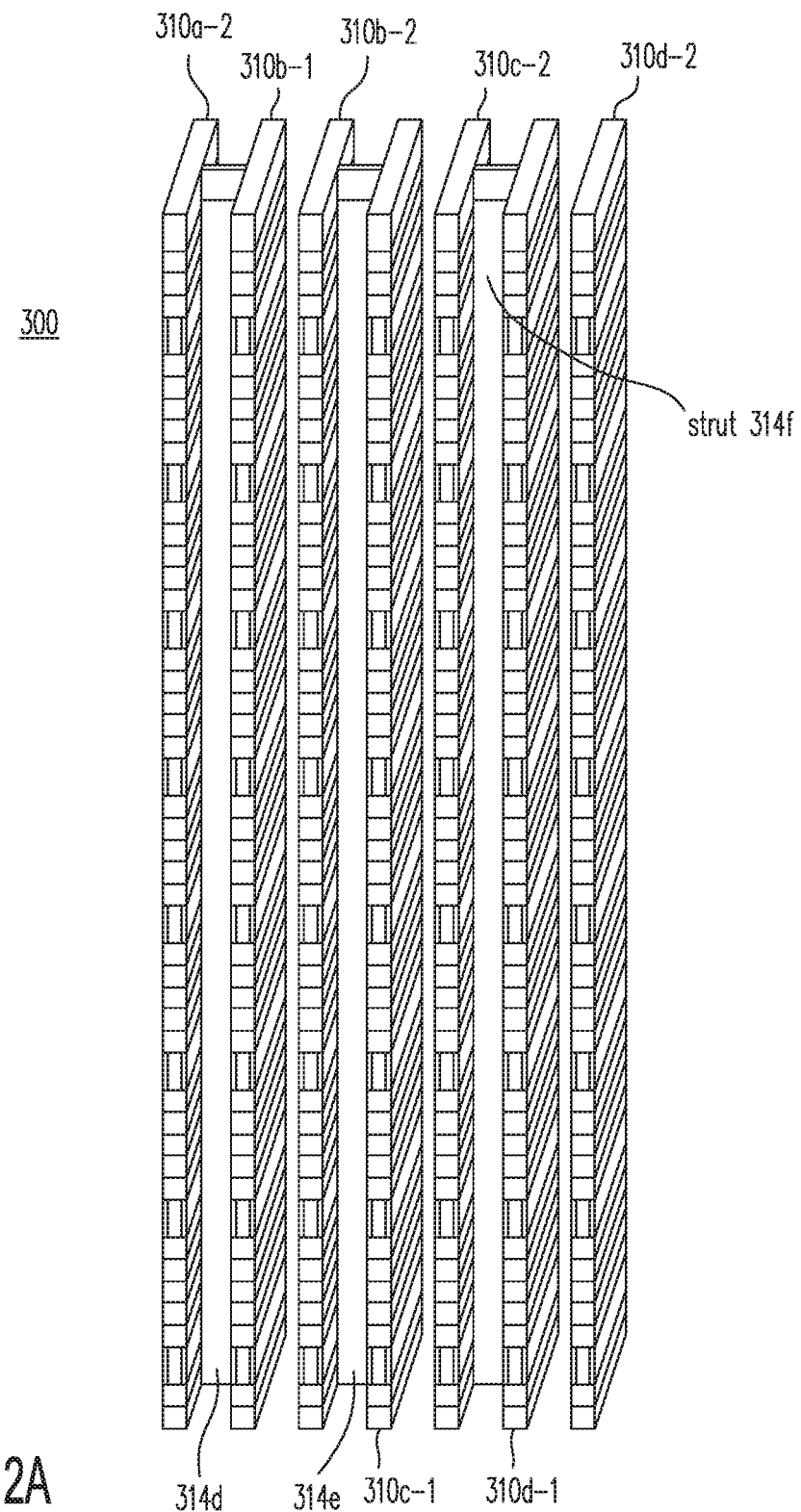
FIG. 12A shows a different strut structure in which struts 314d, 314e and 314f are formed after the initial set of the trenches are formed

As mentioned above, in the example illustrated by FIGS. 5-11, struts 314a, 314b and 314c are provided only between portions of hard mask layer 313. FIG. 12A shows a different strut structure in which struts 314d, 314e and 314f are formed after the initial set of the trenches are formed (e.g., at FIG. 3, before deposition of the SAC2 material). In FIG. 12A, struts 314d, 314e and 314f are structures that extend the full length of trenches 312a, 312b and 312c. To form struts 314d, 314e and 314f, a strut material is deposited into trenches 312a, 312b and 312c and on top of the NIN stacks and patterned. Struts 314d, 314e and 314f are more difficult to form than structs 314a, 314b and 314c shown in FIG. 5 and incur a memory density penalty, as memory cells cannot be formed adjacent to the struts.

Channel sublayer 332 is formed in this example after conductive or metal layers 319a and 319b replace the SAC4 material in second sacrificial sublayers 309a and 309b ("metal replacement"). In other embodiments, channel sublayer 332 may be formed prior to metal replacement.

Figure 12B:
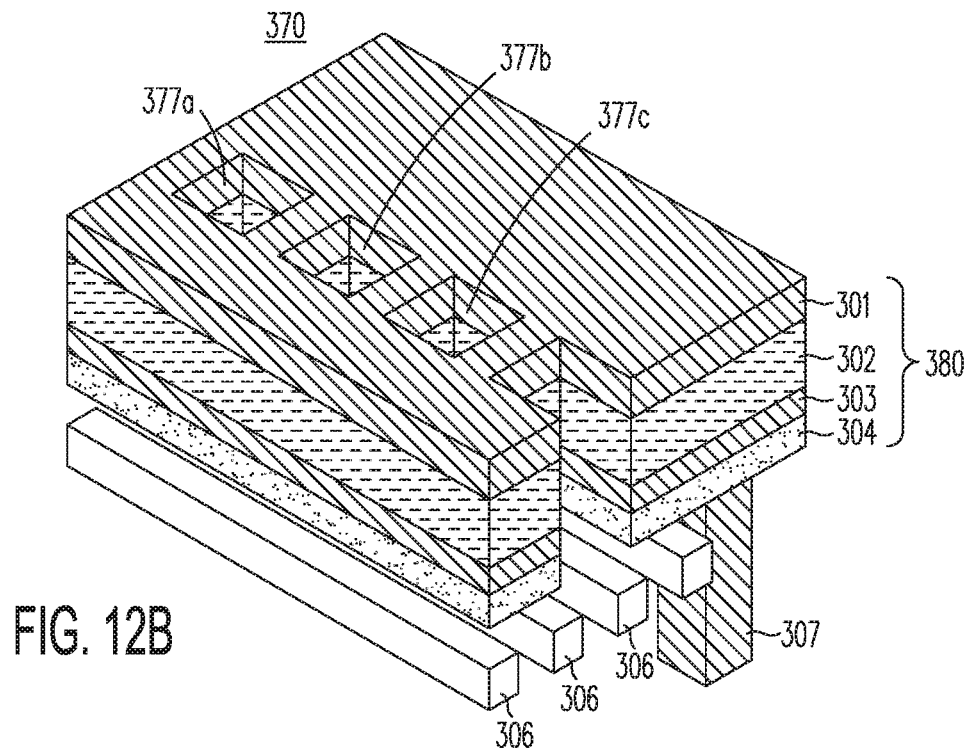
FIG. 12B shows a first active layer in memory structure 370 that has been etched to define the area of the memory structure; vias 377a, 377b and 377c are also etched into the active layer.

In a further example of this embodiment, oxide struts extend the height of the active layers one at a time, rather than using a single mask layer provided to support and extend the height of all the active layers. FIG. 12B shows a first active layer in memory structure 370 that has been etched to define the area of a block of the memory structure. As shown in FIG. 12B, one or more vias (e.g., vias 377a, 377b and 377c) can be etched within the defined area. Vias 377a, 377b and 377c are located where the trenches between the NIN stacks are expected to be formed. (Active layer 380 in FIG. 12B is structurally similar to active layer 110, i.e., only having a single layer of SAC4 material in each active layer, as illustrated above with respect to FIG. 1B or FIG. 1D.)

Figure 12C:
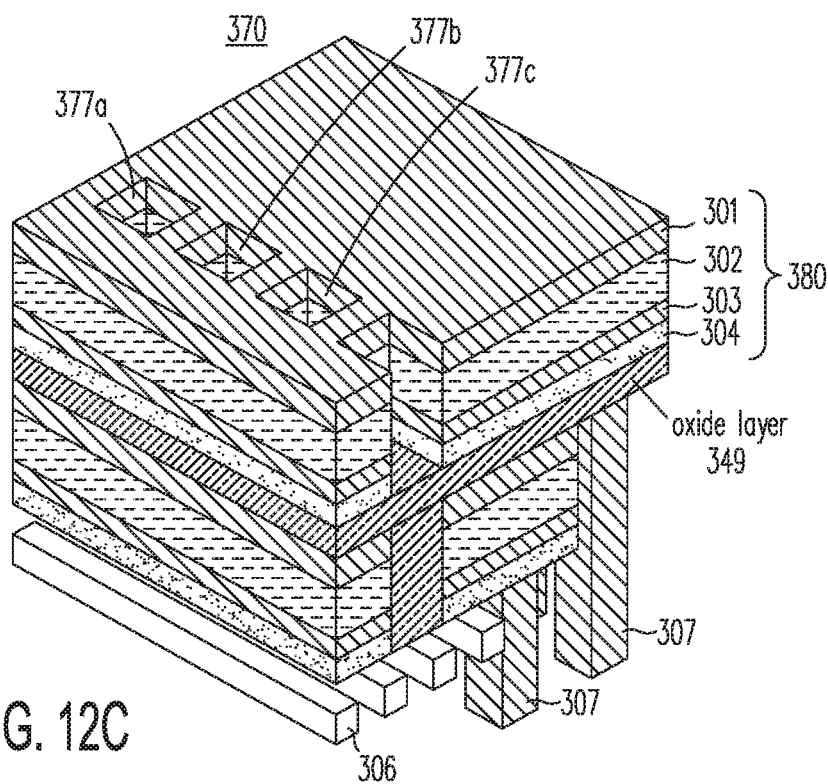
FIG. 12C shows memory structure 370 of FIG. 12B, after the second active layer is formed and before the etched vias 377a, 377b and 377c in the second active layer are filled with the ILD material.
Figure 12D:
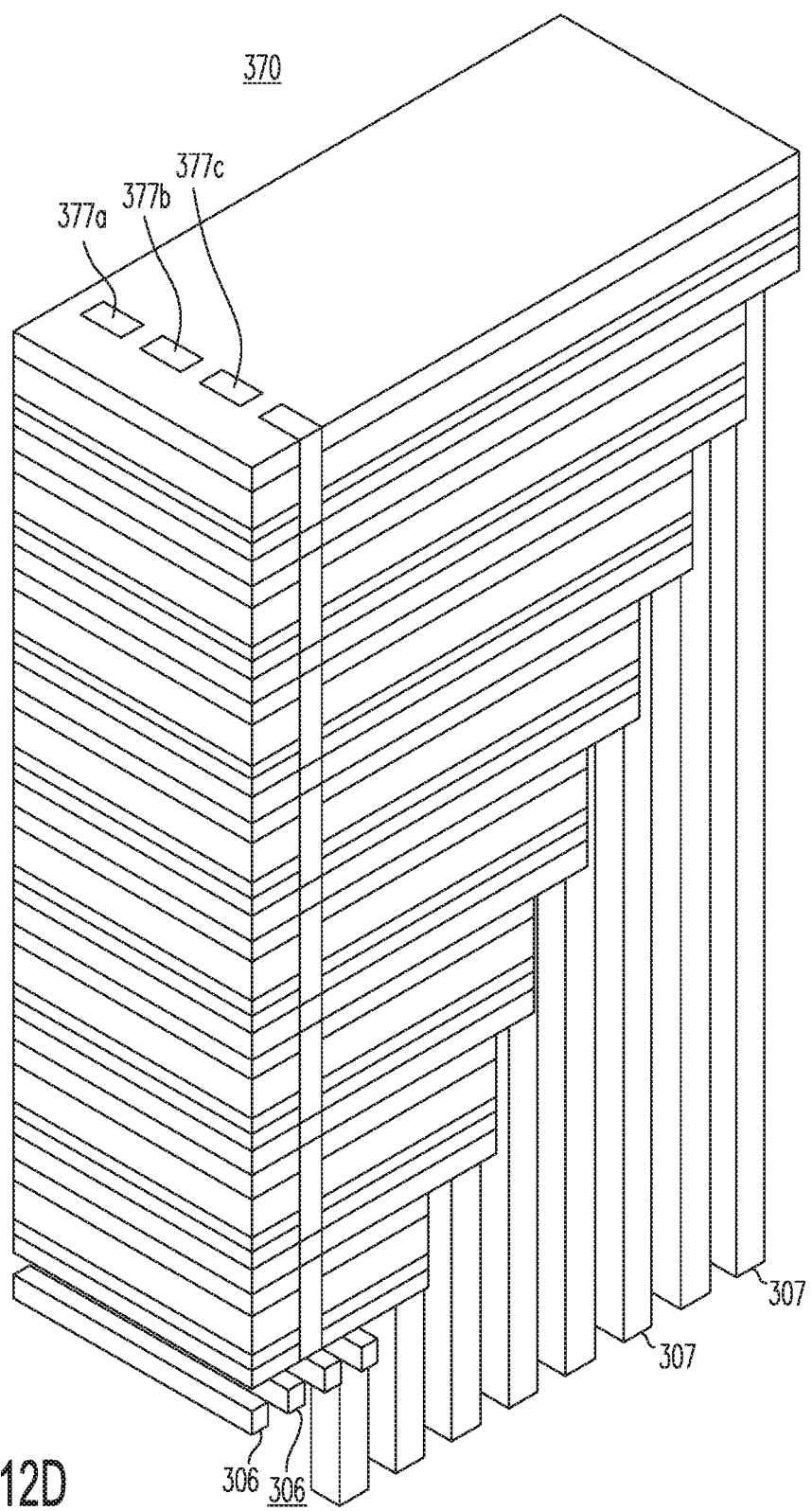
FIG. 12D shows memory structure 370 of FIG. 12C after eight active layers have been formed.
Figure 12E:
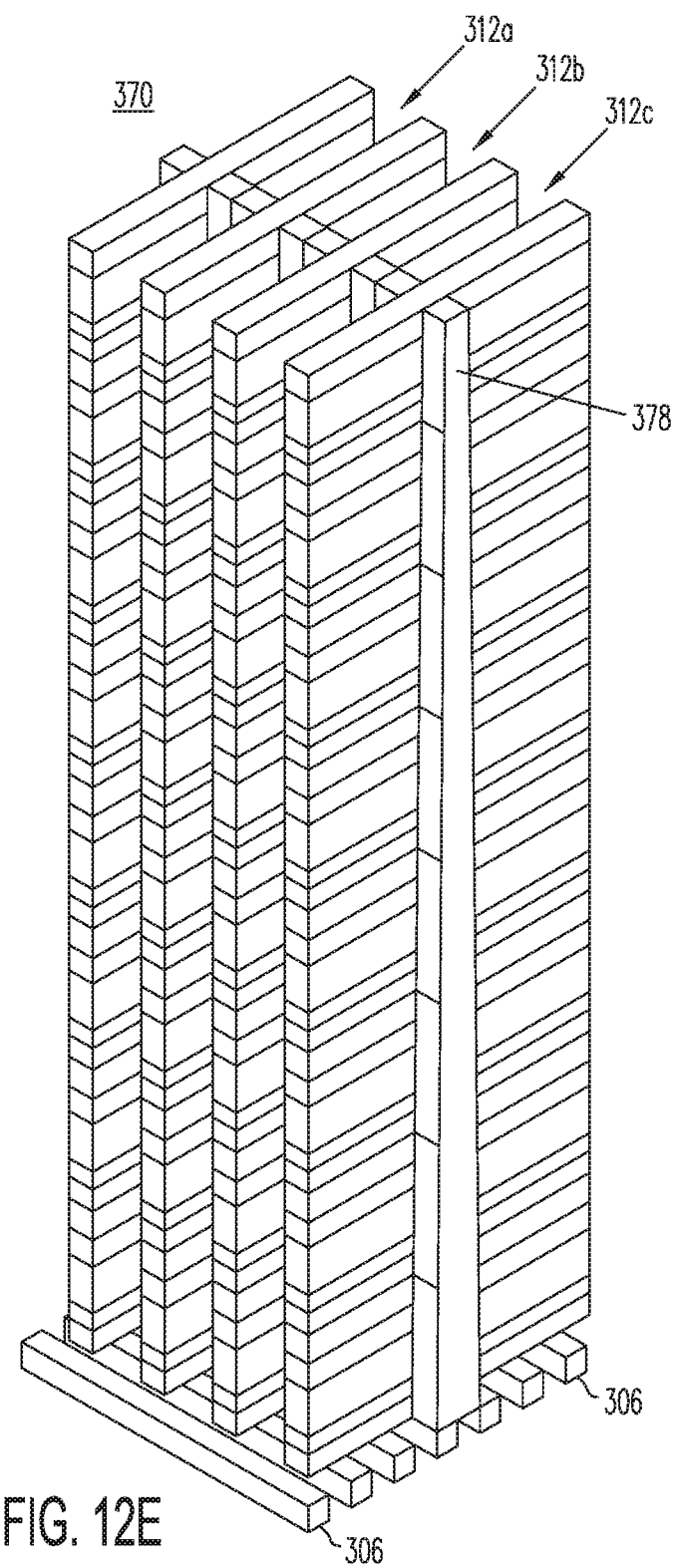
FIG. 12E shows forming trenches by a selective etch to create the NIN stacks in the memory structure of FIG. 12D, the selective etch leaves intact the ILD pillars in the filled vias 377a, 377b, 377c and 377d through the active layers.

After vias 377a, 377b and 377c are etched into active layer 380, ILD material 349 is then deposited to fill the vias. The ILD material is then planarized. The process for forming an active layer, patterning and filling vias 377 with the ILD material are repeated for each active layer. FIG. 12C shows memory structure 370 of FIG. 12B, after the second active layer is formed and before the etched vias 377a, 377b and 377c in the second active layer are filled with the ILD material. The etched vias 377a, 377b and 377c of the second active layer are located substantially at the same locations of the corresponding vias 377a, 377b and 377c in the first active layer, so that a continuous pillar of ILD material may be formed. FIG. 12D shows memory structure 370 of FIG. 12C after eight active layers have been formed. In this embodiment, each via in each active layer has a smaller cross-sectional area than the corresponding via in the immediately preceding active layer, so as to allow for some misalignment between active layers and to allow the formation of a strut with a smaller peak than its base. The resulting struts which form tapering ILD structures (or "pyramids", e.g., pyramid 378) are shown in FIG. 12E. FIG. 12E shows forming trenches by a selective etch which creates the NIN stacks in memory structure 370 of FIG. 12D, the selective etch leaves intact the ILD structure in the filled vias 377a, 377b and 377c through the active layers.

Oxide struts with tapering cross sections (e.g., pyramid 378 of FIG. 12E) minimize the chance of forming a NIN stringer when the trenches are etched. The via etch of each successive active layer in FIG. 12E provides an oxide strut in a shorter time, as compared to the etch that produces an oxide strut shown in FIG. 12A. This approach has the advantage that, as each new active layer is formed in the NIN stack, the growing NIN stack is supported by its growing strut, which not available in FIG. 12A's approach of etching through all active layers in the NIN stack to create an oxide strut.

Although oxide struts are provided in every trench in FIGS. 12B-12E, in some embodiments, the oxide struts need only be provided every other trench, as mechanical support to one side of each NIN stack may be sufficient in many applications.

Embodiment 2

In this embodiment, the SAC4 material-containing sublayer or sublayers (e.g., second sacrificial sublayers 304a and 304b of FIG. 7), are removed by etching long cavities in the direction along the length each sublayer, instead of side-ways (i.e., in the direction along its width) through exposed portions from side walls of the trenches, as was shown above in conjunction with FIGS. 6-7 (Embodiment 1) above. In other words, etchant sequentially removes SAC4 material from one or both ends along the length of the second sacrificial sublayer or sublayers. While this etch takes longer paths, Embodiment 2 has an advantage over Embodiment 1 in that metal replacement may be carried out after the memory cells have been formed, thereby reducing the risk of metal contamination in the memory cells.

Figure 13:
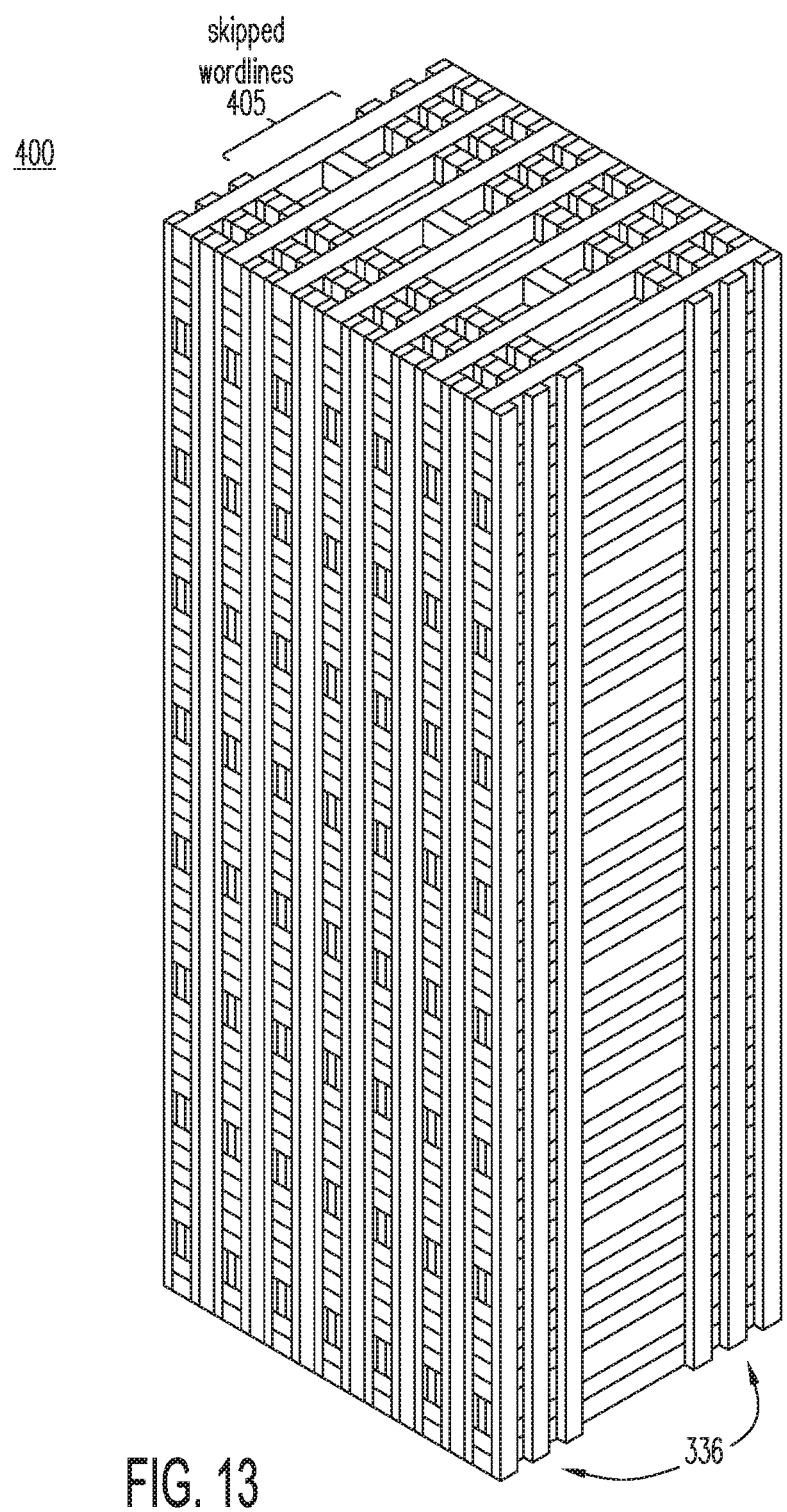
FIG. 13 shows memory structure 400 that is substantially the same as memory structure 300 of FIG. 11, except that removal of the SAC4 material (e.g., second sacrificial sublayers 304a and 304b) and metal replacement have not yet taken place.
Figure 14:
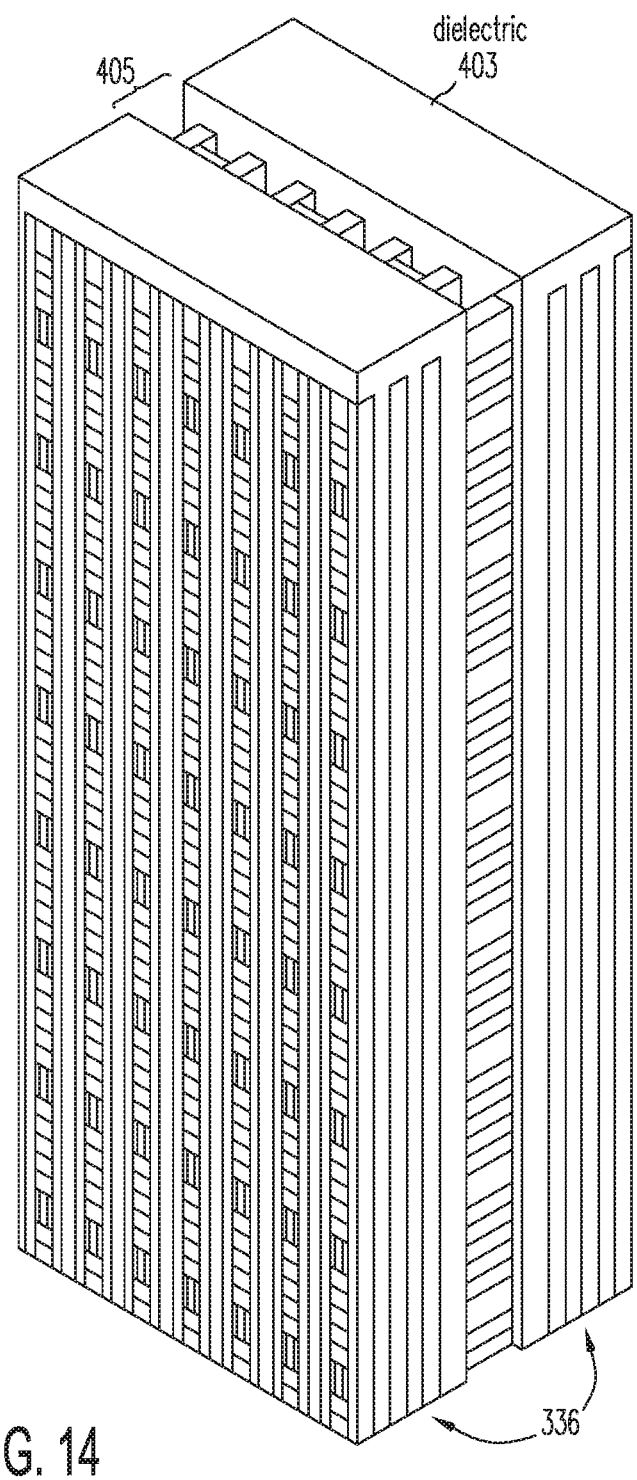
FIG. 14 shows memory structure 400 of FIG. 13 after portions of the NIN stack corresponding to skipped section 405 in word line layer 336 are exposed.
Figure 15:
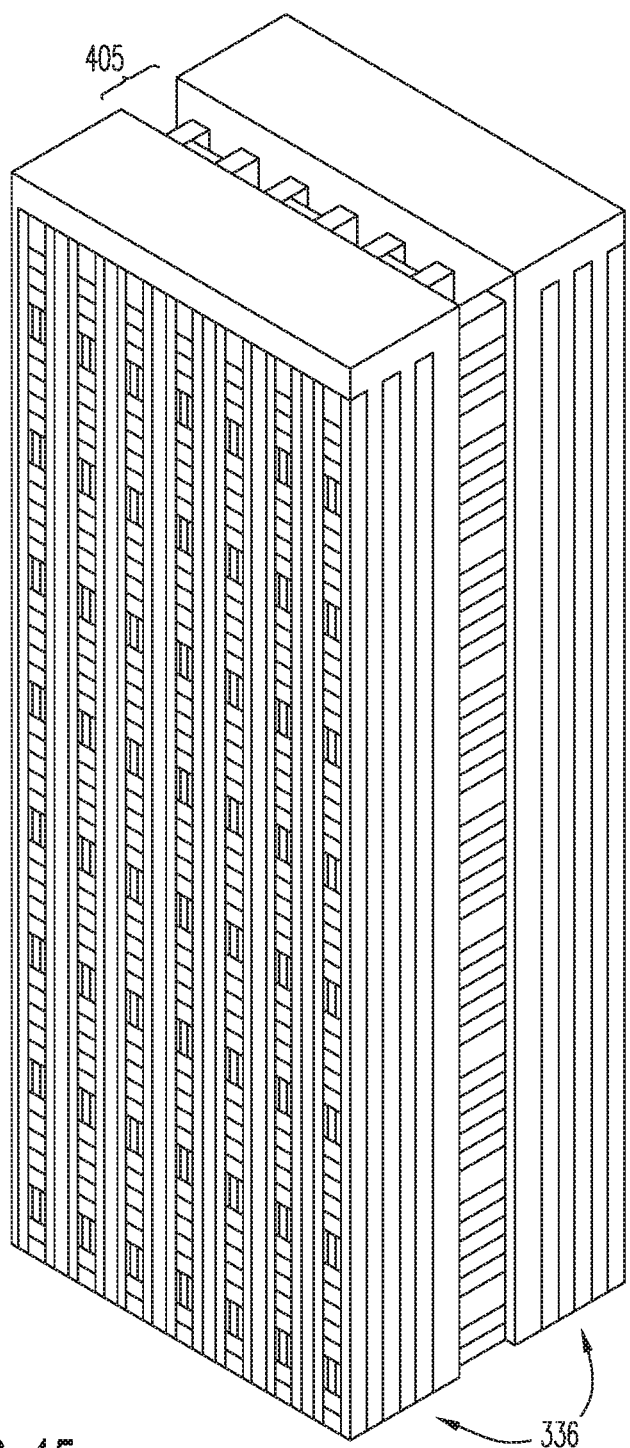
FIG. 15 shows memory structure 400 of FIG. 14 after metal replacement is complete.

FIG. 13 shows memory structure 400 that is substantially the same as the memory structure 300 of FIG. 11, except for removal of second sacrificial sublayers 304a and 304b and metal replacement, described above in conjunction with FIG. 7, which have not yet taken place. In addition, in memory structure 400 of FIG. 13, word line layer 336 is patterned and etched with gaps along each NOR string, such that not all storage transistors in the NOR strings of the NIN stacks are provided with a word line ("skipped word lines"). Such skipped word lines, shown in FIG. 13 as skipped section 405, may span, for example, the space of 1, 2, 4, 16, 64, 128 or more skipped word lines. Storage sublayers (e.g., storage sublayer 335, containing ONO) have been provided and are intact everywhere, including where the word lines have been "skipped." Each section in the NIN stack where word lines are skipped may span the height of the NIN stack. For clarity, only one skipped section (i.e., skipped section 405) is shown in FIG. 13-15. More than one skipped section may be provided along each NOR string to be formed.

Dielectric layer 403 is then deposited over the memory structure of FIG. 13, filling the trenches between the word lines. Dielectric layer 403 is then patterned to expose the skipped sections (e.g., skipped section 405). FIG. 14 shows memory structure 400 of FIG. 13 after skipped section 405 is exposed. Thereafter, the exposed portions of storage sublayer 335 underneath skipped section 405 are then removed to expose the underlying active layers.

SAC4 material-containing sublayers of all active layers (e.g., second sacrificial sublayers 304a and 304b) in the NIN stack are then selectively etched. The etching proceeds from each exposed sublayer and extends lengthwise (i.e., in the direction of the lengths of source and drain sublayers 303 and 301) and continues underneath the unexposed portions of storage layer 335, thereby leaving behind long cavities in the SAC4 material-containing sublayers, as the SAC4 material is removed. After removing the SAC4 material-containing sublayers, metal replacement is carried out by depositing a conductive material into the cavities, on the exposed sidewalls of the NIN stacks and on top of the NIN stacks. The conductive material is then removed from the exposed sidewalls of the NIN stacks and from the top of the NIN stacks, thus leaving the conductive sublayer resulting from the cavities being filled. The metal replacement step is then complete. FIG. 15 shows memory structure 400 of FIG. 14 after the metal replacement step is complete.

Figure 16:
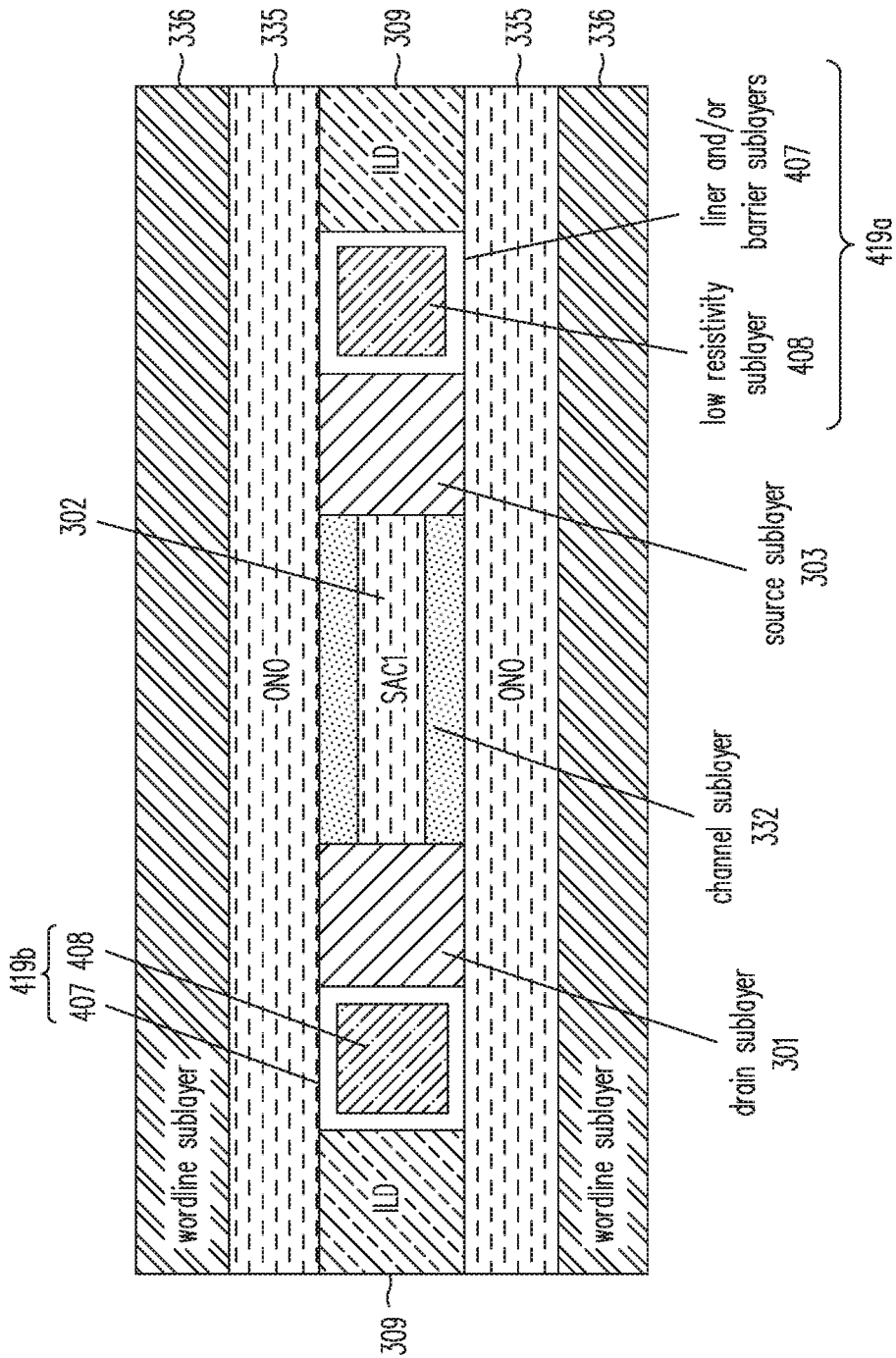
FIG. 16 is a cross section of a part of memory array 400 showing two memory cells, where SAC4 material-containing second sacrificial sublayers 304a and 304b hav been removed by etching and replaced by a combination of liner/barrier sublayer and a more conductive sublayer.

FIG. 16 is a cross section shows in greater detail through an active layer in memory structure 400 of FIG. 15. As shown in FIG. 16, drain and source sublayers 301 and 303 are respectively contacted by conductive sublayers 419b and 419a. In other embodiments, only drain sublayer 301 or source sublayer 303 is contacted by a conductive sublayer. In the cross section of FIG. 8, each conductive sublayer in memory structure 300 may include a metal film with an initial layer or sublayers serving as a liner or a barrier layer (e.g., liner or barrier sublayer 321 in FIG. 8). Unlike liner or barrier sublayer 321 in memory structure 300e of FIG. 8, however, liner or barrier sublayer 407 of memory structure 400 coats all four sides of each cavity (i.e., underneath storage layer 335 on both sides of the NIN stack, adjacent source sublayer 3303 or drain sublayer 301 and the corresponding adjacent ILD layer 309. The cavities are then filled by low resistivity material 408, which may include minor porosity.

FIG. 16 also shows, between the channel regions provided by channel sublayer 332 on both sides of the active strip, first sacrificial sublayer 302 (containing the SAC1 material) remains as a fin structure electrically isolating the channel regions from each other. This fin structure may also be removed by selective etching after deposition of channel sublayer 332. This selective etching may proceed along the lengths of source and drain sublayers 303 and 301, in the same manner as the etching of the SAC4 material in this example, using an etchant that has a different selectivity. The removal of the SAC1 material from the fin structure provides an air-gap isolation, which reduces parasitic capacitive coupling between the two adjacent memory cells. This air-gap isolation technique can be similarly applied to other embodiments or examples in this detailed description to achieve like advantages.

The NIN stacks of FIG. 16 may be achieved using the strut structure described above in conjunction with the memory structures of FIGS. 5-11.

Embodiment 3

Alternatively, the NIN stacks can be built incrementally in two or more portions. In each portion, only a limited number of active layers are etched in the vertical direction. Specifically, etching of high aspect ratio NIN stacks are avoided in the initial portion (portion 1) by etching fewer active layers, which reduces the aspect ratio. When a subsequent portion of the NIN stacks is added on top of an earlier portion of the NIN stacks and etched, the earlier portion is supported by a dielectric layer that is deposited in the trenches of the earlier portion. The subsequent portion is self-supporting during its etch, as the etch does not create a high aspect ratio structure. When all the portions of the NIN stacks have been fabricated, a dielectric layer is deposited to fill any remaining open trenches, patterned, and etched to remove all previously deposited like dielectric layers from all earlier portions of the NIN stacks, while maintaining the mechanical strength of the NIN stacks. When the conductive sublayer is inserted into the NIN stacks, only one side of each NIN stack is exposed in a trench, while the opposite side trench is filled with a dielectric layer.

Figure 17:
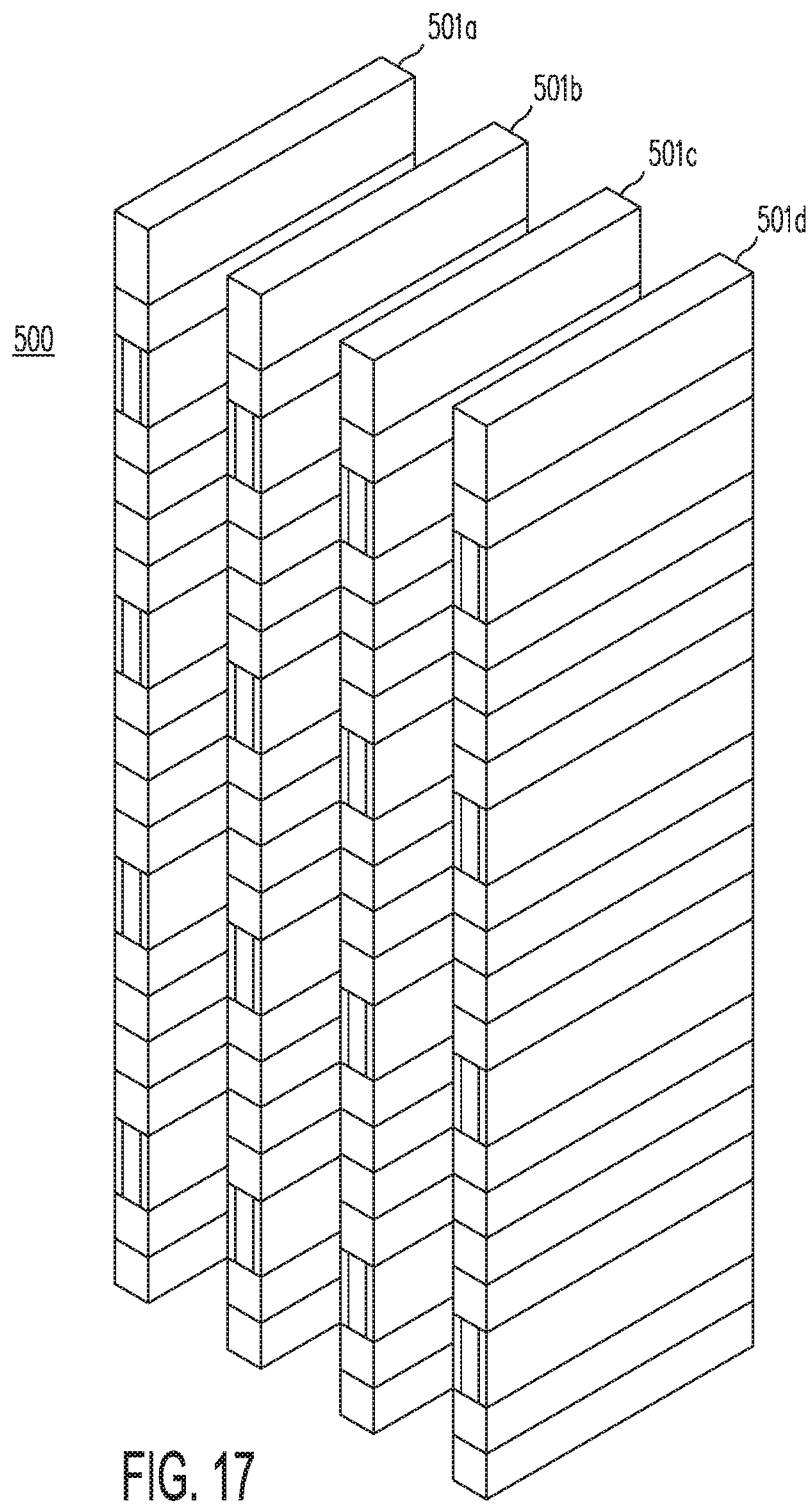
FIG. 17 show memory structure 500, including four NIN stacks 501a, 501b, 501c and 501d ("portion 1"), after creating channel sublayer 332 that fills recesses on both sides of partially removed SAC1 material-containing first sacrificial sublayer 302.

FIG. 17 show memory structure 500 including four NIN stacks 501a, 501b, 501c and 501d ("portion 1"), which may contain any appropriate number of active layers to remain structurally sound (i.e., the aspect ratio of each NIN stack is low enough to avoid leaning or toppling). Portion 1 may have 1, 2, 3, 4, or more active layers. In FIG. 17, first sacrificial sublayer 302 of each active layer has been partially removed and channel sublayer 332 is deposited to fill the cavities left behind from removal of the SAC1 material. Excess material from channel sublayer 332 has also been removed from the sidewalls of the NIN stacks and from the top of the NIN stacks. (Alternatively, this partial removal of first sacrificial sublayer 302 and replacement by channel sublayer 332 may also occur at a later step, following replacing the second sacrificial layer 304 (i.e., the SAC4 material) by conductive layer 319.) Dielectric layer 509 is then deposited, filling all trenches. Any dielectric material from dielectric layer 509 deposited on top of the NIN stacks is then removed using, for example, etching or a CMP step. The resulting memory structure 500 is in FIG. 18.

Figure 18:
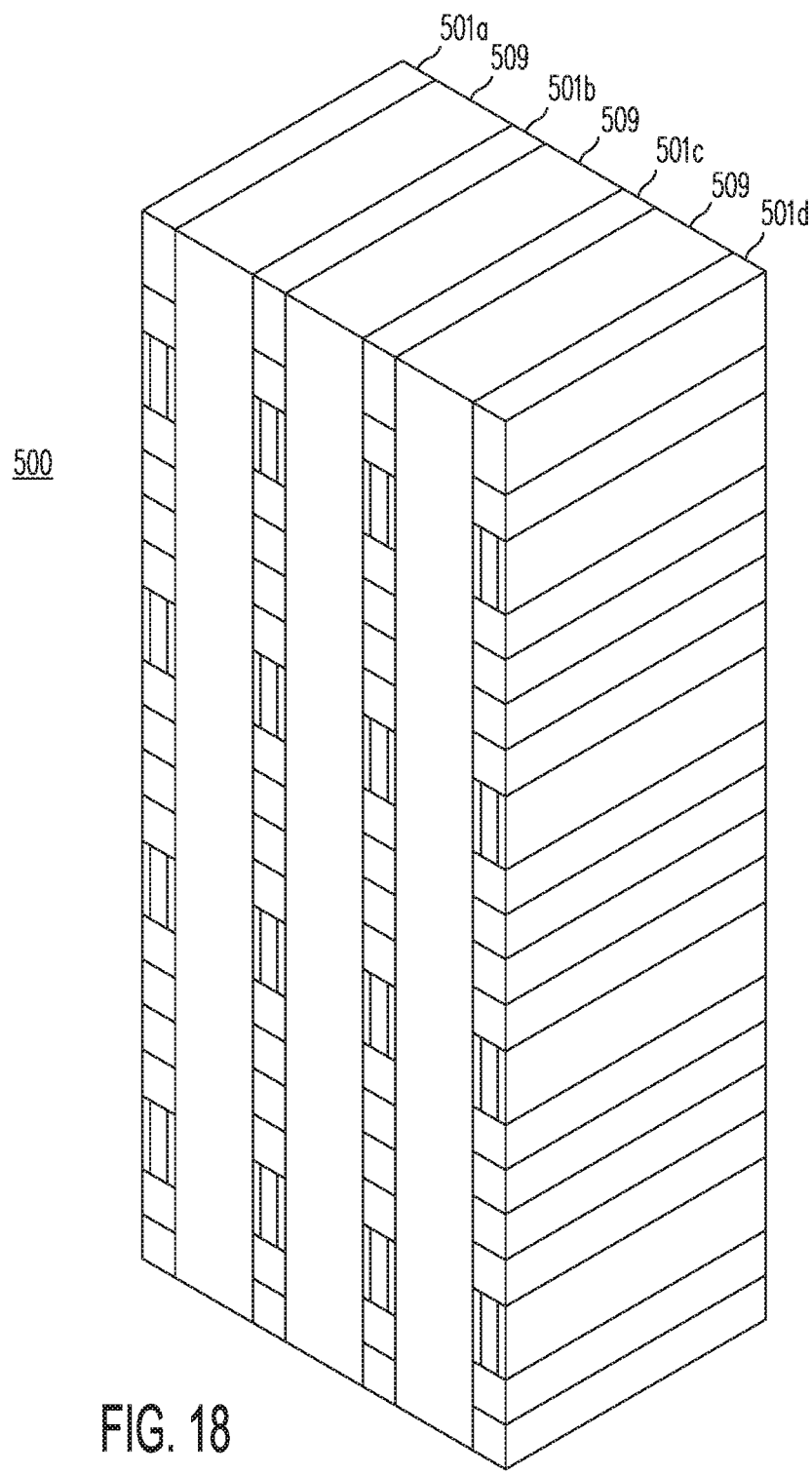
FIG. 18 shows memory structure 500 of FIG. 18, after dielectric layer 509 is deposited and the dielectric material of dielectric layer 509 on top of the NIN stacks are removed using, for example, etching or a CMP step.
Figure 19:
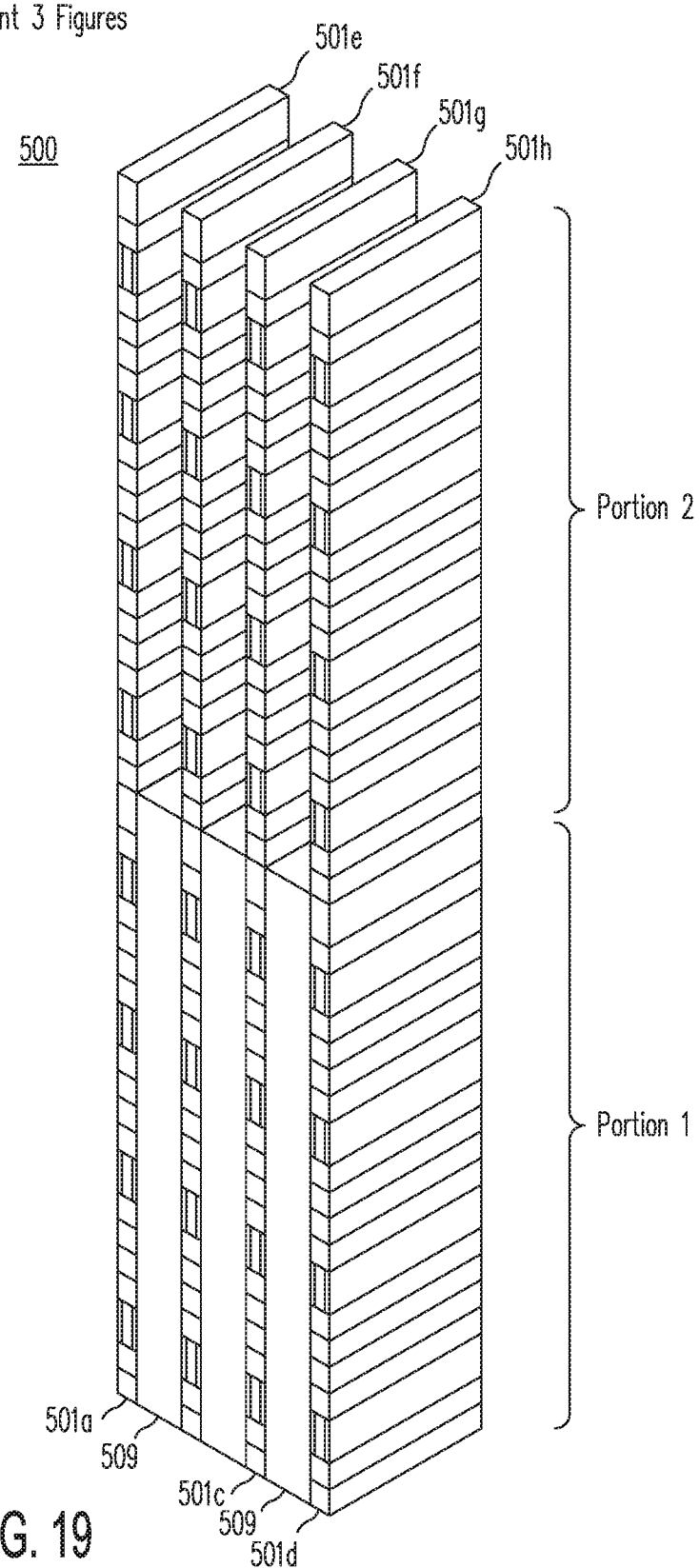
FIG. 19 shows memory structure 500 resulting from fabricating an addition portion of four more NIN stacks 501e, 501f, 501g and 501h ("portion 2") on top of portion 1.
Figure 20:
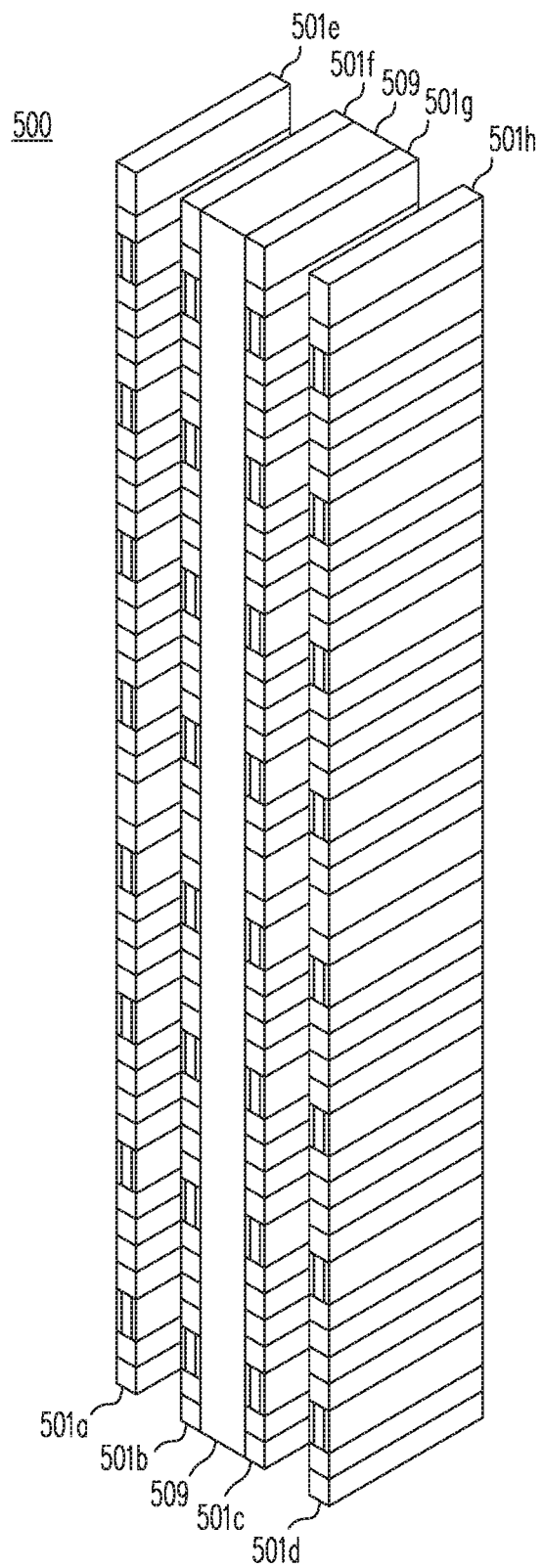
FIG. 20 shows memory structure 500 of FIG. 19, after a dielectric material, such as the same dielectric material as dielectric layer 509, is deposited into the trenches, and memory structure 500 is patterned and etched to remove the dielectric material from every other trench in both portions 2 and 1.
Figure 21:
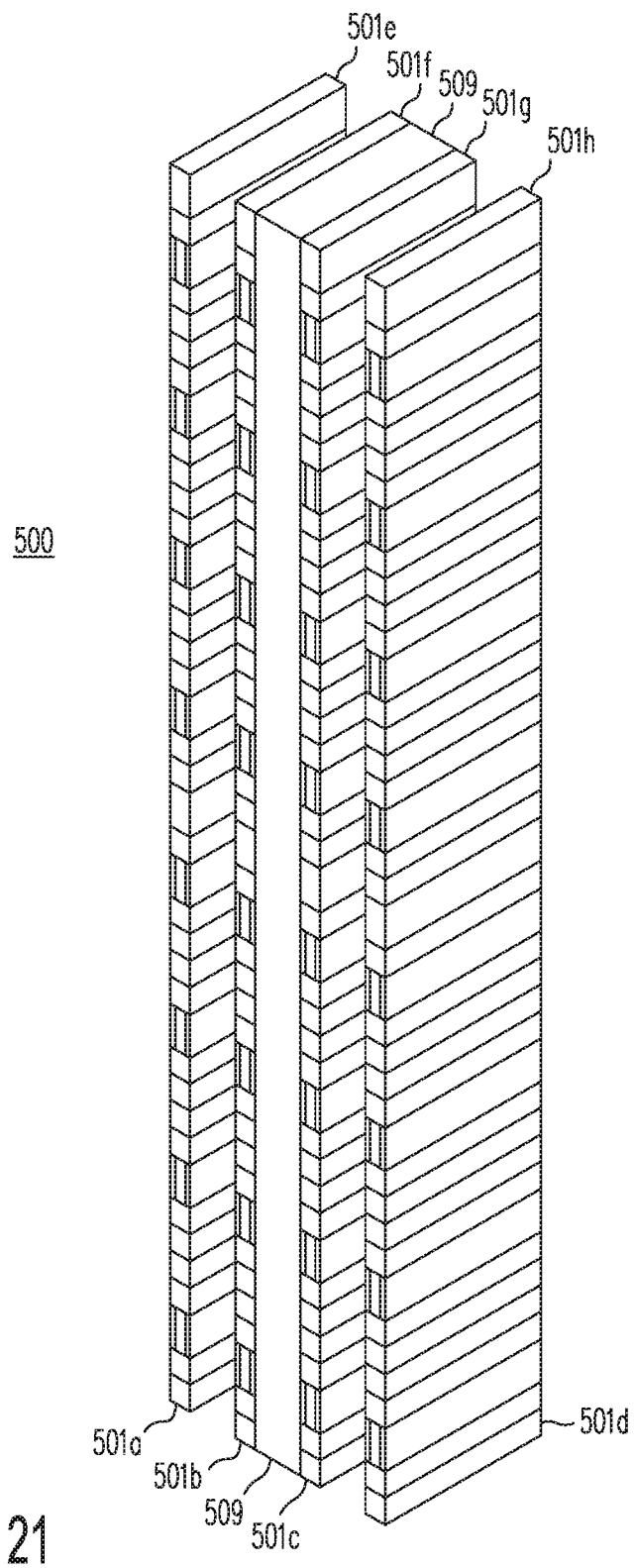
FIG. 21 shows memory structure 500 of FIG. 20, after SAC4 material-containing second sacrificial sublayers 304a and 304b of each active layer is removed by selective etching, being replaced by conductive sublayers 319a and 319b.

On top of portion 1 of FIG. 18, an additional four more NIN stacks 501e, 501f, 501g and 501h ("portion 2") are then fabricated. Resulting structure 500 is shown in FIG. 19. The NIN stacks in portion 2 are etched such that each NIN stack is aligned to a corresponding NIN stack of portion 1. As in portion 1, portion 2 may contain any appropriate number of active layers to remain structurally sound (i.e. the aspect ratio of each subsequently fabricated NIN stack is low enough to avoid leaning or toppling). In this regard, portion 2 may have 1, 2, 3, 4, or more active layers. The trenches of portion 2 are then filled with a dielectric material (e.g., the same dielectric material as dielectric layer 509). Resulting structure 500 is then patterned to remove by etching the dielectric material from every other trench in both portions 2 and 1, as shown in FIG. 20. The SAC4 material-containing sublayers of each active layer (e.g., second sacrificial sublayers 304a and 304b) are then removed by selective etching, and conductive sublayers (e.g., conductive sublayers 319a and 319b) are deposited to replace the SAC4 material removed. Any excess conductive material from the deposition on the sidewalls of the trenches and the tops of the NIN stacks are then selectively removed. Resulting structure 500 is shown in FIG. 21.

In some embodiments, portion 1 may be processed through storage layer 335 and local word lines formations, before beginning construction of portion 2.

The conductive sublayers 319a and 319b may also be sealed to protect subsequent steps in the fabrication process. One example of a sealing process is discussed below in conjunction with Embodiment 5. The sealing process may occur after the conductive layers are exposed to the trenches, and before channel and storage sublayer formation.

As explained above, even though channel sublayer 332 may be formed before the metal replacement step (e.g., conductive sublayers 319a and 319b), formation of channel sublayer 332 may also take place after the metal replacement step. Immediately after the metal replacement step, as dielectric layer 509 still occupies every other trench, channel sublayer 332 may be formed only in the active layers exposed to the open trench sides of the NIN stacks. The excess channel material at the bottom of the trench, on the trench sidewalls and at the tops of the NIN stacks are removed by etching. Storage layer 335 (e.g., an ONO layer) may be deposited to line the open trenches and at the tops of the NIN stacks. The excess storage layer material at the bottom of the trenches and on top of the NIN stacks are then removed, leaving storage layer 335 only on the sidewalls of the trenches. Alternatively, the excess storage layer material may be retained until after formation of the word lines.

Figure 22:
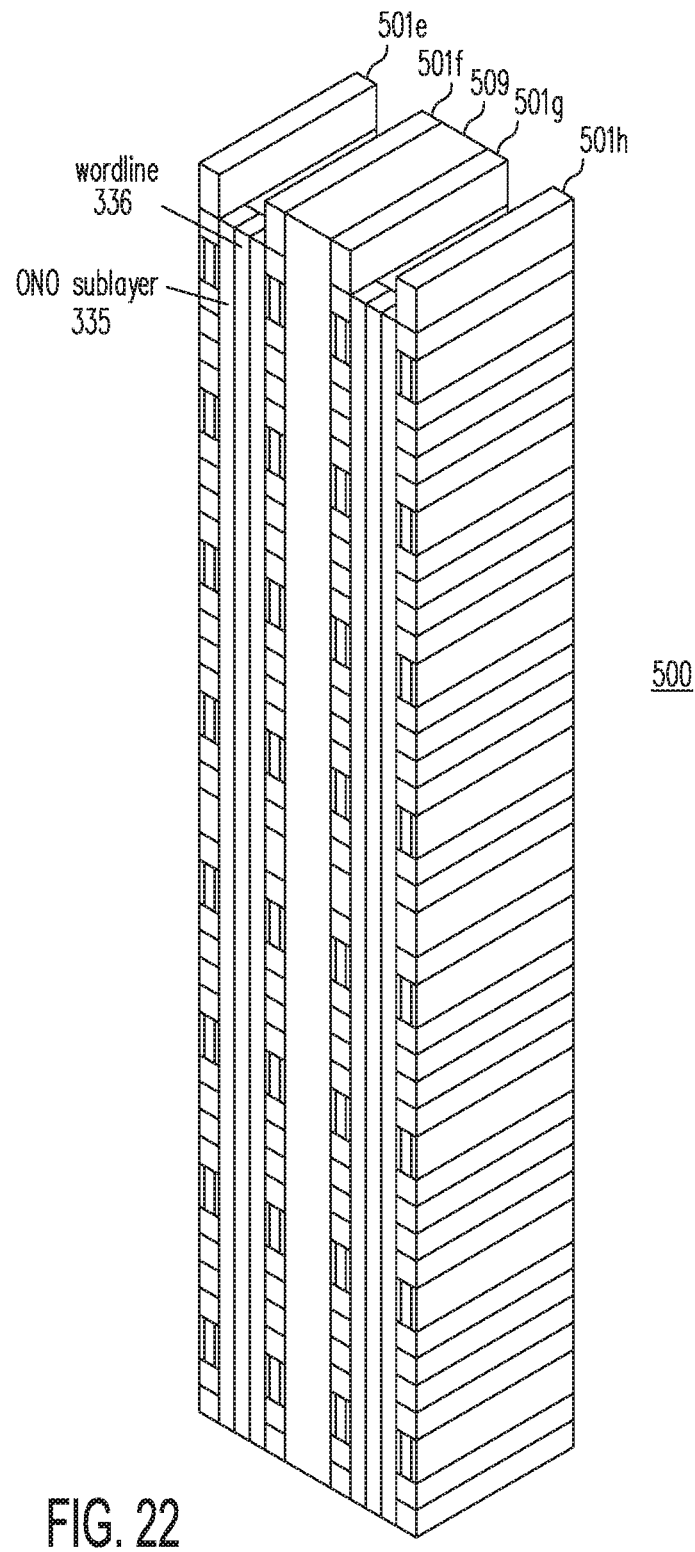
FIG. 22 shows memory structure 500 of FIG. 21, after storage layer 446 and local word line layer 336 on one side of each NIN stack are formed.

The conductive material for forming the word lines are then deposited over the storage layer on the side walls of the exposed trenches and patterned to provide the memory structure shown in FIG. 22. At this point in fabrication, approximately half of the memory cells have been substantially fabricated. The storage material that is not protected by the conductive material for the word lines is optionally removed at this time.

Figure 23:
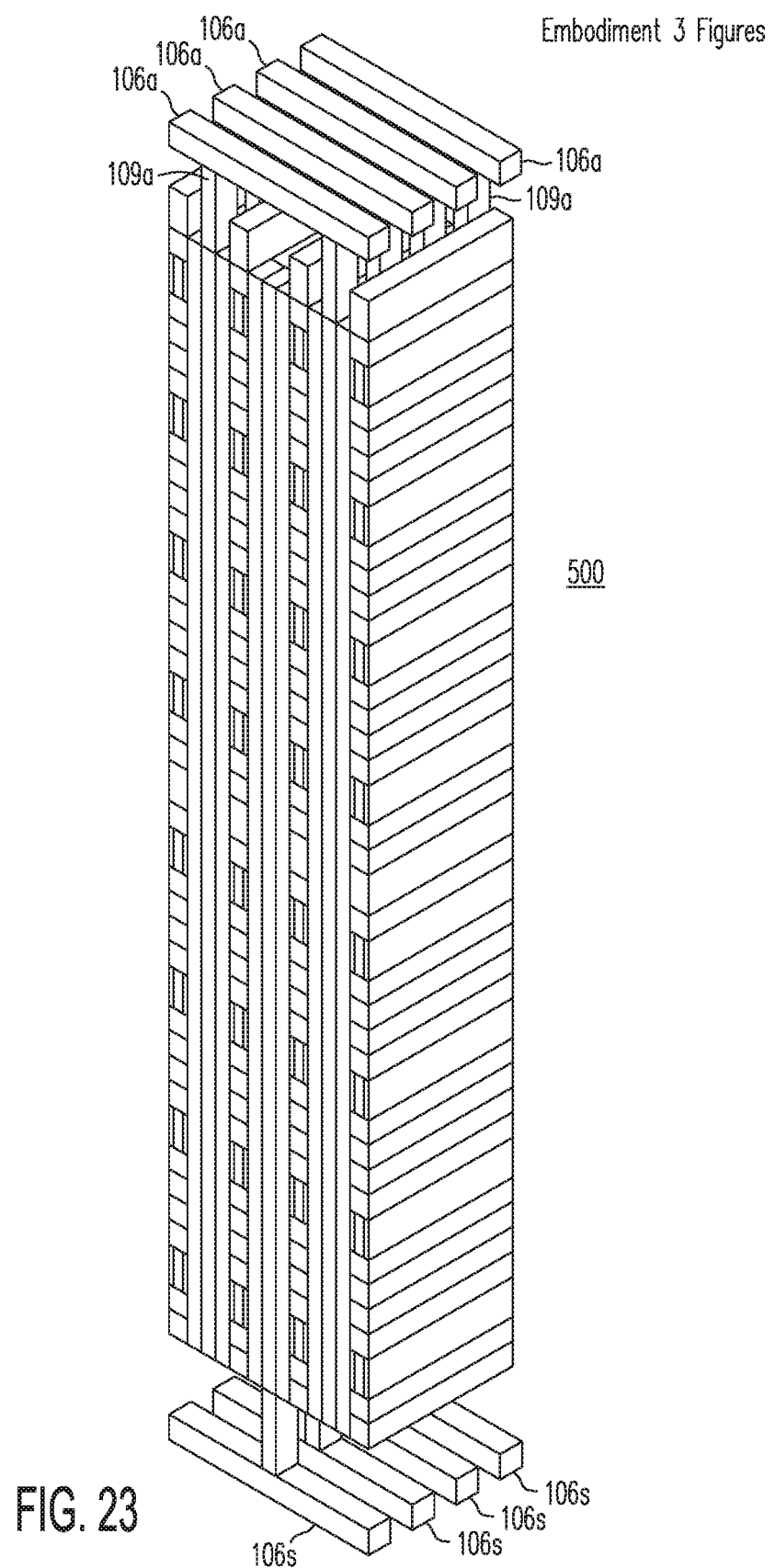
FIG. 23 shows memory structure 500 of FIG. 22, after the remaining material in dielectric layer 509 in every other trench is removed completely and after formation of the storage layers and the word lines in the removed dielectric sublayer.

The remaining portions of dielectric layer 509 in every other trench are then removed completely to allow formation of storage layer 335 and word line layer 336 using substantially the same process discussed above. The resulting structure is shown in FIG. 23. The word lines are electrically continuous over the NIN stacks. Patterning and etching of word line layer 336 may then be carried out to form individual local word lines.

When each conductive sublayer (e.g., conductive sublayer 319a and 319b, adjacent source sublayer 303 and drain sublayer 301, respectively) includes two or more materials, the resulting cross section would be similar to that of the conductive sublayers 319a and 319b shown in FIG. 8. The initially deposited material (e.g., liner or barrier material 321) coats three sides of the volume formerly occupied by the SAC4 material, while finally deposited low-resistivity material 322 substantially fills the volume. There may be some minor porosity in the completed conductive material. The removal of the conductive material form the sidewalls of the trenches results in liner or barrier layer 321 being provided as a C-shaped structure, when viewed in cross section as shown in FIG. 8.

Further global word lines 106a may be formed above memory structure 500, with vias 109a dropping down to effectuate contact the local word lines. In FIG. 23, global word lines 106s that are formed below memory structure 500 are also shown, which care formed prior to forming memory structure 500.

Although FIGS. 17-23 illustrate fabricated NIN stacks in two portions, NIN stacks fabricated from more than two portions (e.g., 2, 3, 4 or more) are possible by repeating the steps discussed in conjunction with FIGS. 17-23.

In this detailed description, when a storage layer (e.g. an ONO layer) is first formed for a first group of memory cells (e.g., the memory cells of portion 1 or even the memory cells on one side of an active strip) and, subsequently, another storage layer is formed for a second group of memory cells (e.g., the memory cells of portion 2 or the memory cells on the opposite side of the active strip), the storage layer for the first group of memory cells need not be the same as the storage layer for the second group of memory cells. For example, one storage layer may be a relatively thick tunnel dielectric layer (e.g., 5 nanometers or more) to provide a long data retention, albeit slower writes and more limited write/erase cycle endurance, while the other storage layer may be a relatively thin tunnel dielectric layer (e.g., 3 nanometers or less) to provide a short data retention, but faster writes and higher write/erase cycle endurance. As result two or more types of memory cells may be provided in the same memory structure.

Embodiment 4

In the Copending Application, memory cells may be provided only on one side of an NIN stack, but not the other side. Such an arrangement facilities fabrication and eliminates the "cell disturb" problem possible in side-by-side memory cells of the same NIN stack. In this example, after memory cell fabrication is substantially complete (e.g., prior to metal replacement of a sacrificial material, e.g., SAC4 material) and the memory cells are effectively "sealed," the metal replacement step may then take place to introduce the conductive sublayer into the active layers in each NIN stack, as discussed in conjunction with Embodiment 2 above. In this manner, the deleterious risk of metal contamination in the memory cells is reduced.

Figure 24:
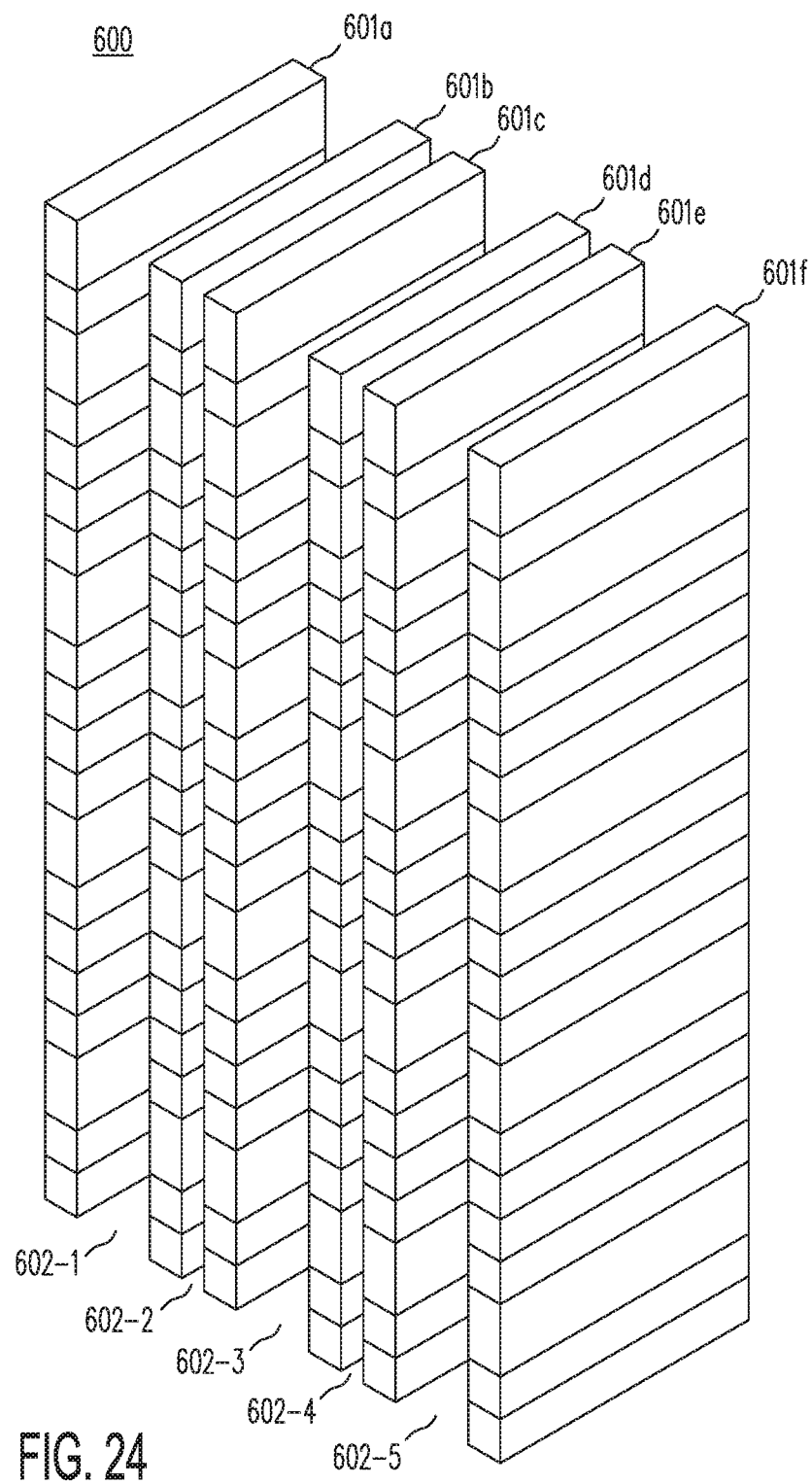
FIG. 24 shows memory structure 600 including six NIN stacks 601a, 601b, 601c, 601d, 601e and 601f separated by trenches 602-1, 602-2, 602-3, 602-4, and 602-5 of different widths.
Figure 25:
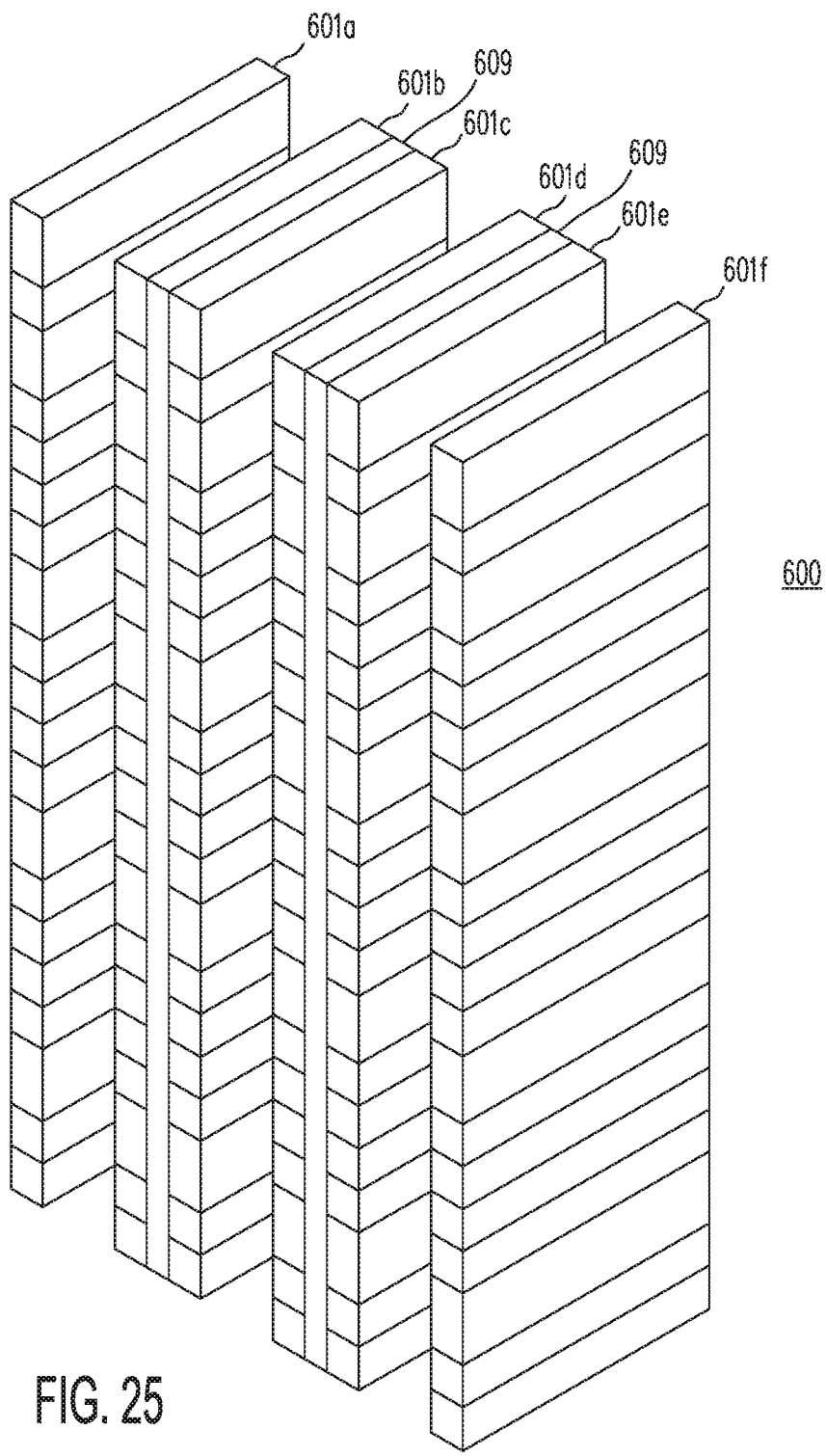
FIG. 25 shows memory structure 600 of FIG. 24, after dielectric material 609 is deposited and patterned to allow its removed from the tops of the NIN stacks and from wide trenches 602-1, 602-3 and 602-5, leaving dielectric material 609 only in narrow trenches 602-2 and 602-4.
Figure 26:
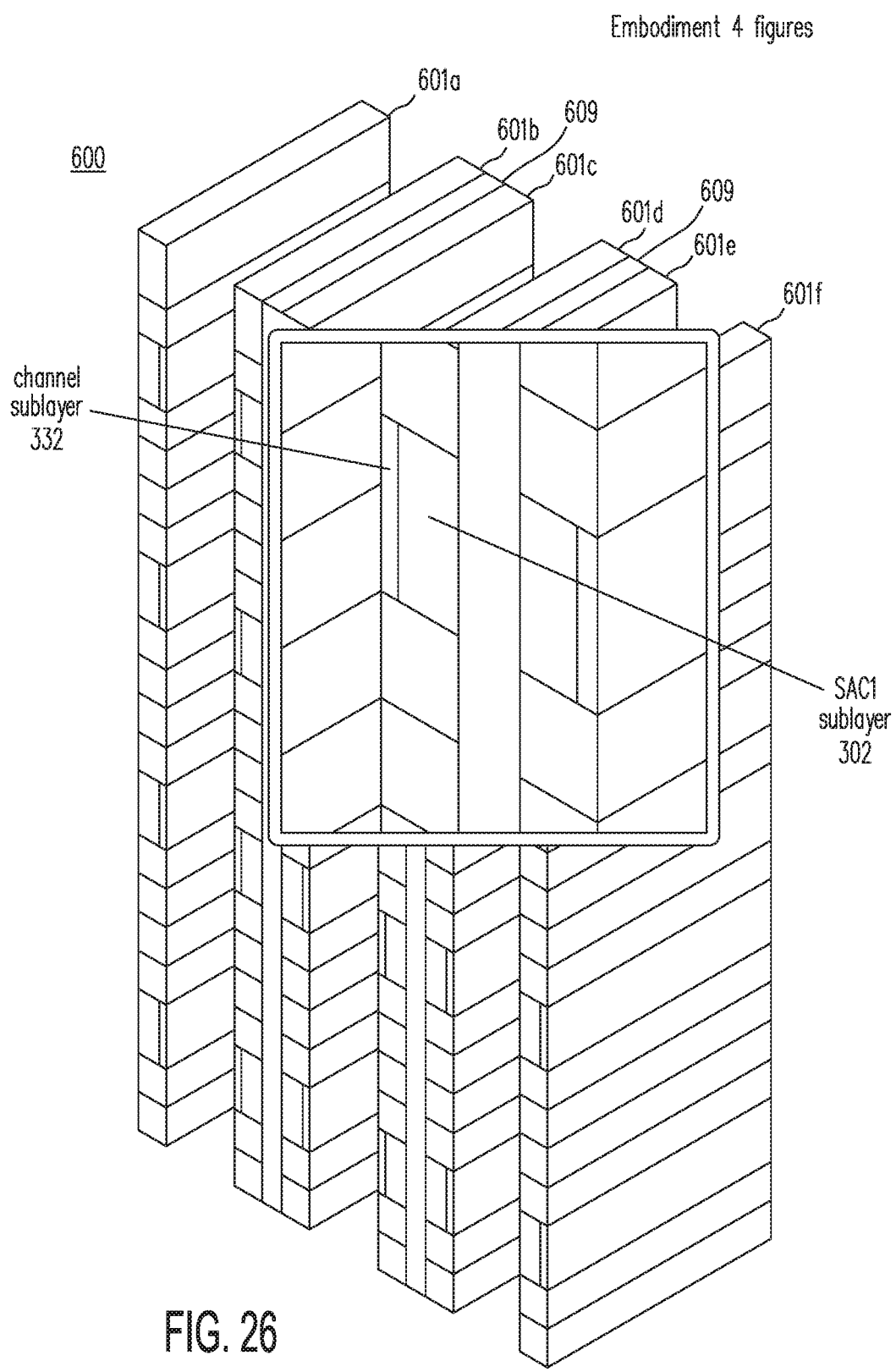
FIG. 26 shows memory structure 600 of FIG. 25, after partial removal of the SAC1 material-containing first sacrificial sublayer 302 and deposition of channel layer 332 to fill the recessed cavities from removing the SAC1 material from first sacrificial layer 302.
Figure 27:
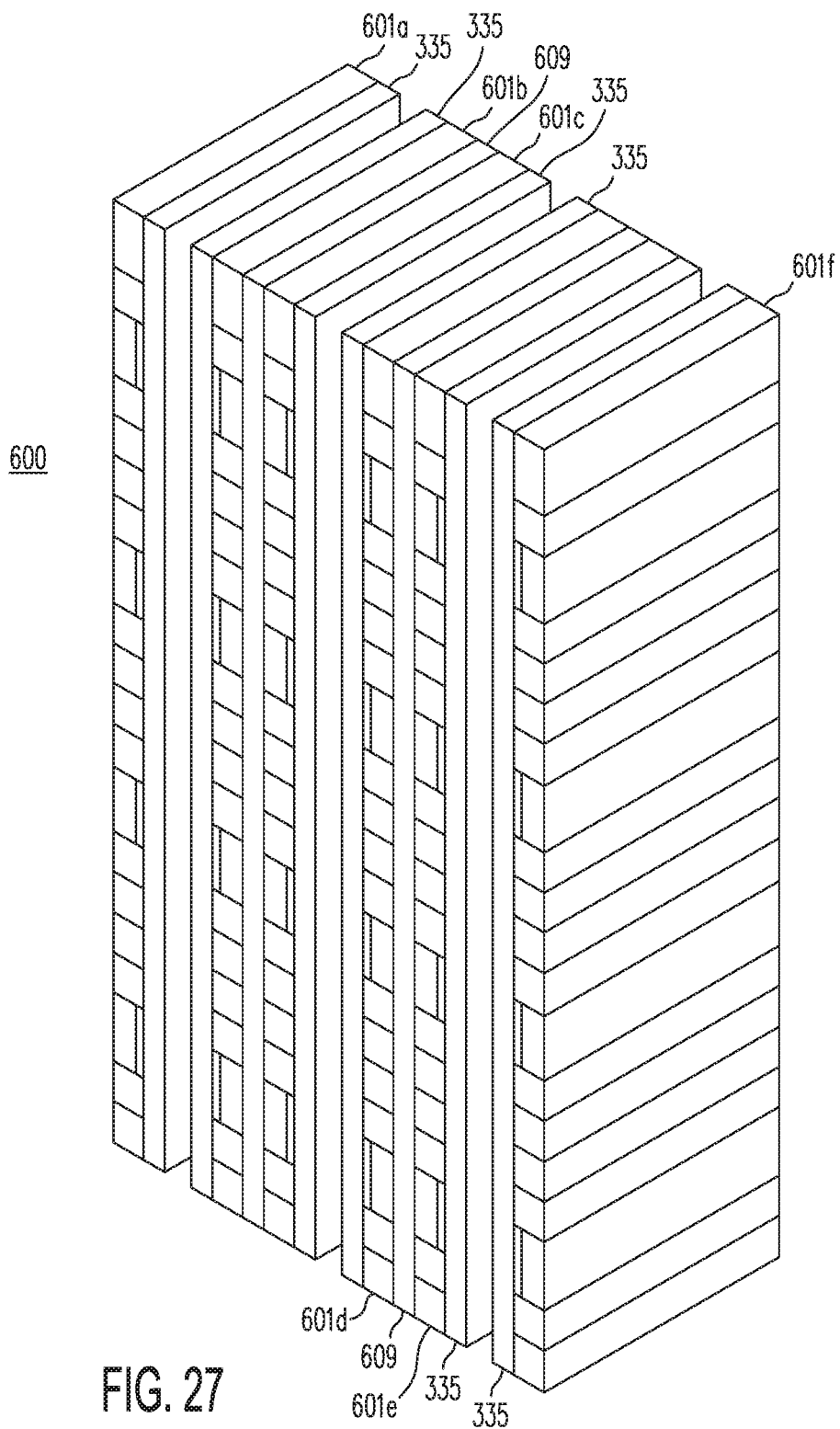
FIG. 27 shows memory structure 600 of FIG. 26, after deposition of storage sublayer 335 (e.g., an ONO sublayer) and selective removed by anisotropic etching from both the top of the NIN stacks and the floor of trenches.
Figure 28:
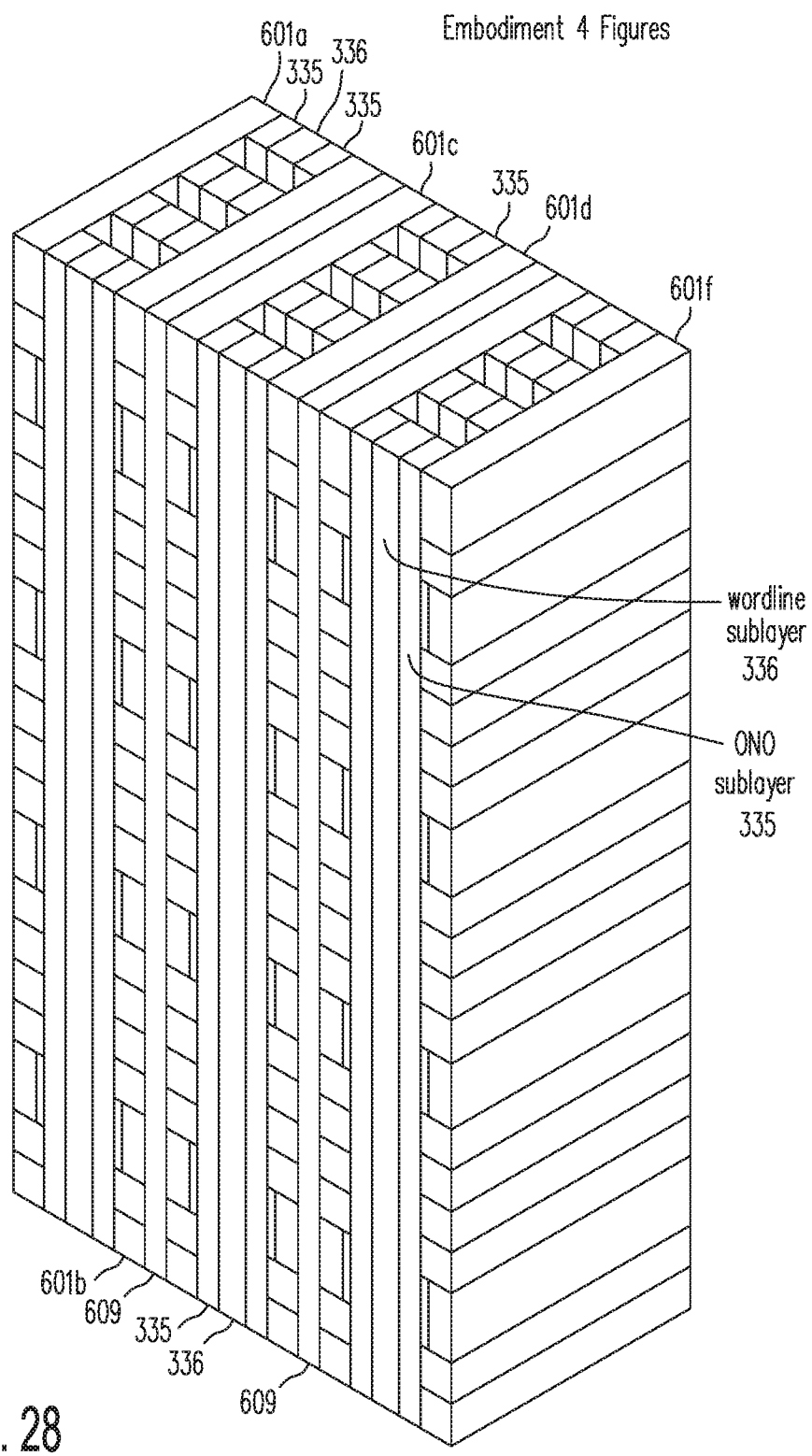
FIG. 28 shows memory structure 600 of FIG. 27, after a conductive material is deposited to form word line layer 336, which is then patterned and etched to form word lines.

FIG. 24 show memory structure 600, including six NIN stacks 601a-601f, separated by trenches 602-1, 602-2, 602-3, 602-4, and 602-5 of different widths. In FIG. 24, in particular, every other trench (i.e., trench 602-1, 602-3 or 602-5) is wider than the trenches (i.e., trenches 602-2 and 602-4) on its two sides. Each wider trench separates the trench-facing memory cells in the NIN stacks bordering the trench. No memory cells are provided on the sides of the NIN stacks facing the narrow trenches. Dielectric material 609 is then deposited in the trenches over the NIN stacks. Dielectric material 609 is then patterned to allow removal of the dielectric material from the tops of the NIN stacks and from the wide trenches 602-1, 602-3 and 602-5, leaving dielectric material 609 only in narrow trenches 602-2 and 602-4. Resulting memory structure 600 is shown in FIG. 25. Recessed channel sublayers are then provided by partial removal of the SAC1 material-containing sublayers (e.g., first sacrificial sublayer 302) from the active layers exposed in the sidewalls of wide trenches 602-1, 602-3 and 602-5, followed by deposition of channel layer 332, using the process steps described above. Resulting structure 600 is shown in FIG. 26. Storage sublayer 335 (e.g., an ONO sublayer) is then deposited and removed by anisotropic etching from both the top of the NIN stacks and the floor of trenches to form memory structure 600 of FIG. 27. Conductive material is then deposited to form word line layer 336 and patterned to form the local word lines, as shown in FIG. 28. Any storage material in exposed portions of storage sublayer 335 not protected by the word lines in word line sublayer 336 may also be removed at this time.

Dielectric layer 611 is then deposited over the NIN stacks and into any open trenches. Dielectric layer 611 is then patterned to expose the narrow trenches (e.g., trenches 601-2 and 602-4) and any portions of word line layer 336 over the narrow trenches. The exposed dielectric material 609 in the narrow trenches and the portions of the word line layer 336 over these narrow trenches are then removed by etching.

Figure 29:
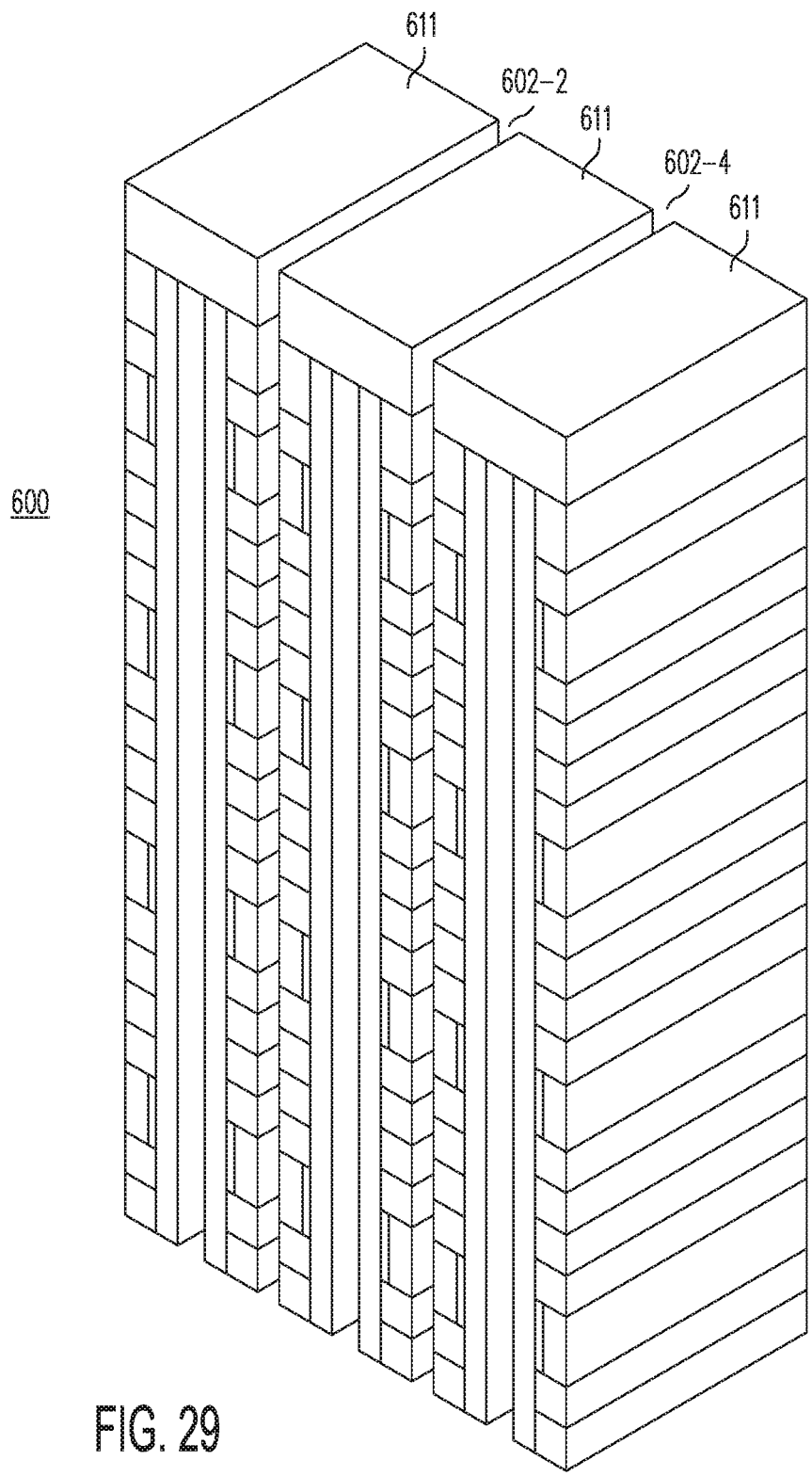
FIG. 29 shows memory structure 600 of FIG. 28, after deposition of conductive sublayers 319a and 319b into the cavities resulting from removal or partial removal of SAC4 material-containing second sacrificial sublayers 304a and 304b, and after excess conductive material on the sidewalls of the trenches and the top of the NIN stacks is then removed, leaving conductive sublayers 319a and 319b filling the cavities.

SAC4 material-containing sublayers (e.g., second sacrificial sublayers 304a and 304b) in the active layers are now exposed in the narrow trenches to allow removal by etching. In this example, the SAC4 material-containing sublayers are not completely removed—e.g., a portion of second sacrificial sublayers 304a and 304b o the far side of the exposed portion (e.g., adjacent to storage sublayer 335) remains. In other examples, second sacrificial sublayer 304a and 304b may be completely removed. Conductive sublayers (e.g., conductive sublayers 319a and 319b, adjacent source and drain sublayers 303 and 301, respectively) are then deposited into the cavities resulting from removing or partially removing the SAC4 material. Excess material from conductive sublayers 319a and 319b on the sidewalls of the trenches and at the top of the NIN stacks is then removed, leaving conductive sublayers 319a and 319b filling the cavities, as shown in FIG. 29.

Figure 30:
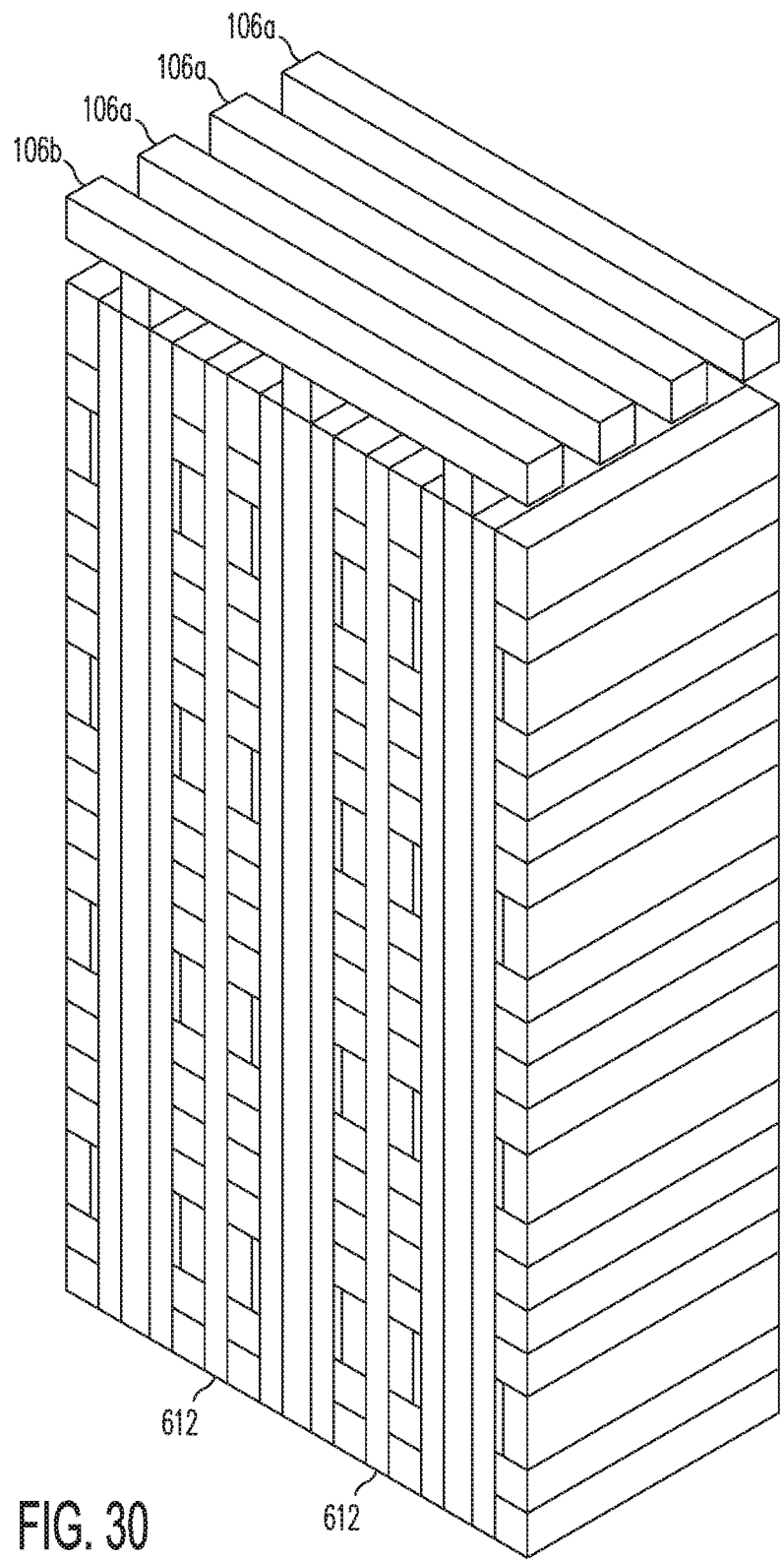
FIG. 30 shows memory structure 600 of FIG. 29, after dielectric material 612 is deposited to fill narrow trenches 602-2 and 602-4 and recessed by etching to below the lower surface of the portions of word line layer 336 that sit on top of the NIN stacks, and after global word lines 106a are formed above the NIN stacks using, for example, a dual damascene process.

Dielectric layer 612 is then deposited to fill the narrow trenches (e.g., trenches 602-2 and 602-4) and recessed by etching to below the lower surface of the portions of word line layer 336 that sit on top of the NIN stacks. (Alternatively, narrow trenches 602-2 and 602-4 may be left unfilled to serve as air-gap isolation between adjacent NIN stacks; in many application, air-gap isolation is preferred.) Global word lines 106a can then be formed above the NIN stacks using, for example, a dual damascene process, as shown in FIG. 30. (Although not shown in FIG. 30, global word lines 106s may also be provided from below the NIN stacks, if desired, in the same manner as discussed above in this detailed description with respect to FIG. 23.)

Embodiment 5

In this embodiment, struts which extend the full height of the NIN stacks are fabricated by a via etch and fill method. In addition to an example discussed above in conjunction with FIG. 12A (Embodiment 1) above, struts extending the full height of the NIN stacks are also discussed in the following example which, unlike the method discussed above in conjunction with FIG. 12A, does not require two trench etches. In the following example, all trenches are patterned and trenched in a single process simultaneously, thereby eliminating possible alignment errors that occur when multiple processes of patterning and etching are used.

Figure 31:
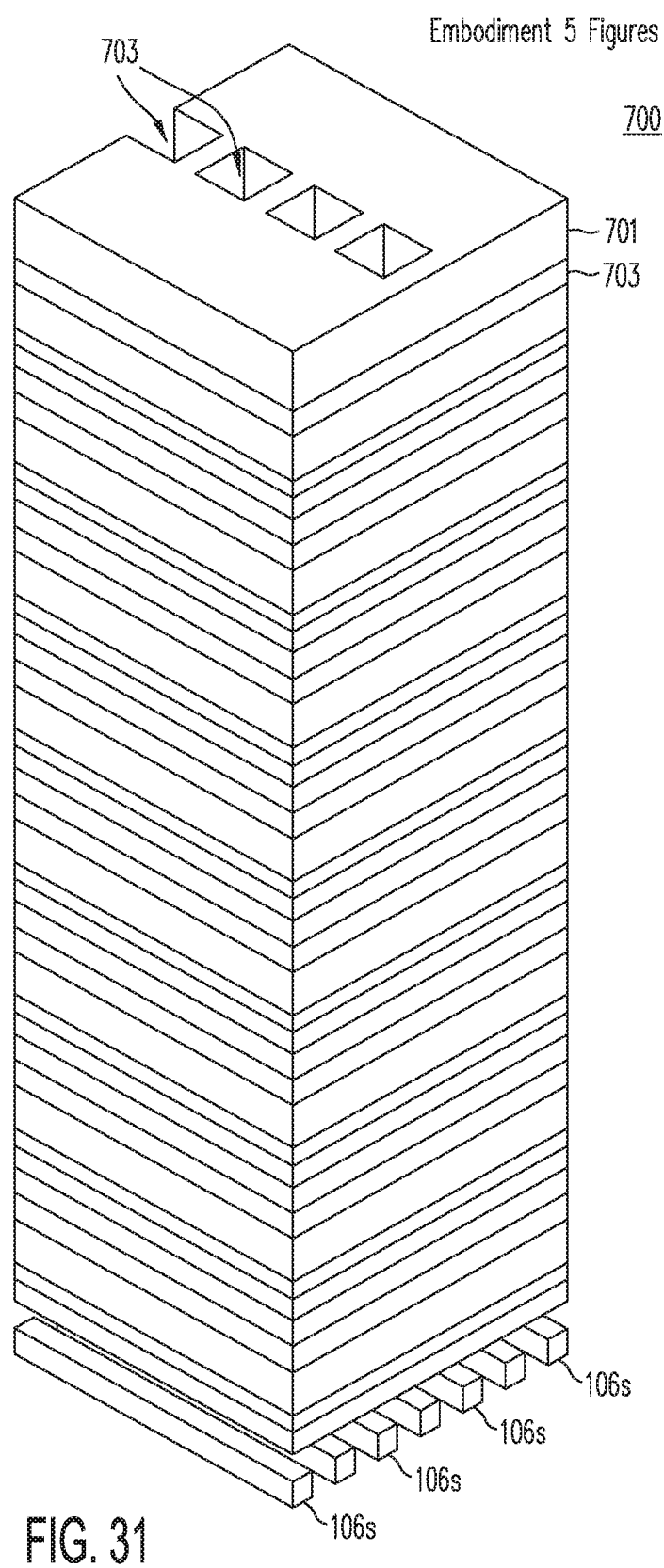
FIG. 31 shows memory structure 700 including eight active layers; the active layers are fabricated on top insulation layer 720 (not shown; e.g., $SiO_2$) which isolates the bottom active layer from conductors 106s underneath serving as global word lines.
Figure 32:
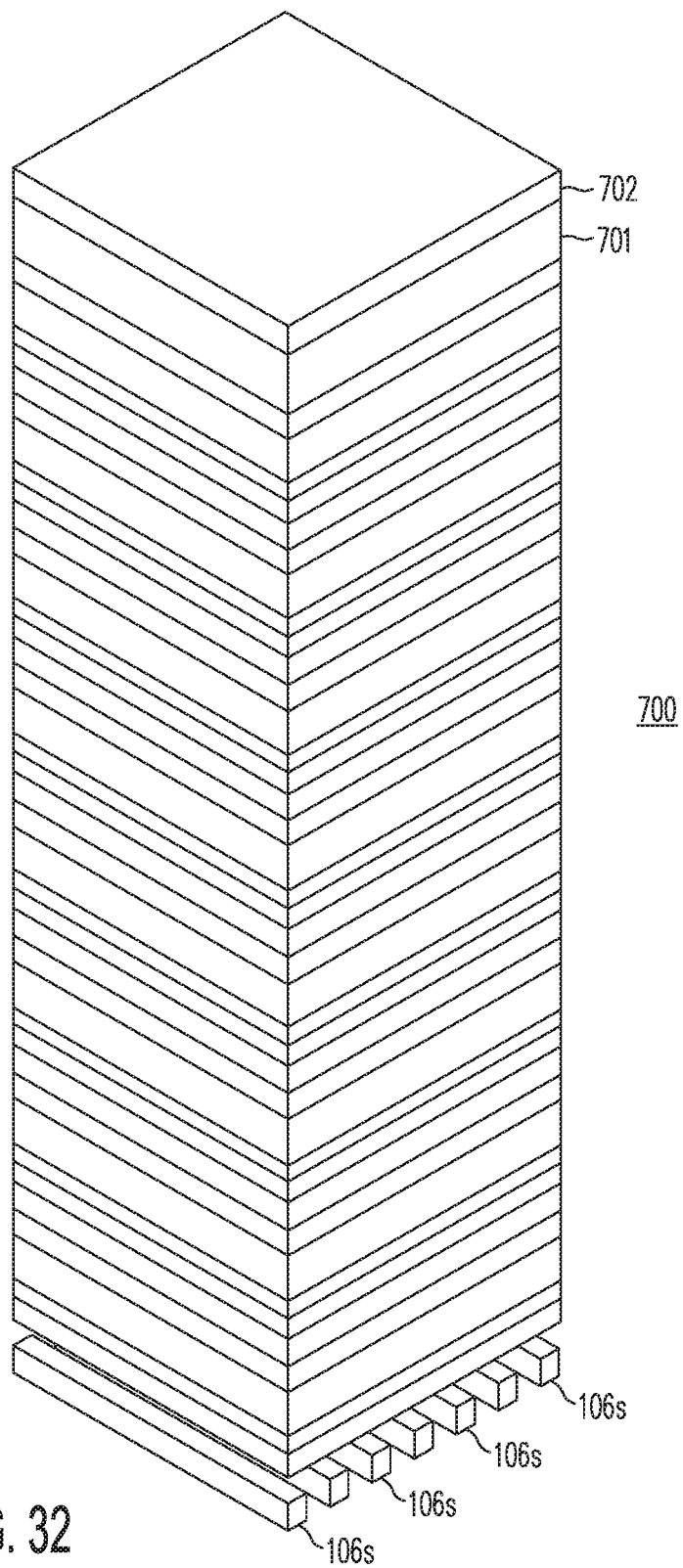
FIG. 32 shows memory structure 700 of FIG. 31, after second hard mask layer 702 is deposited over the entire memory structure 700.
Figure 33:
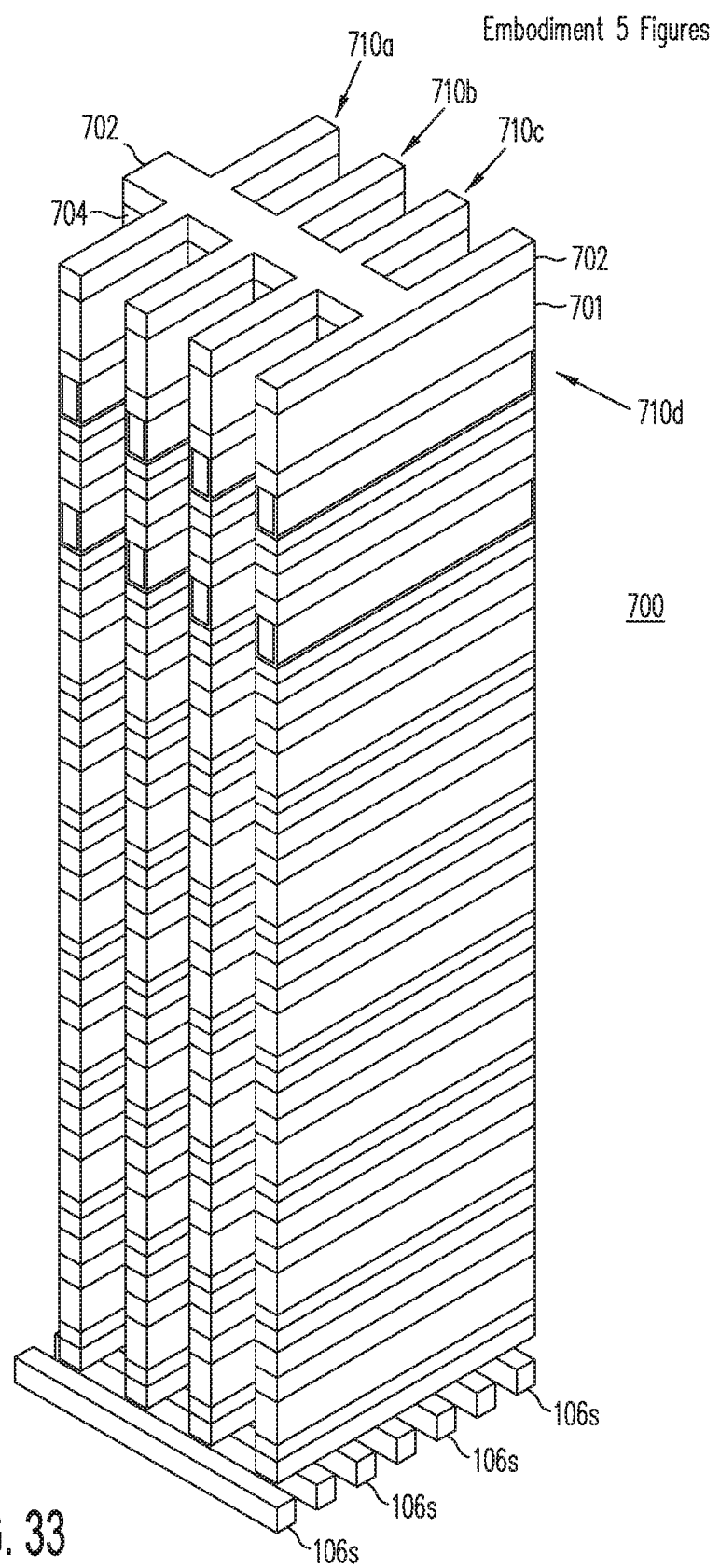
FIG. 33 shows memory structure 700 of FIG. 32, after trenches are formed by patterning and etching into the entire length of the active layers, so as to form connected NIN stacks 710a, 710b, 710c and 710d.

FIG. 31 shows memory structure 700 including eight active layers; the active layers are fabricated on top insulation layer 720 (e.g., SiO$_2$) which isolates the bottom active layer from conductors 106s underneath serving as global word lines. Hard mask layer 701 (e.g., SiN, ILD or another suitable material) may be provided on top of the active layers. In memory structure 700 of FIG. 31, vias 703 that extend the entire height of hard mask layer 701 and the eight active layers are patterned and etched. Each of vias 703 has a width that is substantially the width of a trench between two NIN stacks. Each of vias 703 marks the location of a trench to be formed, with adjacent trenches to be formed separated by a distance substantially equal to the width of a NIN stack to be formed. Vias 703 in adjacent trenches to be formed may be staggered in position relative to each other. Vias 703 may then be filled with dielectric material 704 (e.g., SiO$_2$) using, for example, a chemical vapor deposition (CVD) process, followed by removal from the top of hard mask layer 701, so that dielectric material 704 forms vertical pillars or struts to provide mechanical support to the yet-to-be-formed NIN stacks. Second hard mask layer 702 may be deposited over memory structure 700, as shown in FIG. 32. Trenches are then formed by patterning and etching the entire height of the active layers to form connected NIN stacks 710a, 710b, 710c and 710d, as shown in FIG. 33. The vertical pillars of dielectric material 704 in vias 703 are protected by hard mask layers 701 and 702 from removal, thereby becoming mechanical support pillars or struts connecting NIN stacks 710a, 710b, 710c and 710d. These pillars or struts extend the entire height of the 8 active layers.

Figure 34:
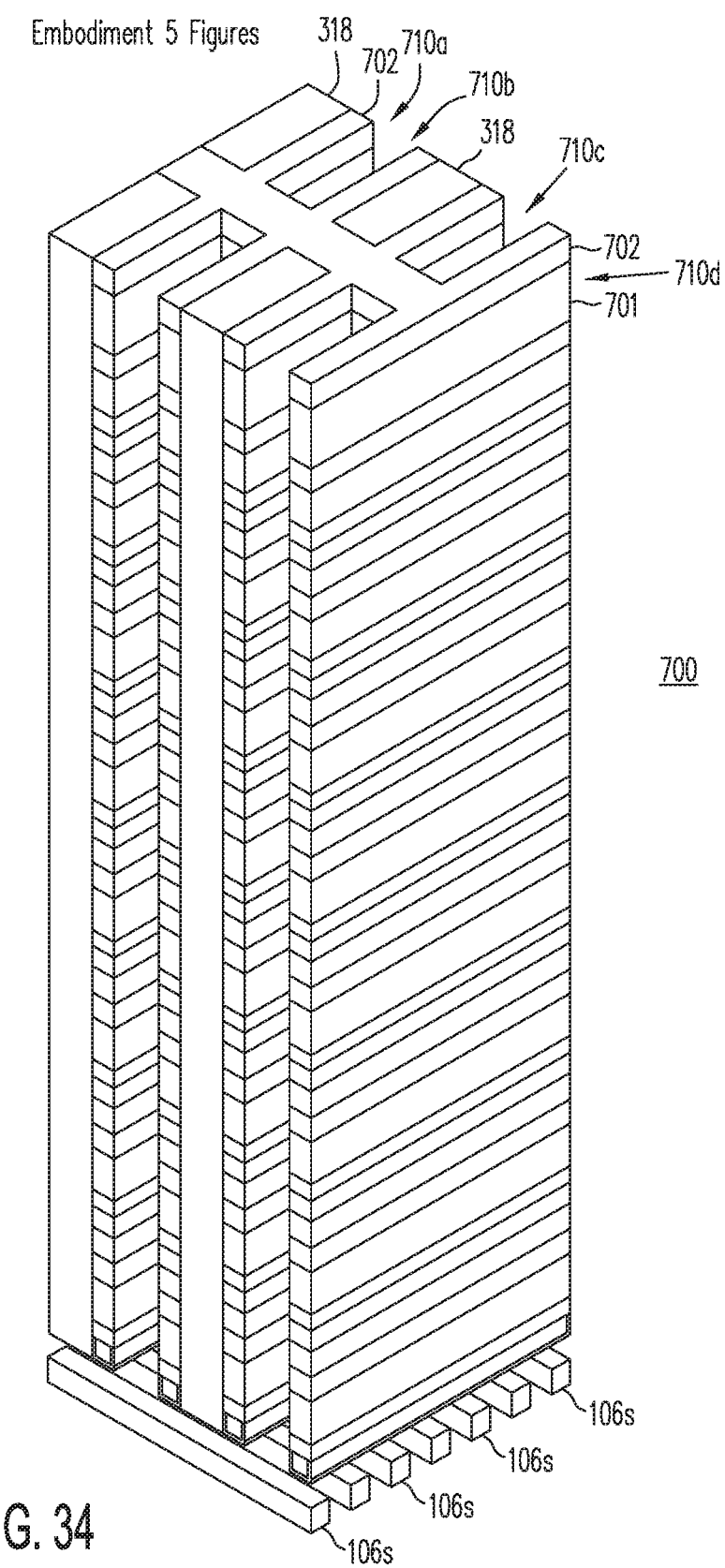
FIG. 34 shows memory structure 700 of FIG. 33, after the trenches are filled with a sacrificial material (SAC2), followed by patterning and removal of the SAC2 material from every other trench.
Figure 35:
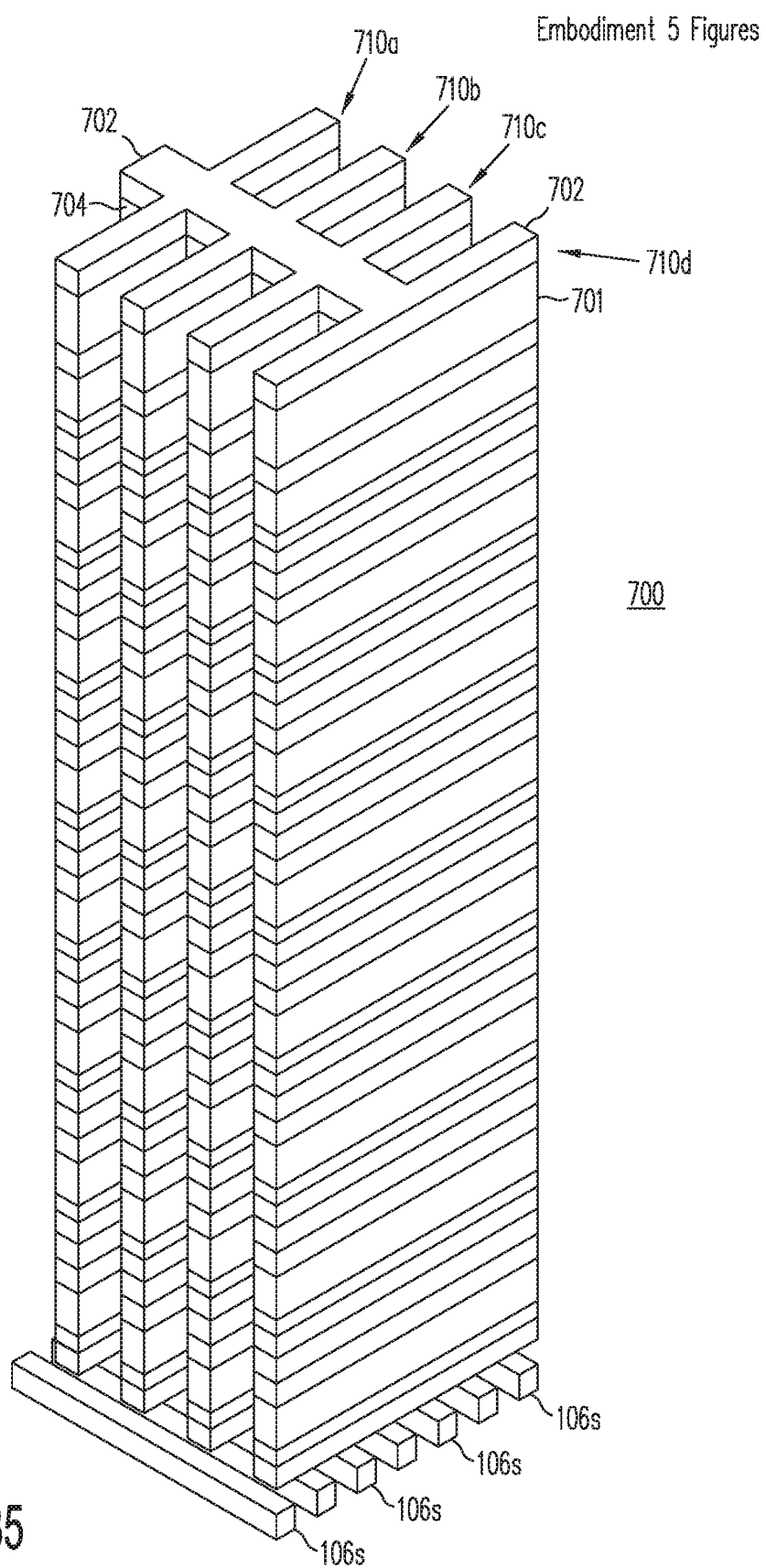
FIG. 35 shows memory structure 700 of FIG. 34, after removal of the exposed SAC4-containing second sacrificial sublayers 304a and 304b by selective etching and replaced by conductive sublayers 319a and 319b; any excess conductive sublayer material on the sidewalls of the trenches and at the top of the NIN stacks may be removed using anisotropic etching, leaving conductive sublayers 319a and 319b substantially only in the cavities resulting from the removal of the SAC4 material from second sacrificial sublayers 304a and 304b.

Next, the trenches are filled with third sacrificial layer 318, which contains the SAC2 material discussed above. Resulting structure 700 is then patterned to remove the SAC2 material from every other trench, such as shown in FIG. 34. Prior to patterning and removal from every other trench, the SAC2 material may be planarized using, for example, a CMP process, so that the SAC2 material that remains in every other trench may be left flush with the upper surface of hard mask layer 702, as shown in FIG. 34. The exposed SAC4 material-containing sublayers 304a and 304b in the active layers may then be removed by selective etching and replaced by corresponding conductive sublayers 319a and 319b. Excess conductive sublayer material on the sidewalls of the trenches and at the top of NIN stacks 710a, 710b, 710c and 710d may be removed using anisotropic etching, leaving conductive sublayers 319a and 319b substantially only in the cavities resulting from the removal of the SAC4 material-containing second sacrificial sublayers 304a and 304b. The remainder SAC2 material in third sacrificial layer 318 may then be removed by selective etching. Resulting structure 700 is shown in FIG. 35. Alternatively, in one variation, the SAC2 material of third sacrificial layer 318 is not introduced in every other trench, relying more heavily on the oxide struts (i.e., the pillars of dielectric material 704) to provide mechanical support for memory structure 700 during removal of the SAC4 material and the metal replacement step.

Figure 36:
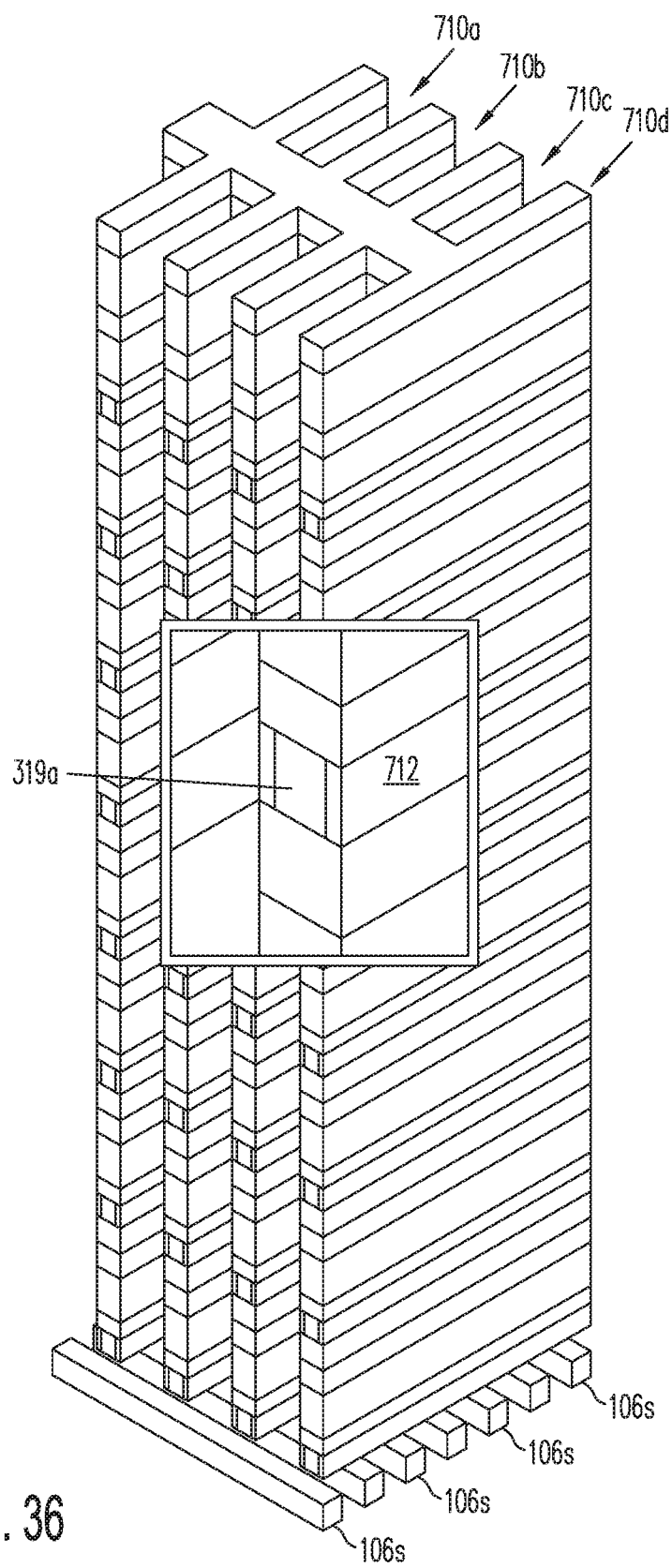
FIG. 36 shows memory structure 700 of FIG. 3r, after conductive sublayers 319a and 319b are sealed by recessing conductive sublayers 319a and 319b from the sidewalls using a selective etch, followed by deposition of a dielectric barrier material into the resulting recesses.

Next, conductive sublayers 319a and 319b are sealed to avoid cross contaminating memory structure 700 in subsequent processing steps. Sealing may be achieved using a selective etch on conductive sublayers 319a and 319b in each active layer to recess conductive sublayers 319a and 319b from the sidewalls. Dielectric barrier material 712 may be deposited into the recesses, followed by removal of the excess dielectric barrier material 712 from the trenches, leaving dielectric barrier material 712 only in the recesses resulting from selectively etching the conductive sublayers 319a and 319b in each active layer, as shown in FIG. 36.

Figure 37:
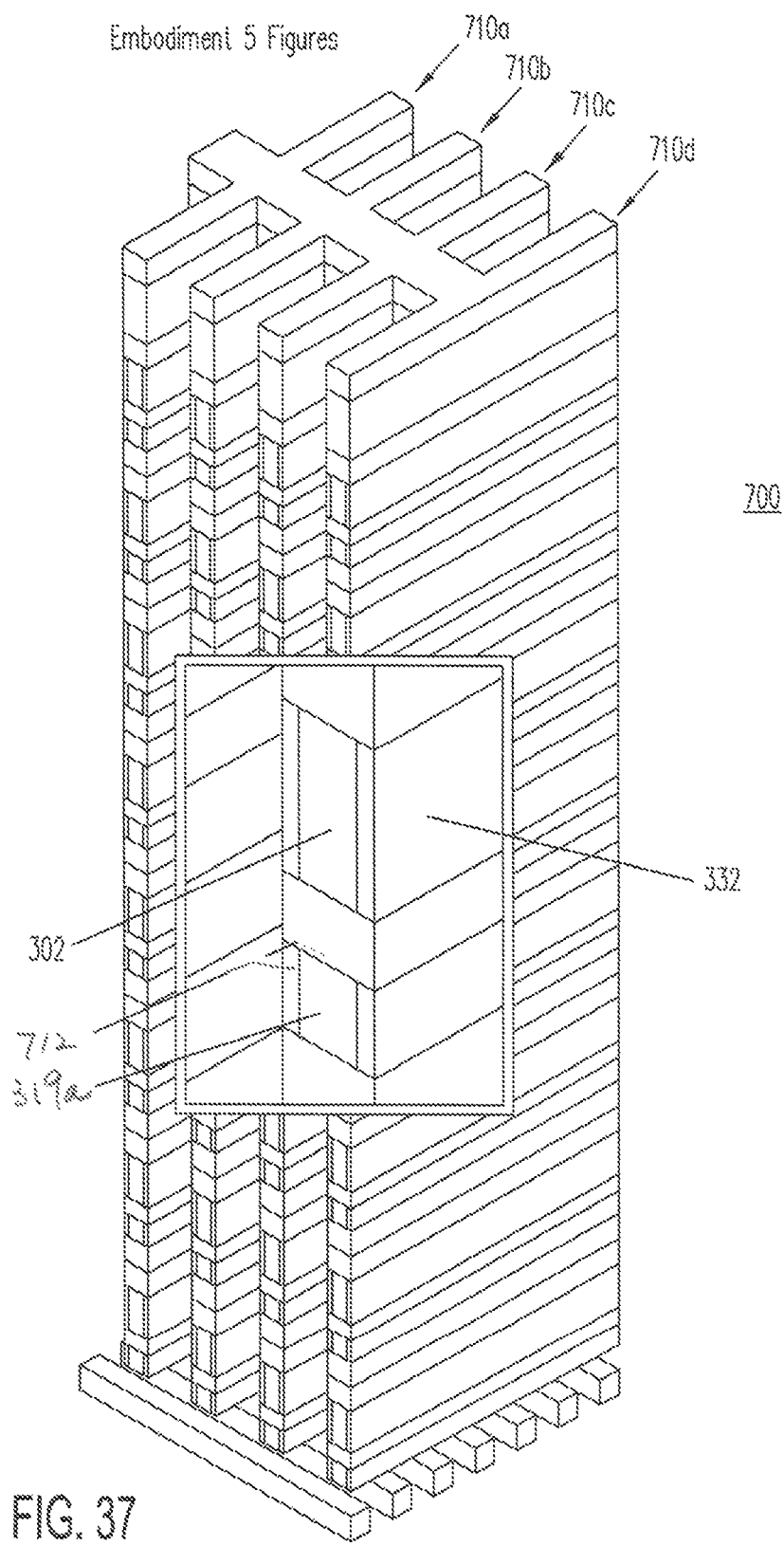
FIG. 37 shows memory structure 700 of FIG. 36, after formation of recessed channel sublayers 332.
Figure 38:
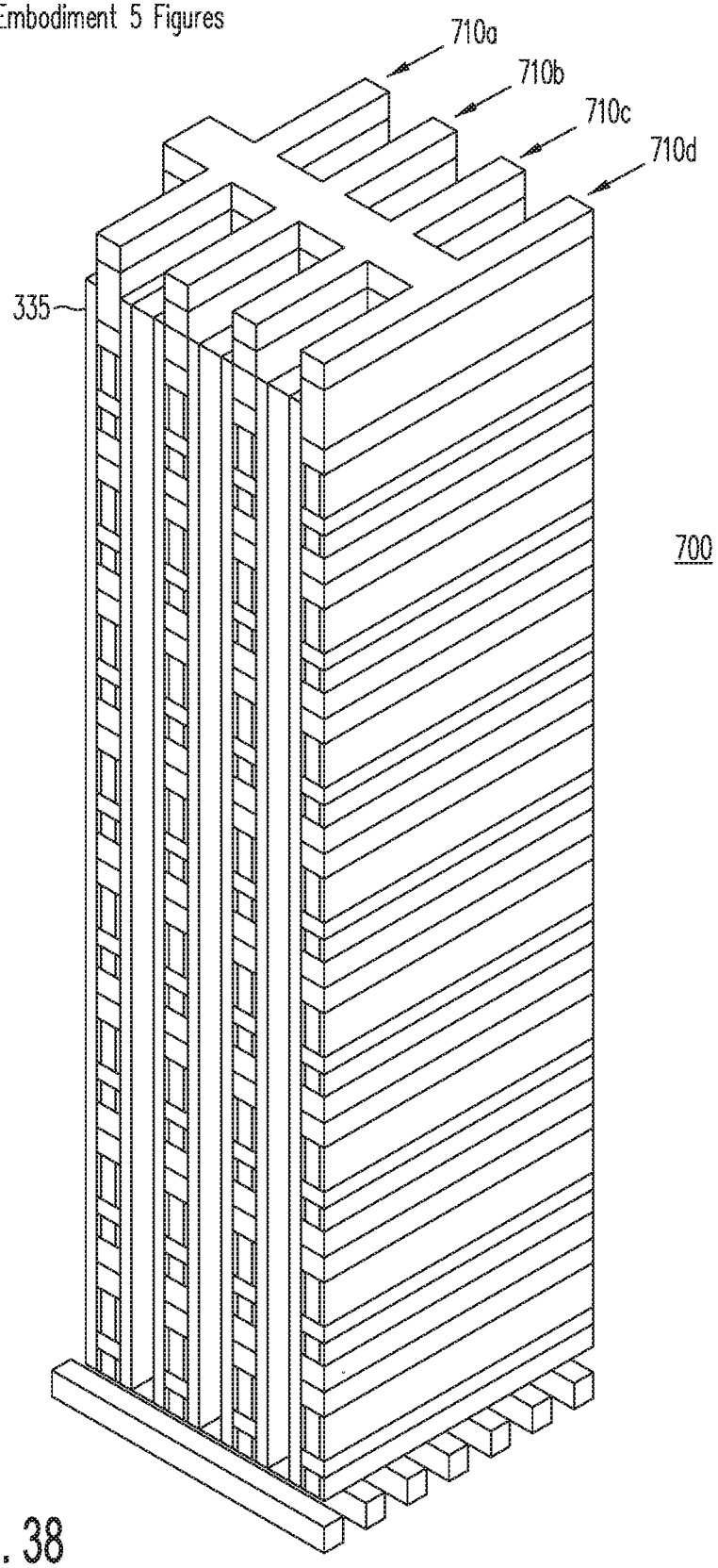
FIG. 38 shows memory structure 700 of FIG. 37, after deposition of storage layer 335 and thin protective dielectric sublayer 713 over the sidewalls of the trenches, and after removal by anisotropic etching of storage layer 335, together with protective dielectric sublayer 713, from the top of the NIN stacks and the floors of the trenches.

Recessed channel formation then proceeds as described above (i.e., partially removing the SAC1 material from first sacrificial sublayer 302, followed by deposition of channel sublayer 332) to provide resulting structure 700 shown in FIG. 37. Storage layer 335 (e.g., an ONO layer) is then formed over the sidewalls of the NIN stacks. Storage layer 335 may further include thin protective dielectric sublayer 713 (not shown; e.g., 1 to 2 nm of Al$_2$O$_3$). Thin protective dielectric sublayer 713 protects storage layer 335 from damage caused by the plasmas used in subsequent processes, yet fortifying blocking dielectric sublayer 714 (not shown) in storage layer 335 by impeding tunneling of electrons during an erase operation. Storage layer 335, together with protective dielectric sublayer 713 are then removed by anisotropic etching from the top of the NIN stacks and the floors of the trenches, as shown in FIG. 38.

Alternatively, protective dielectric sublayer 713 may be provided by a thin 1-5 nm layer of silicon. In some embodiments, protective dielectric layer 713 is not provided. In some embodiments, storage layer 335 and protective dielectric sublayers 713 are removed from neither the top of the NIN stacks nor the floors of the trenches prior to word line formation. In yet other embodiments, storage layers 335 are removed from the floors of only every other trench.

Figure 39:
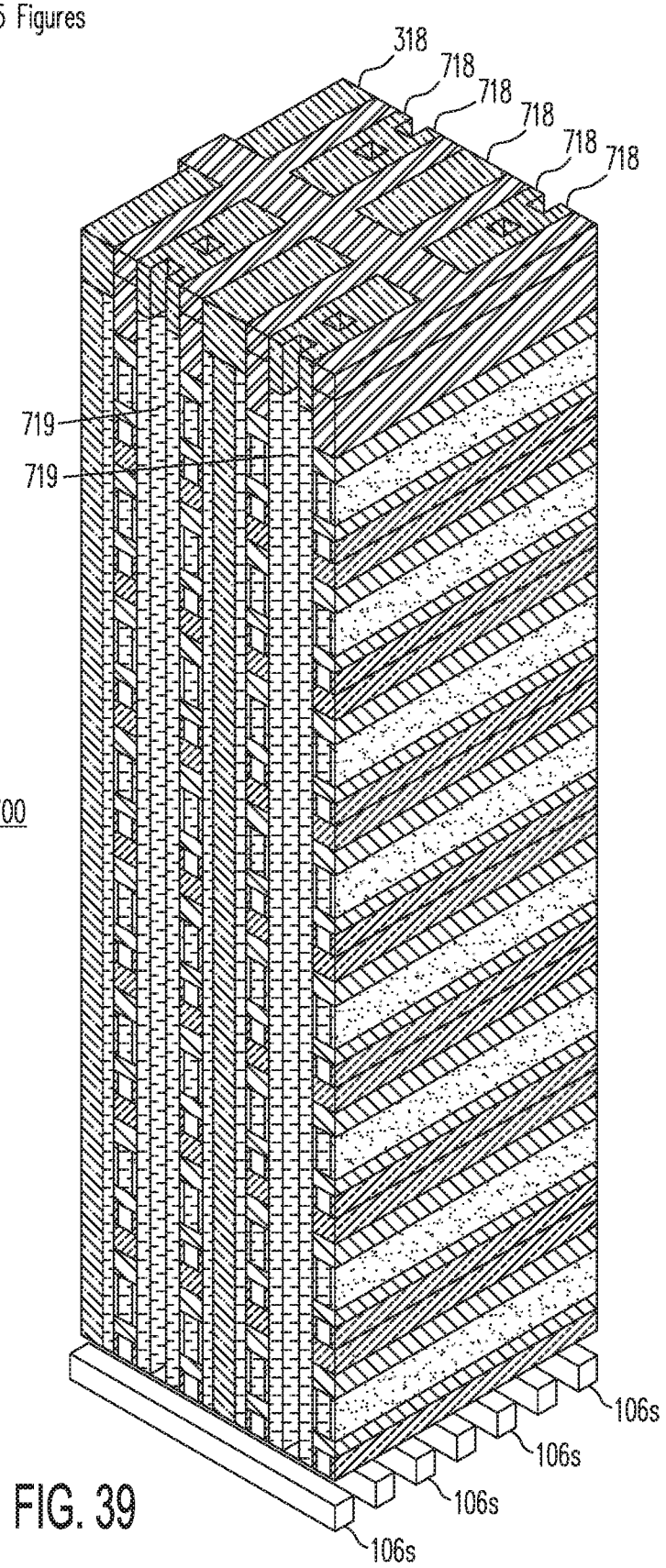
FIG. 39 shows memory structure 700 of FIG. 38, following sacrificial dielectric layer 718 (containing the SAC2 material) is deposited into the trenches and patterned to allow vias 719 to be etched into every other trench; vias 719 extend the full height of the NIN stacks and through the underlying dielectric layer 720 to expose underlying conductors 106s that serve as global word lines.
Figure 40:
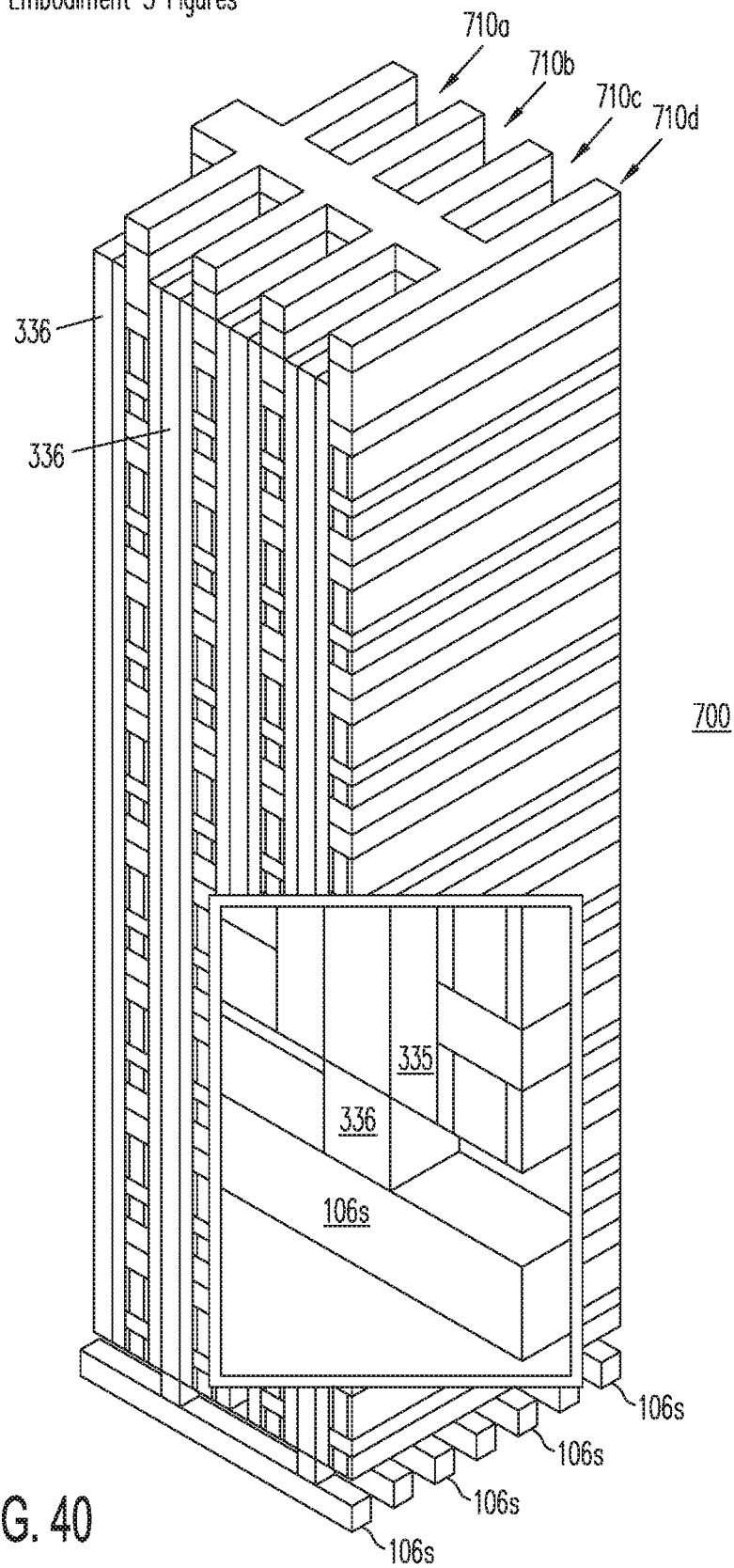
FIG. 40 shows memory structure 700 of FIG. 39, following deposition of a conductive material (conductive layer 336), which is then removed from the top of the NIN stacks and is recessed below hard mask layers 701 and 702 by a selective etch, and following patterning and removal from the exposed areas both conductive layer 336 and also protective dielectric sublayer 713, if desired.
Figure 41:
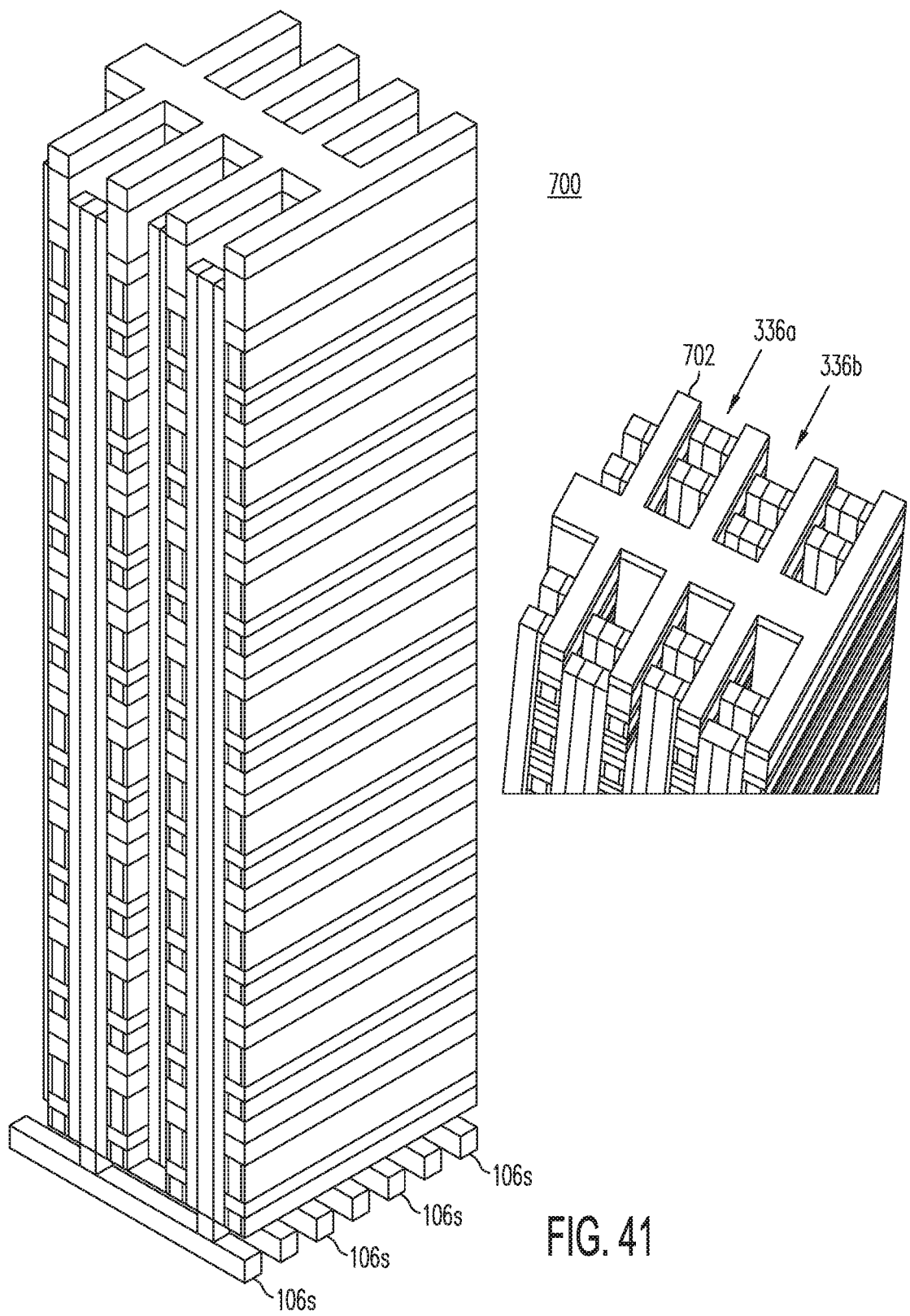
FIG. 41 shows in the inset one case of patterning memory structure 700 of FIG. 40 that results in the local word lines being staggered in position on opposite sides of a NIN stack (i.e. are not directly opposite each other on opposite sides of an NIN stack).

At this point in the process, SAC2 material-containing sacrificial layer 718 may be deposited into the trenches and on top of the NIN stacks. Sacrificial layer 718 may be planarized and removed from hard mask layer 702 at the top of the NIN stacks. Sacrificial layer 718 is then patterned so that vias 719 may be etched into every other trench. Vias 719 extend the full height of the NIN stacks and through underlying dielectric layer 720 to expose the underlying conductors that serve as global word lines, as shown in FIG. 39. Sacrificial layer 718 is then removed from all trenches by selective etching. Conductive layer 336 is then deposited, filling the trenches to allow subsequent formation of local word lines. Conductive layer 336 also fills vias 719 in underlying dielectric layer 720 to contact with the underlying conductors (i.e., global word lines 106s). The conductive material in conducive layer 336 is then removed from the top of the NIN stacks and is recessed below hard mask layer 701 by a selective etch. Conductive layer 336 is then patterned, removing the exposed areas both conductive layer 336 and also protective dielectric sublayer 335, if desired, as shown in FIG. 40. In this manner, the portions of conductive layer 336 protected by the pattern form the local word lines. FIG. 41 shows in the inset one case of patterning the memory structure of FIG. 40 that results in the local word lines being staggered in position on opposite sides of an NIN stack (e.g. word lines in local word line layers 336a and 336b in the inset of FIG. 41 are not directly opposite each other on opposite sides of an NIN stack). In memory structure 700 described above in conjunction with FIGS. 39-41, half of the word lines are connected to the global word lines 106s provided at the bottom of the NIN stacks as a result of vias 719 in dielectric layer 720 underneath the NIN stacks.

Figure 42:
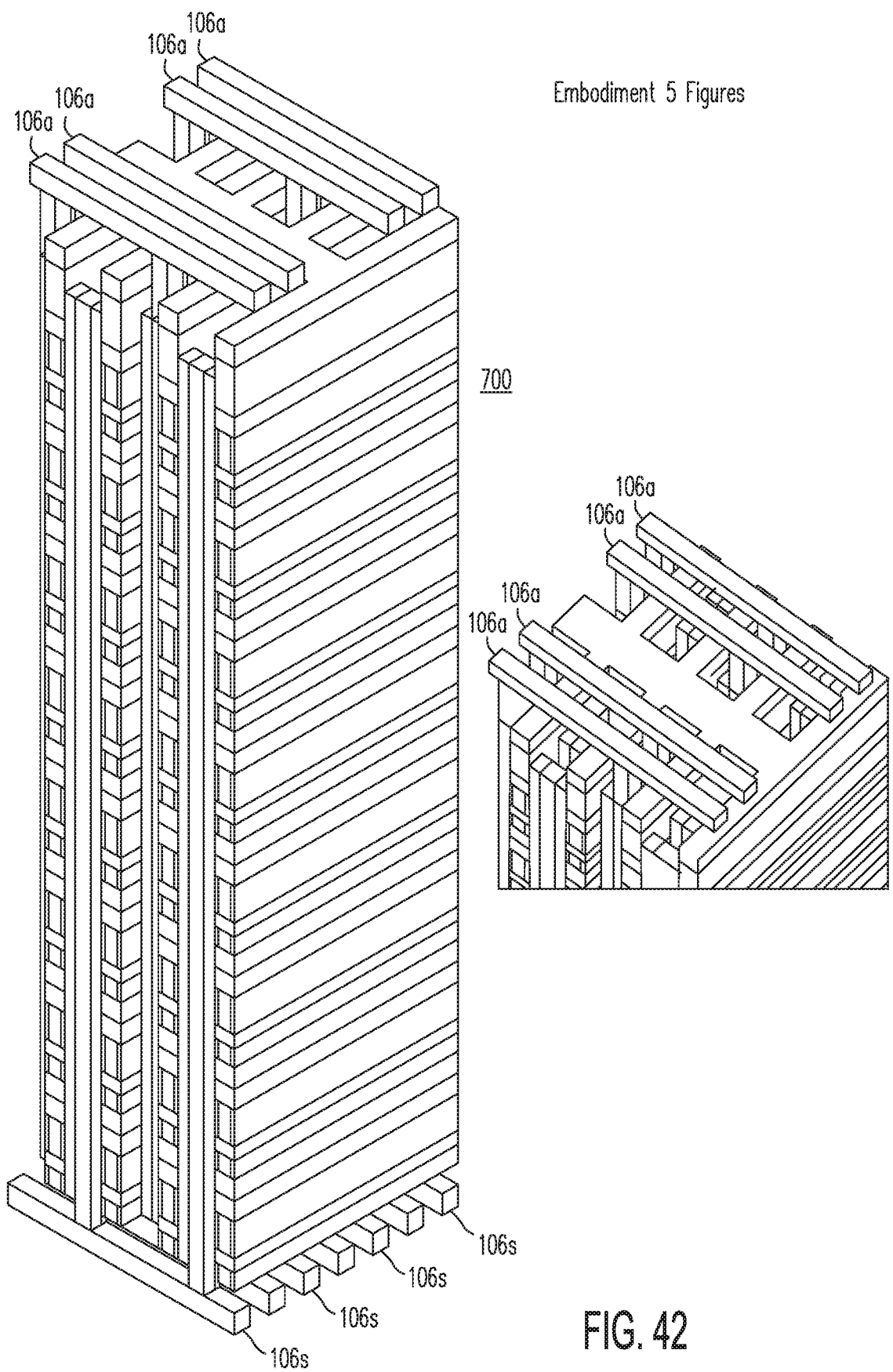
FIG. 42 shows memory structure 700 of FIG. 41, following formation of second layer of global word lines 106a over deposited dielectric layer 721, in which vias are provided to connect second layer of global word lines 106a to the local word lines that are not connected to global word lines 106s underneath the NIN stacks.

Any resulting open trenches as well as the space above the NIN stacks are then filled with deposited dielectric material 721, which may be planarized using a CMP process. Second layer of global word lines 106a may then be formed, after providing vias in the planarized dielectric layer 721 to connect to local word lines in word line layer 336 that are not connected to the global word lines 106s underneath the NIN stacks. Second layer of global word lines 106a may be fabricated, for example, by a dual damascene process. Resulting structure 700 is shown in FIG. 42.

While the descriptions for Embodiments 1-4 above do not discuss the steps of fabricating the global word lines 106a and 106s and their connection by vias with the local word lines in local word line layer 336, the description above in conjunction with Embodiment 5 are applicable for forming global word lines 106a and 106s in conjunction with Embodiments 1-4.

Embodiment 6

In this embodiment, the spacer hard mask approach is used to pattern the trench features in one module, although the etch of the patterned features may occur in two or more different subsequent modules. This embodiment is advantageous in that no misalignment between trenches, as they are all masked simultaneously. By etching the trenches at two or more different times, high aspect ratio features which may lean or topple are avoided until after the larger structures are stabilized by struts. After strut formation, trench etches that result in high aspect ratio features are performed.

Figure 43:
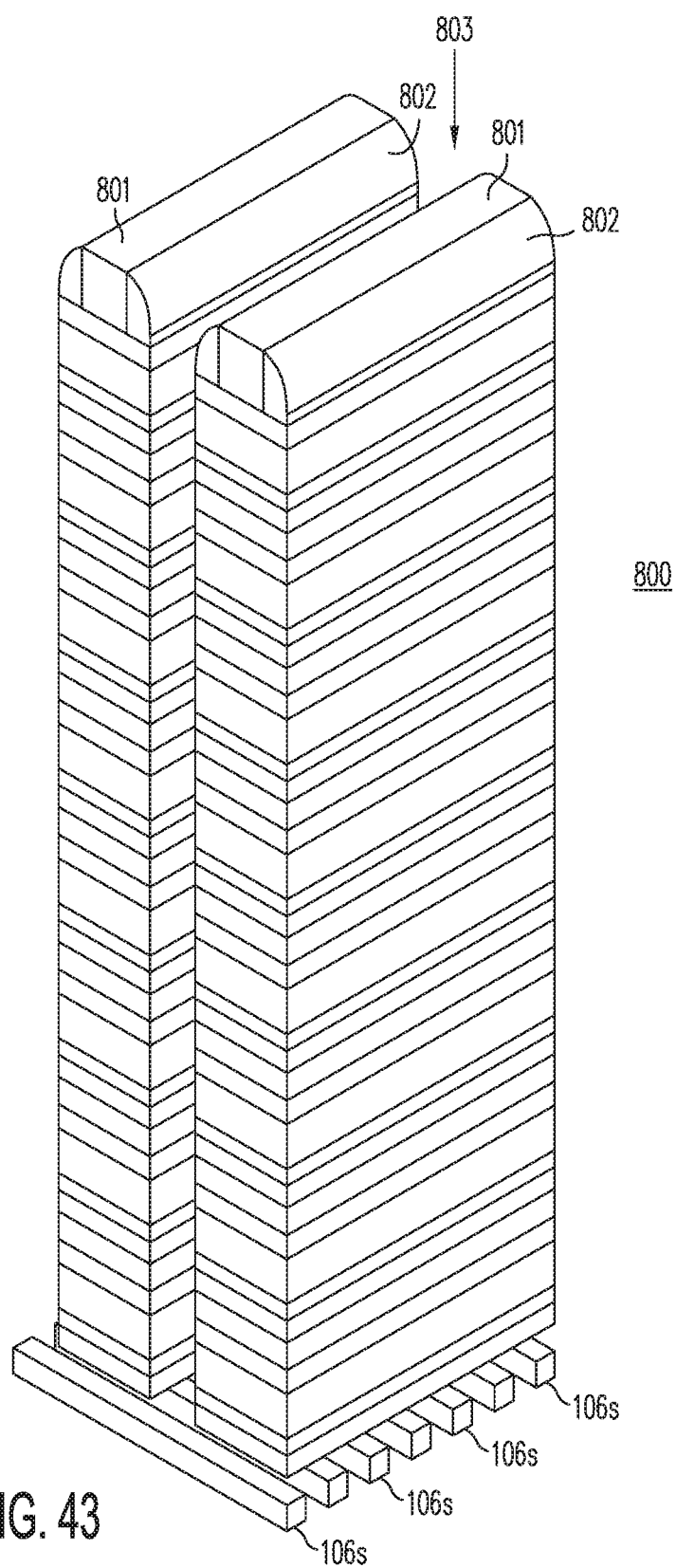
FIG. 43 shows memory structure 800 in which trenches 803 are etched between adjacent hard mask features 801 with spacers 802; hard mask features 803 are large relative to the features to be subsequently formed.
Figure 44:
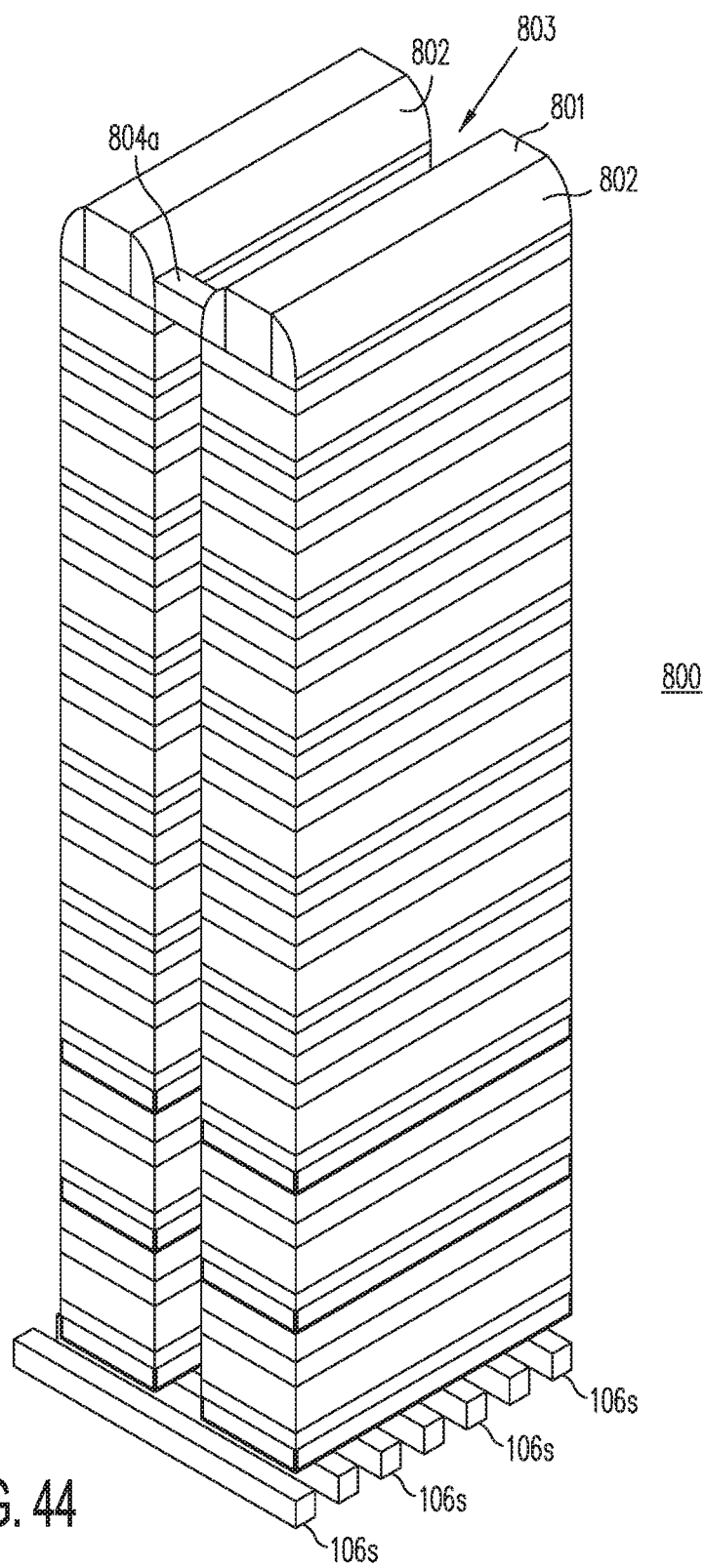
FIG. 44 shows memory structure 800 of FIG. 43, following etching of first set of trenches 803 and following formation of strut layer features 804a connecting spacers 802 of adjacent hard mask features 801.

FIG. 43 shows memory structure 800 in which trenches 803 are etched between adjacent hard mask features 801 with spacers 802 ("sidewall features"); hard mask features 801 are large relative to the features to be subsequently formed. Before etching trenches 802, photoresist is removed from the wafer and only hard mask features 801 and sidewall features 802 are used to pattern subsequent features. First set of trenches 803 are etched using both the larger hard mask features 801 and sidewall features 802 masking one or more non-targeted layers. After first set of trenches 803 have been etched, trenches 803 are filled with a sacrificial material (e.g., SAC2), which is then recessed to allow deposition of strut layer 804. Strut layer 804 is then patterned to form struts connecting adjacent sidewall features 802. The SAC2 material in trenches 803 is then removed, leaving strut features 804a at the top of the trench connecting adjacent side wall features 802 on adjacent hard mask features 801, as shown in FIG. 44.

Figure 45:
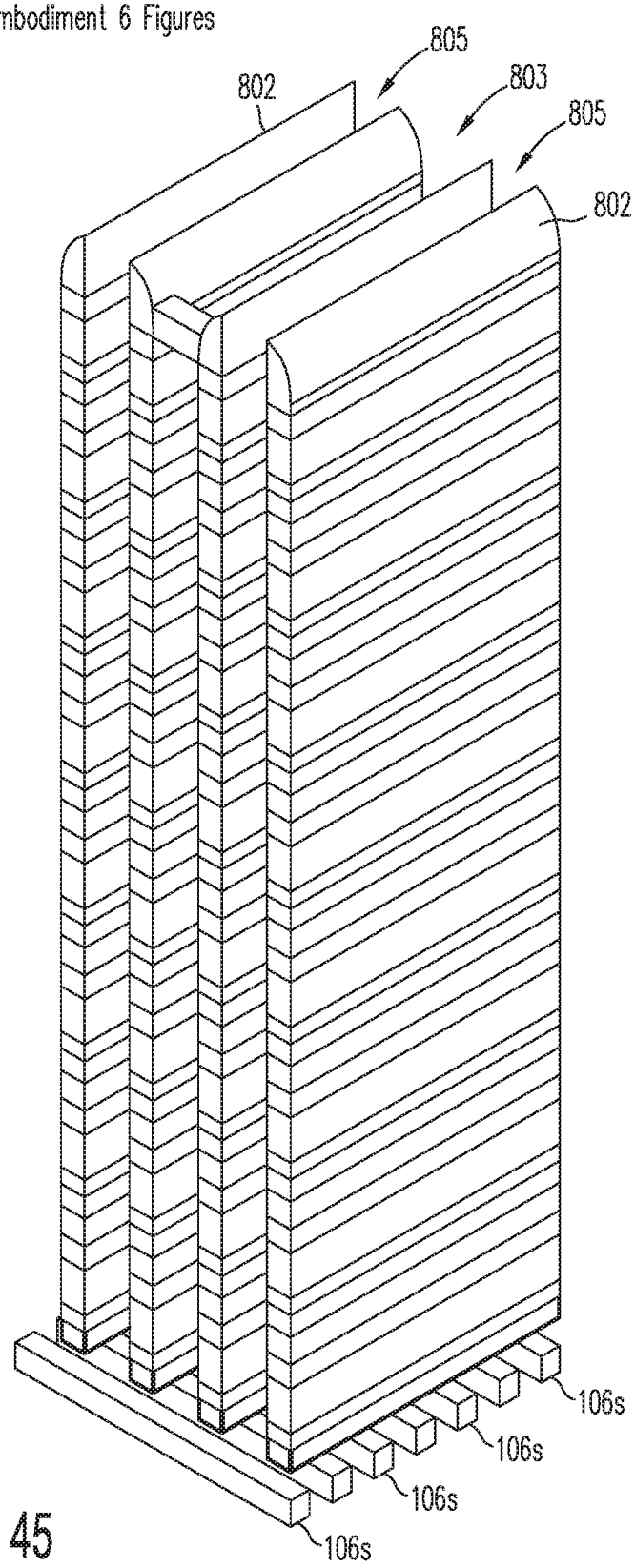
FIG. 45 shows memory structure 800 of FIG. 44, following removal of hard mask features 801 and etching second set of trenches 805 using sidewall features 802 as masks.

Hard mask features 801 are then selectively removed (e.g., by patterning and etching), leaving behind sidewall features 802 and strut features 804a. Second set of trenches 805 are then etched, using sidewall features 802 as masks, as shown in FIG. 45. The rest of the fabrication may proceed using the techniques described above, such as those described in conjunction with Embodiments 1-3 (FIGS. 3-17).

Embodiment 7

In this example, the vertical connections through vias in an ILD layer between the global word lines underneath the memory structure and the local word lines to be formed are fabricated before the memory structure. This embodiment avoids the difficult high aspect ratio via etch of, for example, FIG. 39 discussed above.

Figure 46:
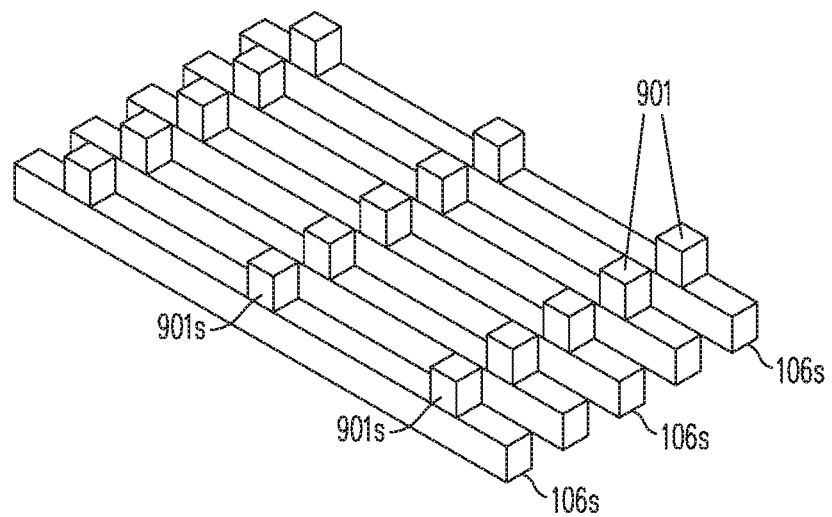
FIG. 46 shows global word lines 106s which include vertical interconnects 901s that are formed thereon.

FIG. 46 shows global word lines 106s which include vertical interconnects 901s that are formed thereon. Global word lines 106s may be fabricated using any suitable technique, e.g., a subtractive metal process or a damascene metal process. Vertical interconnects 901s may be formed out of a conductive material, such as one or more layers of metal (e.g., Ti/TiN/W) or $p^+$ polysilicon. Vertical interconnects 901s may be formed by filling vias in dielectric or insulation layer 720 that is deposited over global word lines 106s and patterned to provide the vias. Any excess conductive material may be removed from the horizontal surfaces by any suitable method (e.g., CMP), leaving only the conductive material in the etched via.

Figure 47:
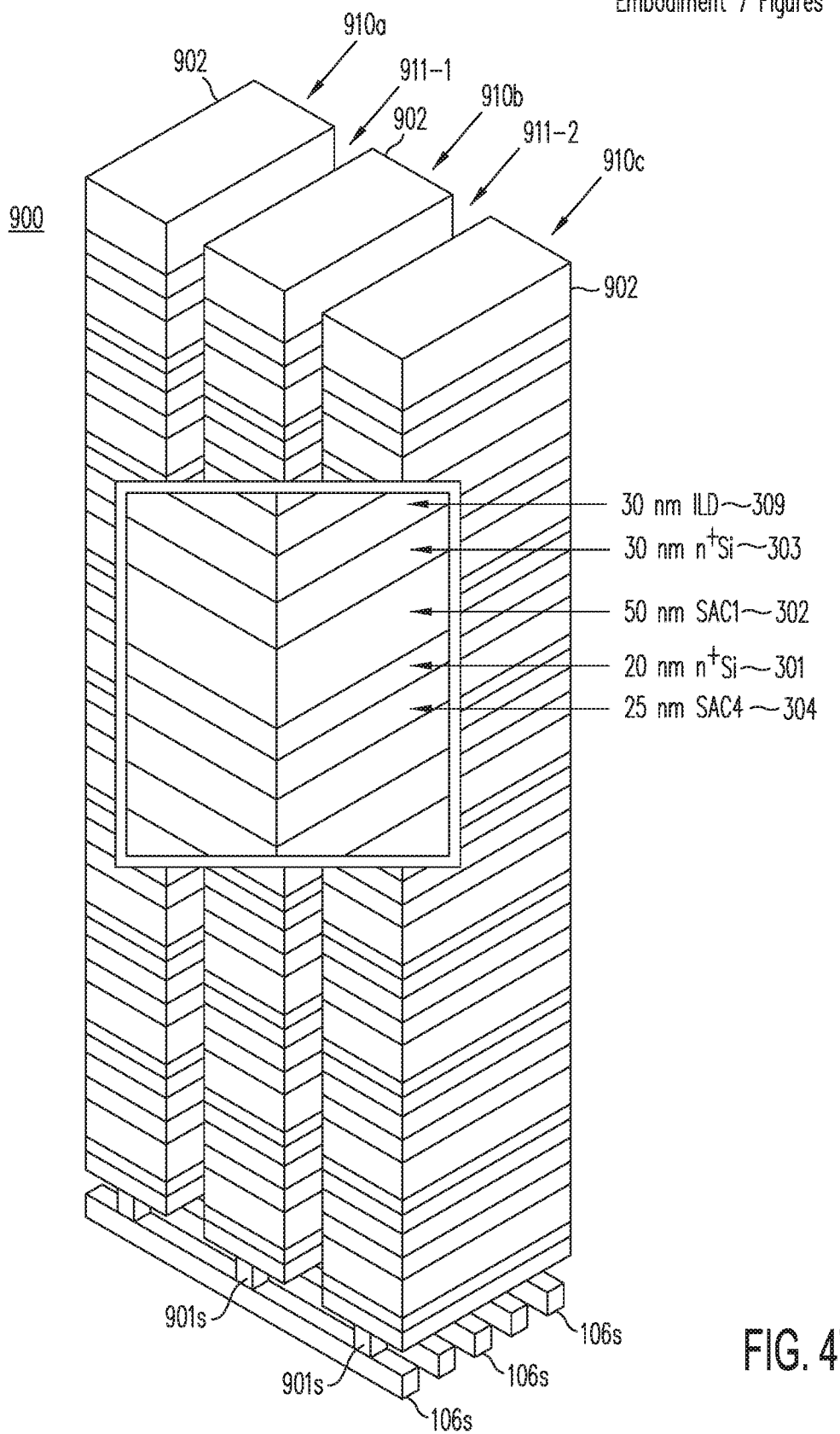
FIG. 47 shows memory structure 900 including eight active layers etched into 3 NIN stacks 910a, 910b and 910c formed over global word lines 106s and vertical interconnects 901s of FIG. 46.
Figure 48:
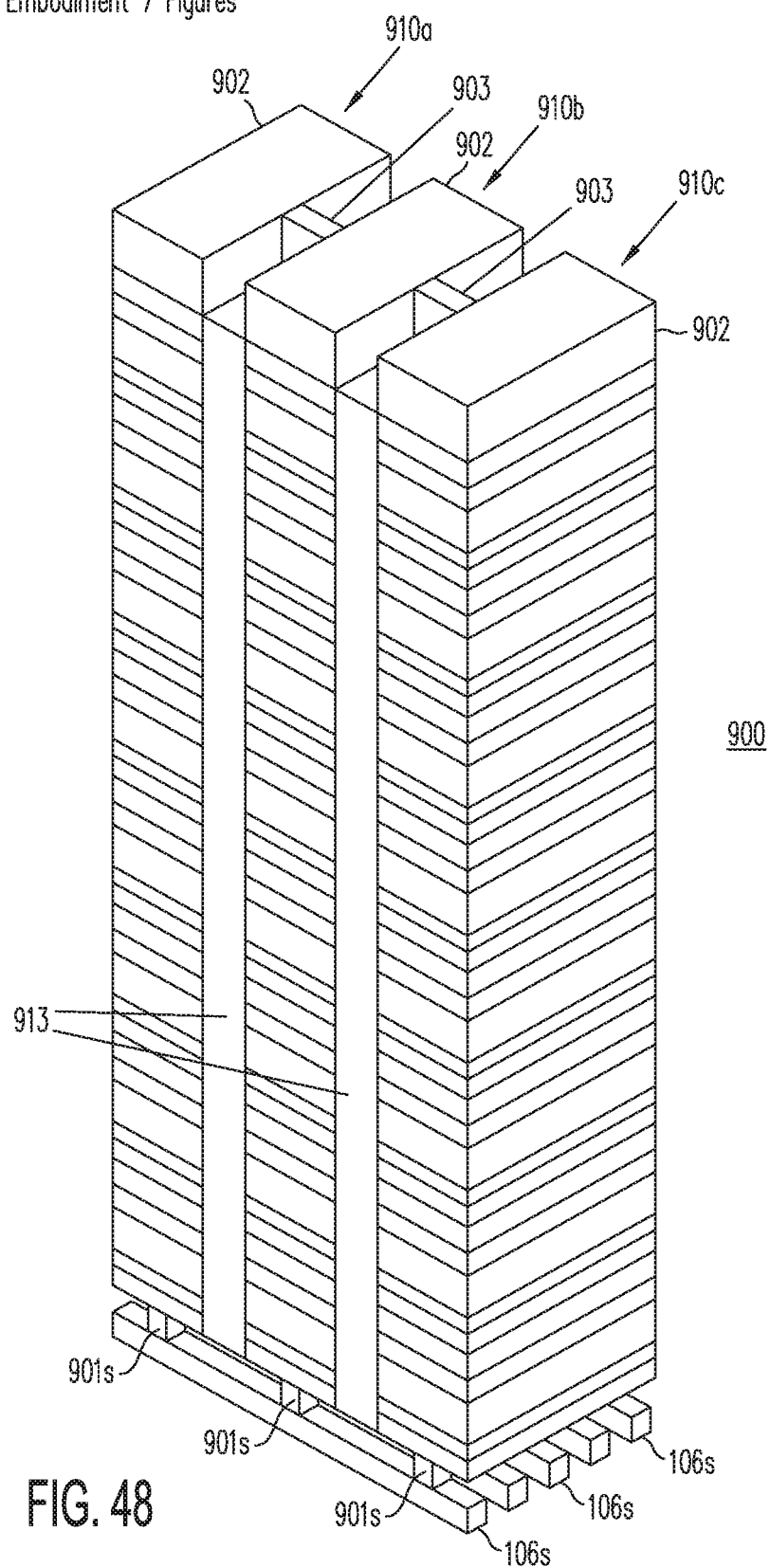
FIG. 48 shows formation of strut structures 903 connecting features in hard mask layer 902 over memory structure 900 of FIG. 47, together with a temporary fill material (e.g., the SAC2 material) filling trenches 911-1 and 911-2.

The fabrication of a memory structure over the structure of FIG. 46 may proceed in any manner described above. For example, FIG. 47 shows memory structure 900 including 8 active layers etched into three NIN stacks 910a, 910b and 910c formed over global word lines 106s and vertical interconnects 901s of FIG. 46. (The NIN stacks would be further etched to provide a greater number of NIN stacks; for example, memory structure 900 of FIG. 47 includes only half the final number of trenches). FIG. 47 shows NIN stacks 910a, 910b and 910c are each topped by hard mask layer 902, which is used to pattern and etch trenches 911-1 and 911-2 and retained. FIG. 48 shows strut structures 903 formed to connect features in hard mask 902 layer over memory structure 900 of FIG. 47. Trenches 911-1 and 911-2 are then provided a temporary fill material 913 (e.g., the SAC2 material) to form support pillars that, in conjunction with strut structures 903, providing mechanical stability to NIN stacks 910a, 910b and 910c.

Figure 49:
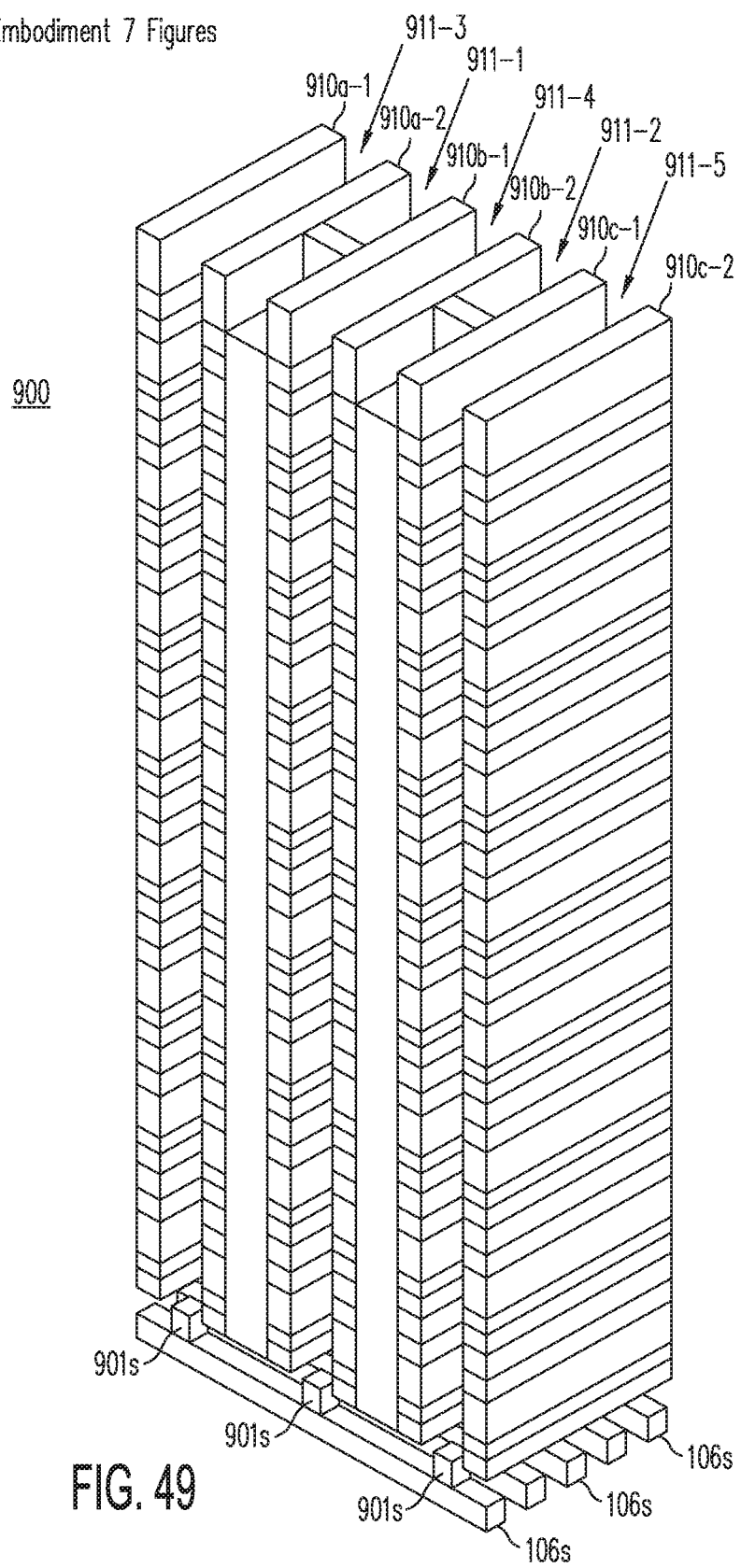
FIG. 49 shows additional trenches 911-3, 911-4 and 911-5 being formed in memory structure 900 of FIG. 48.
Figure 50:
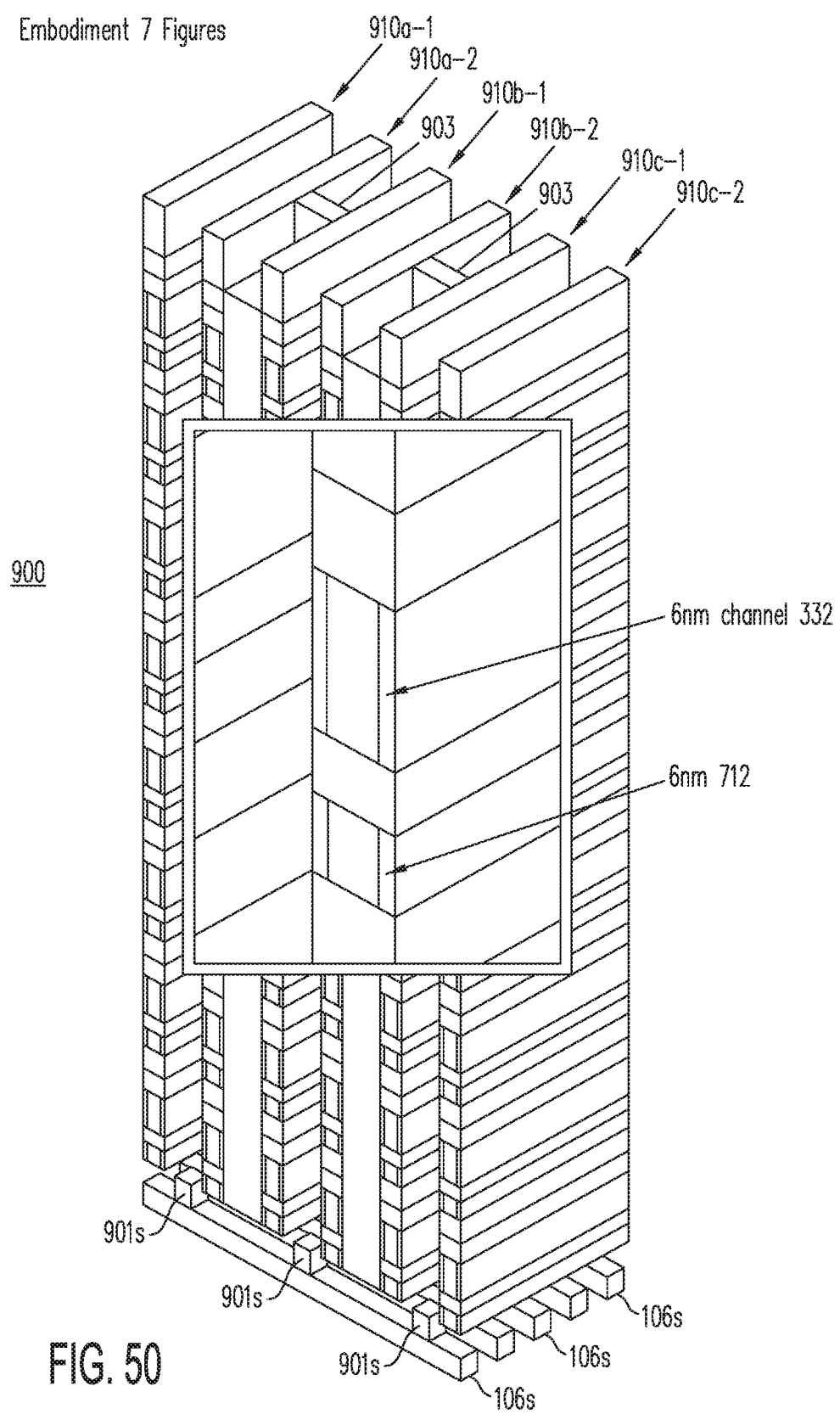
FIG. 50 shows in memory structure 900 of FIG. 49 (i) partial removal of the SAC1 material in first sacrificial sublayer 302 in the active layers and replacement in the resulting cavities by channel material 332, as well as (ii) replacement of the SAC4 material in sacrificial sublayers 304a and 304b in the active layers by conductive sublayers 319a and 319b, respectively, using a metal replacement process.
Figure 51:
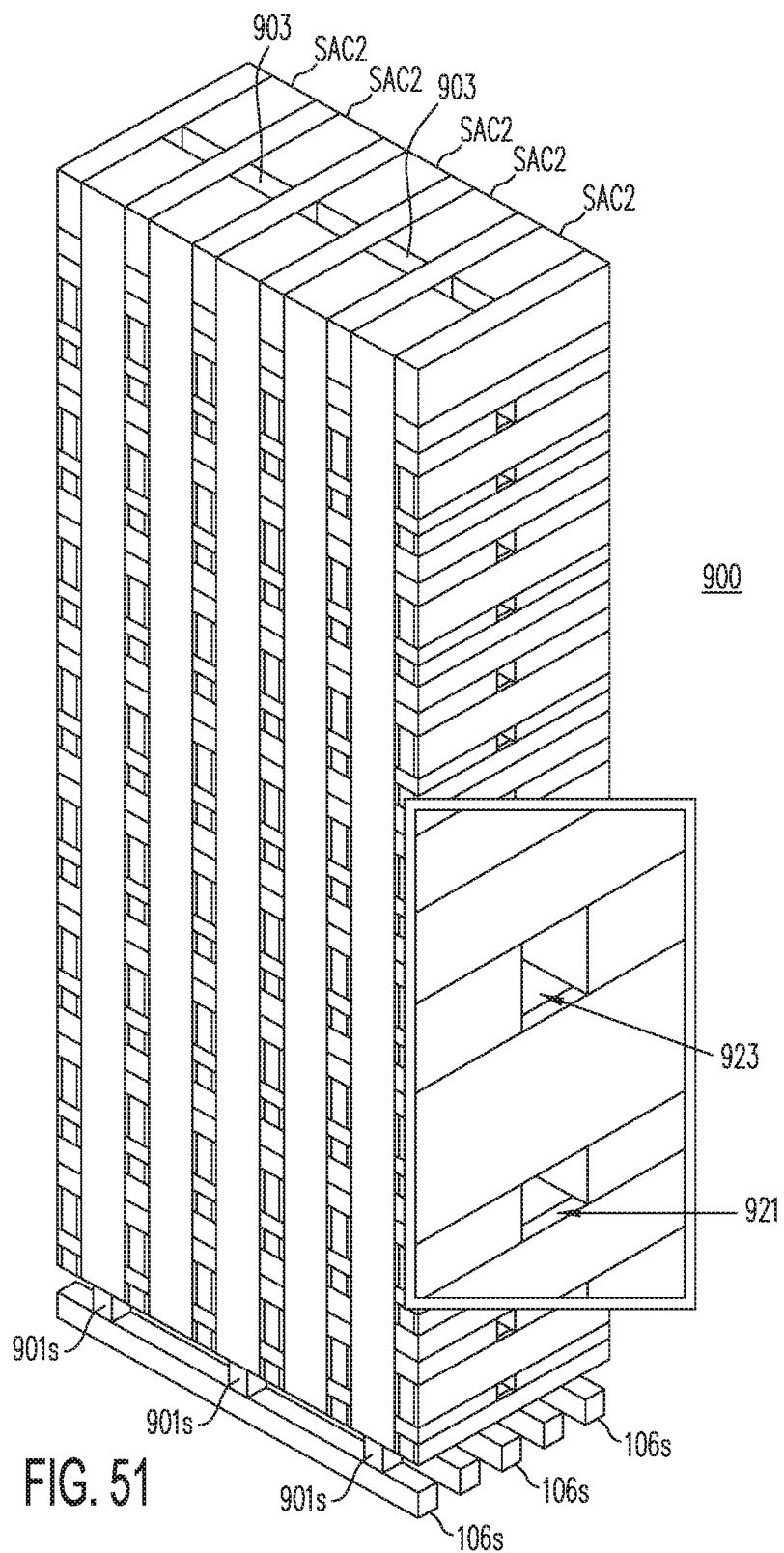
FIG. 51 shows memory structure 900 of FIG. 50, after deposition of SAC2 material into trenches 911-3, 911-4 and 911-5 and patterning to create vias that expose semiconductor sublayers 303, 332 and 301 in the active layers to allow atomic layer etching to cause opens 923 and 921 in the source sublayer 303 and drain sublayer 301 ("segmentation"), respectively.

FIG. 49 shows additional trenches 911-3, 911-4 and 911-5 being formed in memory structure 900 of FIG. 48. FIG. 50 shows in memory structure 900 of FIG. 49 (i) partial removal of the SAC1 material in first sacrificial sublayers 302 in the active layers and replacement in the resulting cavities by channel material 332, as well as (ii) replacement of the SAC4 material in second sacrificial sublayers 304a and 304b in the active layer by conductive sublayers 319a and 319b using a metal replacement process, such as that described above with respect to FIG. 37 above.

Figure 53:
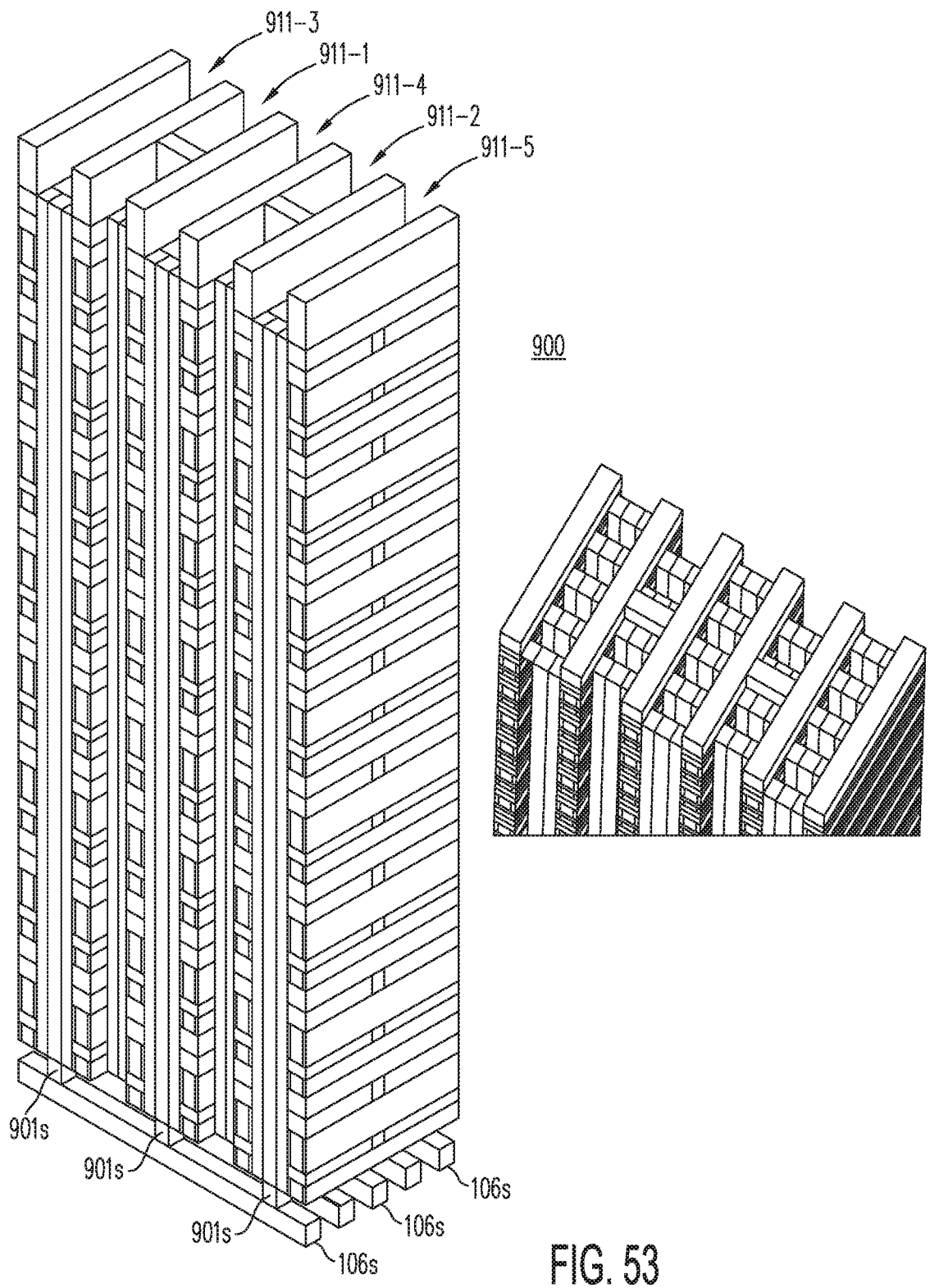
FIG. 53 shows memory structure 900 of FIG. 52, after vertical local word lines are formed by deposition of word line layer 336, patterning and etching, so that half of the local word lines are electrically connected to global word lines 106s under memory structure 900.

As described in the Provisional Application III, breaks in the source or drain sublayers 303 and 301 in the NOR strings are introduced to segment such source or drain sublayers horizontally. The segmentation may be achieved by first filling trenches 911-1 to 911-5 with the SAC2 material. After the SAC2 material is planarized to remove excess SAC2 material from the tops of the NIN stacks, memory structure 900 is patterned and etched to create vias in the SAC2 material. Thereafter, the exposed semiconductor sublayers in the active layers (e.g., source sublayer 303, drain sublayer 301 and channel sublayer 332)—but not any of the contacting metal or conductive sublayers 319a and 319b—are selectively removed using, for example, atomic layer etching to cause opens 923 and 921 in the source sublayer 303 and drain sublayer 301 ("segmentation"), respectively. Resulting structure 900 is shown in FIG. 53. Adjacent segments of the source sublayers 303 are isolated from each other while adjacent segments of the drain sublayers 301 are bridged by the contacting conductive or metal lines 319b, so that the drain sublayers are not isolated from each other for the entire length of the NOR string. The SAC2 material in trenches 911-1 to 911-5 is then removed.

Figure 52:
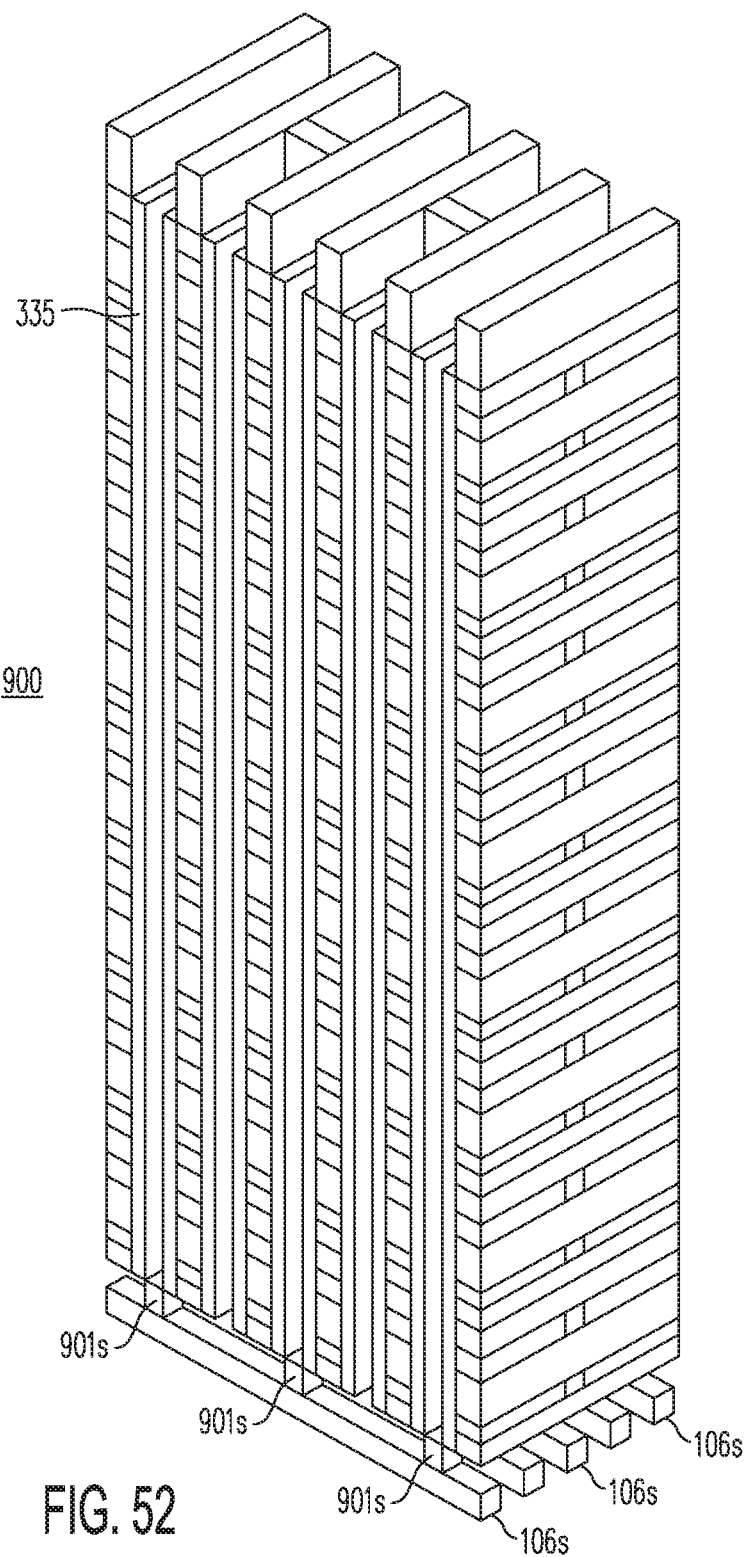
FIG. 52 shows deposition of storage layer 335 and protective dielectric sublayer 713 (e.g., ONO and $Al_2O_3$ sublayers, respectively), which are then anisotropically etched to remove excess material from the top of the NIN stacks, and from the floors of every other trench.

After segmentation, FIG. 52 shows deposition of storage layer 355 and protective dielectric sublayer 713 (e.g., ONO and $Al_2O_3$ sublayers, respectively), which are then anisotropically etched to remove excess storage and protective dielectric material from the top of the NIN stacks, and from the floors of every other trench. FIG. 53 shows memory structure 900 of FIG. 52, after vertical local word lines (in staggered positions relative the local word lines in the adjacent trenches) are formed out of deposited word line layer 336 in trenches 911-3, 911-4 and 911-5 by patterning and etching, so that half of the local word lines are electrically connected by vertical interconnects 901s to global word lines 106s under memory structure 900.

Figure 54:
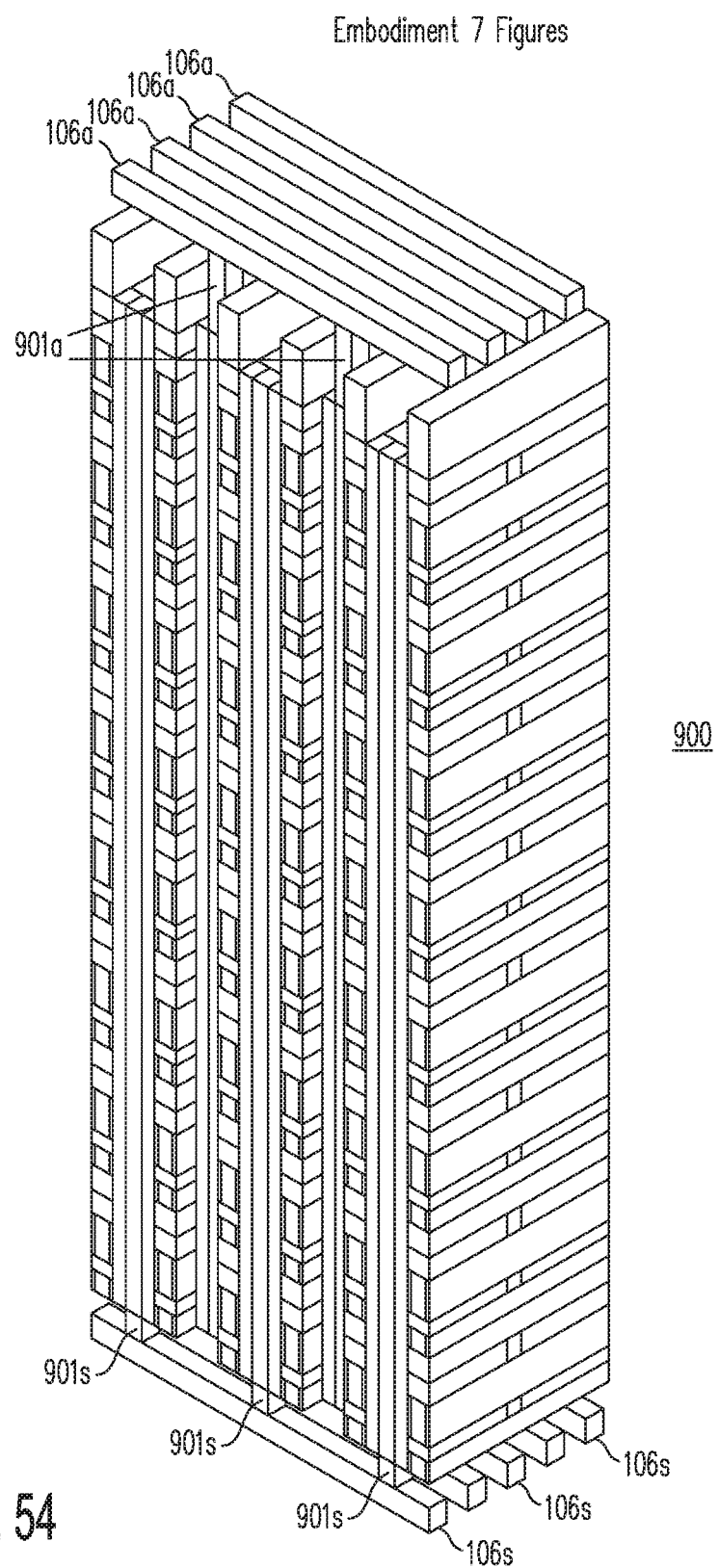
FIG. 54 shows global word lines 106a and vertical interconnects 901a are formed above a dielectric layer above memory structure 900 of FIG. 53, providing connectivity to the local word lines not connected to global word lines 106s underneath memory structure 900.

FIG. 54 shows second layer of global word lines 106a and vertical interconnects 901a are formed above a dielectric layer above memory structure 900 of FIG. 53, providing connectivity to the local word lines not connected to global word lines 106s underneath memory structure 900. Global word lines 106s provided underneath the NIN stacks and their associated local word lines may be staggered or offset in position relative to the global word lines 106a provided above the NIN stacks and their associated local word lines. Such an arrangement may enhance feature density.

Struts

In this detailed description, structs have been used and in various forms to mechanically reinforce where high aspect ratio memory structures are provided. However, in general, when the aspect ratio of the structures is less than about 25, the structures are mechanically stable enough to be free standing without struts or other reinforcement. For example, in a memory structure of 4 NIN stacks, each having a height of about 600 nm and word line spacing of about 30 nm, the aspect ratio is 20 for each NIN stack. In that case, the memory structure, with a smallest feature size of about 30 nm wide, may be fabricated without struts or other reinforcement.

Interlayer Dielectric Material

Interlayer dielectric materials described in this detail description preferably withstand any etching of the SAC1, SAC2, and SAC4 materials, including when these materials are etched more than once. In choosing an interlayer dielectric material to be used herein, one preferably considers the capacitance that may develops in the NIN stacks. The interlayer dielectric material may preferably be either silicon oxide (e.g., high-temperature oxide (HTO) or another high quality, etch-resistant variety), silicon nitride, or a combination of the two (e.g. partially silicon oxide and partially silicon nitride).

Examples: Sacrificial Materials and Etches

The SAC1, SAC2, and SAC4 materials may be any suitable sacrificial material, some of which are described in the Copending Application. Such sacrificial materials include silicon oxide, boron doped silicon oxide (BSG), phosphorus doped silicon oxide (PSG), boron phosphorus doped silicon oxide (BPSG), silicon nitride, silicon carbide, silicon carbon nitride, silicon carbon oxygen hydrogen, germanium, or a combination of some of these materials. The sacrificial layers may be high-density or low-density (i.e., porous), and may be formed using any suitable method, including chemical vapor deposition (CVD), physical vapor deposition (PVD), electrodeposition, sputtering, evaporation, or spin-on techniques. The sacrificial material may be etched by any suitable technique that is selective, i.e. an etch that removes the targeted sacrificial material but does not substantially remove any of the non-targeted layers. For example, hydrofluoric acid (HF) etches $SiO_2$ and variants rapidly, while HF removes SiN and Si at very slow rates.

Example 1: Sacrificial Materials and Etches

The SAC1 material in this example may include a high temperature silicon oxide (HTO) with a relatively low etch rate in dilute HF. The SAC4 material in this example may include a Ge or a bi-layer of Si and Ge. The SAC4 material may also include BPSG or $SiO_2$ from tetra ethyl orthosilicate (TEOS) with a higher etch rate in dilute HF than the etch rate of HTO. The strut and hard mask materials may include silicon nitride. The SAC2 material in this example may include Ge, which may be etched using hot (70° C.) hydrogen peroxide mixed with water (e.g. 20 vol % $H_2O_2$ although any appropriate etch mixture may be used.

As used herein, an "appropriate etch" refers to an etch that etches one material at a rate that is at least 10 times faster than the etch of any and all other materials exposed to the etchant. For example, the hydrogen peroxide wet etch is very selective to Ge (i.e., germanium) and will not etch or minimally etch the other materials (e.g. silicon, silicon dioxide, silicon nitride).

The SAC4 material may be etched in a solution of hydrofluoric (HF) acid and water, or buffered HF. HF or buffered HF will etch BPSG or TEOS at a much faster rate than HTO (e.g., >10:1), and will etch the other materials, silicon and silicon nitride at a much slower rate or not at all.

After removal of the SAC4 and SAC2 materials, the SAC1 material can be partially etched by wet or dry techniques to form the recessed features detailed in the Copending Application. In some embodiments, the SAC1 "spine" remaining between the two adjacent channels of the same active strip may be removed by selective sideways etching along the length of the active strip to form air-filled cavities, providing the so called "air gap" isolation that has a dielectric constant of 1.0, thereby substantially reducing the parasitic coupling between two adjacent channels.

Example 2: Sacrificial Materials and Etches

The SAC1 material in this example may include silicon nitride, the SAC4 material in this example may include Ge or a bi-layer of Si and Ge, the SAC2 in this example may include BPSG or TEOS, and the strut and the hard mask in this example may include silicon nitride. Where the SAC4 material includes Ge, it may be etched by hot (70° C.) hydrogen peroxide mixed with water (20 vol % $H_2O_2$). This wet etch is very selective to germanium and will not etch or minimally etch the other materials (e.g. silicon, silicon dioxide, silicon nitride). The SAC2 material can be etched in a solution of hydrofluoric (HF) acid and water, or buffered HF which will not etch or minimally etch Ge, Si, or SiN. Finally, after the SAC4 and SAC2 materials have been removed, the SAC1 material can be partially etched using a solution that contains phosphoric acid (wet) or any suitable selective dry etch technique to form the recessed features detailed in the Copending Application.

Example 3: Sacrificial Materials and Etches

The SAC1 material in this example may include silicon oxide (HTO) with a relatively low etch rate, the SAC2 material in this example may include BPSG or TEOS with a relatively high etch rate, the SAC4 material in this example may include BPSG or TEOS, and the strut and hard mask may include silicon oxide or silicon nitride. The SAC2 and SAC4 materials may be etched using a solution of hydrofluoric (HF) acid and water, or buffered HF. At the time the SAC2 material is etched, the SAC4 material may be protected from wet etch by photoresist. This wet etch is very selective to BPSG and TEOS and will not etch or minimally etch the other materials (e.g. silicon, HTO, silicon nitride), and will etch HTO (SAC1) slowly. Finally, after the SAC4 and SAC2 materials have been removed, the SAC1 material can be partially etched using wet or dry techniques to form the recessed features detailed in the Copending Applciation.

Examples: Conductive Sublayer Materials

The conductive sublayers described in this detailed description may be any suitable material or materials, such as titanium, titanium nitride, tungsten nitride, tungsten, titanium tungsten, tantalum, tantalum nitride, cobalt, chrome, molybdenum, or niobium, or combinations or alloys thereof. The metal layer may be deposited using any suitable method, such as CVD, atomic layer deposition (ALD), PVD, sputtering, evaporation, electrodeposition, or any combinations thereof.

The metal layer in this detailed description may be deposited using any suitable method, such as chemical vapor deposition (CVD), atomic layer deposition (ALD), physical vapor deposition (PVD), sputtering, evaporation, electrodeposition, or combinations thereof.

Example 1: Conductive Sublayer Materials

An example of a group of sublayers is Ti/TiN/W. The Ti sublayer adheres well to the dielectric or silicon layers, the TiN sublayer is a diffusion barrier, and the W sublayer has lower resistivity than either Ti or TiN. The Ti/TiN layers can be referred to as liner or barrier layers. In general, it is preferred but not required to have the thickness of the liner or the barrier sublayers be less than the low resistivity sublayer. The conductive sublayer may include 1 to 5 nm of titanium, 1 to 5 nm titanium nitride, and 1 to 40 nm of tungsten.

Example 2: Conductive Sublayer Materials

Another example of a group of sublayers is TiN/W, wherein the TiN has good adhesion to dielectric or silicon layers and the W sublayer has lower resistivity. The conductive sublayer may include 1 to 5 nm of tungsten nitride and 1 to 40 nm of tungsten.

Other Examples: Conductive Sublayer Materials

Other groups of sublayers are WN/W, Ta/W, Ta/TaN/W, TaN/W, Ti/Cr, and Ti/TiN/Cr. The examples are not meant to be limiting, and any appropriate combination of sublayers may be utilized. The conductive sub layer may comprise 1 to 5 nm tantalum and 1 to 40 nm tungsten. The metal layer may also include 1 to 5 nm tantalum nitride and 1 to 40 nm tungsten. The metal layer may also include 1 to 40 nm of titanium nitride.

The invention claimed is:

1. A memory structure, comprising:
   a semiconductor substrate having a planar surface, the semiconductor substrate having circuitry formed therein and thereon;
   a first dielectric layer;
   a first plurality of conductors electrically connected to the circuitry extending along a first direction substantially parallel to the planar surface, the conductors being accessible through the dielectric layer by a plurality of conductive plugs formed in vias to contact the conductors, the conductive plugs formed rows each extending along a second direction substantially parallel to the planar surface and substantially perpendicular to the first direction; and
   a first stack of active strips and a second stack of active strips formed over dielectric layer and separated by a predetermined distance along the first direction, wherein each stack of active strips comprises two or more active strips provided one on top of another on two or more isolated planes and being substantially aligned lengthwise with each other along the second direction, and wherein each active strip comprises a first semiconductor layer of a first conductivity type provided between a second semiconductor layer and a third semiconductor layer each of a second conductivity type;
   a storage layer;
   a strut system connecting the first and second stacks of active strip; and
   a second plurality of conductors each extending lengthwise along a third direction that is substantially perpendicular to the planar surface, each conductor being within a group of the conductors that are provided between the first stack of active strips and the second stack of active strips and separated from each stack of active strips by the storage layer, thereby forming in each active strip at least one NOR string, each NOR string including a plurality of storage transistors that are formed out of the first, the second and the third semiconductor layers of the active strip and their adjacent the storage layer and the conductors within the group, wherein selected ones of the second plurality of conductors being connected by the conductive plugs to the first plurality of conductors.

2. The memory structure of claim 1, further comprising a third plurality of conductors electrically connected to the circuitry extending along the first direction, the conductors of the third direction being provided above the memory structure and being connected to the conductors of the second plurality that are not electrically connected to the first plurality of conductors through the conductive plugs.

3. The memory structure of claim 1, wherein struts including extensions that extend along the third direction through substantially the height of the stacks of active strips.

4. The memory structure of claim 1, further comprising a metallic layer contacting one of the second and the third semiconductor layer.

5. The memory structure of claim 1, wherein the metallic layer is provided in cavities or recesses that result from the removal of all or part of a sacrificial layer.

6. The memory structure of claim 4, wherein the sacrificial layer comprises one or more of: silicon oxide, boron doped silicon oxide, phosphorus doped silicon oxide, boron phosphorus doped silicon oxide, silicon nitride, silicon carbide, silicon carbon nitride, silicon carbon oxygen hydrogen, germanium, and any combinations thereof.

7. The memory structure of claim 5, wherein the sacrificial layer is porous.

8. The memory structure of claim 4, wherein the metallic layer further includes two or more sublayers where a first sublayer is disposed adjacent to and in electrical contact with a second sublayer, and the first sublayer surrounds the second sublayer on three or more sides.

9. The memory structure of claim 8, wherein the thickness of the second sublayer is at least 1.5× the thickness of the first sublayer.

10. The memory structure of claim 4, wherein the metallic layer comprises one or more of: titanium, titanium nitride, tungsten nitride, tungsten, titanium tungsten, tantalum, tantalum nitride, cobalt, chrome, molybdenum, niobium, and any alloys thereof.

11. The memory structure of claim 4, wherein the metallic layer is deposited by atomic layer deposition.

12. The method of claim 1, wherein the storage layer in the memory structure comprises first and second types of storage material provided at different locations in the memory structure, the first and second types of storage material having different characteristics.

13. The method of claim 12, wherein the first and second types of storage material comprise, respectively, first and second tunnel dielectric layers, the first tunnel dielectric layer being thicker than the second tunnel dielectric layer.

14. The memory structure of claim 12, wherein the first tunnel dielectric layer has a thickness of 5 nm or more.

15. The memory structure of claim 12, wherein the second tunnel dielectric layer has a thickness of 3 nm or less.

16. The memory structure of claim 12, wherein the storage layer comprises an oxide-nitride-oxide material.

17. The memory structure of claim 1, wherein the storage layer in the memory structure comprises first and second types of storage material provided at different locations in the memory structure, the first and second types of storage material having different characteristics.

18. The memory structure of claim 17, wherein the first and second types of storage material comprise, respectively, first and second tunnel dielectric layers, the first tunnel dielectric layer being thicker than the second tunnel dielectric layer.

19. The memory structure of claim 17, wherein the first tunnel dielectric layer has a thickness of 5 nm or more.

20. The memory structure of claim 17, wherein the second tunnel dielectric layer has a thickness of 3 nm or less.

21. The memory structure of claim 17, wherein the storage layer comprises an oxide-nitride-oxide material.

\* \* \* \* \*